US012593723B2

(12) United States Patent
Lee et al.

(10) Patent No.: US 12,593,723 B2
(45) Date of Patent: Mar. 31, 2026

(54) PIXEL, DISPLAY DEVICE INCLUDING SAME, AND MANUFACTURING METHOD THEREFOR

(71) Applicant: SAMSUNG DISPLAY CO., LTD., Yongin-si (KR)

(72) Inventors: Yo Han Lee, Yongin-si (KR); Won Sik Oh, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 635 days.

(21) Appl. No.: 17/767,240

(22) PCT Filed: Sep. 24, 2020

(86) PCT No.: PCT/KR2020/013012
§ 371 (c)(1),
(2) Date: Apr. 7, 2022

(87) PCT Pub. No.: WO2021/071148
PCT Pub. Date: Apr. 15, 2021

(65) Prior Publication Data
US 2022/0384402 A1 Dec. 1, 2022

(30) Foreign Application Priority Data
Oct. 8, 2019 (KR) ........................ 10-2019-0124811

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/24* (2013.01); *H01L 24/82* (2013.01); *H10H 20/857* (2025.01);
(Continued)

(58) Field of Classification Search
CPC . H01L 25/0753; H01L 25/157; H01L 25/167; H01L 24/24; H01L 24/25;
(Continued)

(56) References Cited

U.S. PATENT DOCUMENTS 8,349,116 B1 1/2013 Bibl et al.
8,791,474 B1 7/2014 Bibl et al.
(Continued)

FOREIGN PATENT DOCUMENTS

CN 105870156 8/2016
CN 107065367 8/2017
(Continued)

OTHER PUBLICATIONS

International Search Report, with English translation, corresponding to International Application No. PCT/KR2020/013012 dated Jan. 11, 2021.
(Continued)

*Primary Examiner* — Natalia A Gondarenko
(74) *Attorney, Agent, or Firm* — Womble Bond Dickinson (US) LLP

(57) ABSTRACT

A pixel includes first and second sub-pixel areas adjacent to each other in a first direction; first and second electrodes disposed in each of the first and the second sub-pixel areas, and spaced apart from each other; light emitting elements disposed between the first and the second electrodes in each of the first and the second sub-pixel areas; a first driving transistor disposed in the first sub-pixel area, and electrically connected to the first electrode; and a second driving transistor disposed in the second sub-pixel area, and electrically connected to the first electrode. The first electrode of the first sub-pixel area and the first electrode of the second sub-pixel area are electrically disconnected from each other, and the second electrode of the first sub-pixel area and the second
(Continued)

electrode of the second sub-pixel area are electrically connected to each other.

19 Claims, 32 Drawing Sheets

(51) Int. Cl.

| | | |
|---|---|---|
| *H10H 20/01* | (2025.01) | |
| *H10H 20/819* | (2025.01) | |
| *H10H 20/825* | (2025.01) | |
| *H10H 20/857* | (2025.01) | |

(52) U.S. Cl.
CPC ............. *H01L 24/25* (2013.01); *H01L 24/95* (2013.01); *H01L 2224/24051* (2013.01); *H01L 2224/24147* (2013.01); *H01L 2224/245* (2013.01); *H01L 2224/25175* (2013.01); *H01L 2224/8293* (2013.01); *H01L 2224/95133* (2013.01); *H01L 2924/0549* (2013.01); *H10H 20/0364* (2025.01); *H10H 20/819* (2025.01); *H10H 20/8252* (2025.01)

(58) Field of Classification Search
CPC ......... H01L 24/82; H01L 24/95; H01L 33/62; H01L 33/20; H01L 33/325; H01L 33/0045; H01L 33/36; H01L 33/08; H01L 33/005; H01L 33/0079; H01L 33/0093; H01L 33/0095; H01L 2224/24051; H01L 2224/24147; H01L 2224/245; H01L 2224/25175; H01L 2224/8293; H01L 2224/95133; H01L 2924/0549; H01L 27/124; H01L 27/156; H01L 27/1214; H01L 27/1218; H01L 21/76895; H01L 33/14; H01L 33/382; H01L 33/387; H01L 33/32; H01L 33/42; H01L 33/44; H01L 2933/0025; H01L 2933/0066; H01L 2933/0016; H01L 2224/0344; H01L 2224/16225; H01L 2224/81001; H01L 2224/95; H10H 20/0364; H10H 20/042; H10H 20/819; H10H 20/8252; H10H 20/83; H10H 20/831; H10H 20/8314; H10H 20/8316; H10H 20/857; H10H 29/14; H10H 29/142; H10H 29/20; H10H 29/24; H10H 29/49; H10H 29/32; H10H 29/34; H10H 29/352; H10H 29/362; H10H 29/39; H10H 29/832; H10H 29/8321; H10H 29/857; H10D 86/441; H10D 86/60

USPC ......................................... 257/91, 79, 89, 99
See application file for complete search history.

(56) References Cited

U.S. PATENT DOCUMENTS

| | | | |
|---|---|---|---|
| 9,935,086 B2 | 4/2018 | Moon et al. | |
| 10,340,419 B2 | 7/2019 | Kim et al. | |
| 10,658,605 B2 | 5/2020 | Lee et al. | |
| 10,705,633 B2 | 7/2020 | Wu | |
| 10,769,990 B2 | 9/2020 | Cho et al. | |
| 10,803,283 B2 | 10/2020 | Han | |
| 11,069,726 B2 | 7/2021 | Kim et al. | |
| 11,659,752 B2 | 5/2023 | Koshihara | |
| 2017/0277315 A1* | 9/2017 | Wu | G06F 3/0443 |
| 2018/0012876 A1 | 1/2018 | Kim et al. | |
| 2018/0019377 A1* | 1/2018 | Kim | H10H 20/857 |
| 2018/0138157 A1 | 5/2018 | Im et al. | |
| 2018/0174519 A1* | 6/2018 | Kim | H10H 20/833 |
| 2019/0325823 A1* | 10/2019 | Yang | G09G 3/3233 |
| 2020/0373520 A1* | 11/2020 | Kim | H10K 59/878 |
| 2020/0381410 A1* | 12/2020 | Yueh | H01L 27/14621 |

FOREIGN PATENT DOCUMENTS

| | | |
|---|---|---|
| CN | 107634081 | 1/2018 |
| CN | 108400149 | 8/2018 |
| CN | 109326627 | 2/2019 |
| CN | 110165031 | 8/2019 |
| EP | 3 270 424 | 1/2018 |
| EP | 3 826 064 | 5/2021 |
| JP | 2015-11784 | 1/2015 |
| KR | 10-1596386 | 2/2016 |
| KR | 10-2017-0104031 | 9/2017 |
| KR | 10-2018-0009014 | 1/2018 |
| KR | 10-2019-0029831 | 3/2019 |
| KR | 10-2019-0048356 | 5/2019 |
| KR | 10-2019-0095638 | 8/2019 |
| KR | 10-2019-0098305 | 8/2019 |
| KR | 10-2020-0010701 | 1/2020 |
| KR | 10-2020-0085977 | 7/2020 |
| KR | 10-2020-0105598 | 9/2020 |

OTHER PUBLICATIONS

Written Opinion, with English translation, corresponding to International Application No. PCT/KR2020/013012, dated Jan. 11, 2021.
Chinese Office Action dated Dec. 31, 2024, in Chinese Patent Application No. 202080072752.2.
Notice of Allowance dated Dec. 25, 2024, in Korean Patent Application No. 10-2019-0124811.

* cited by examiner

PXL

BNK1                    BRP

CH1                                    CH3

BNK1

CL6

BNK1

CL1        CL3        CL4                BNK1

EMA

CL2    CNL2        CH2            CL5

DR1
DR3
DR2

PXL

BNK1                    BRP

CH3

CH1                     EMA

BNK1

CL6

BNK1

CL1        CL3        CL4

CH2

CL2    CNL2        CH2        CL5        BNK2

Figure 15D:
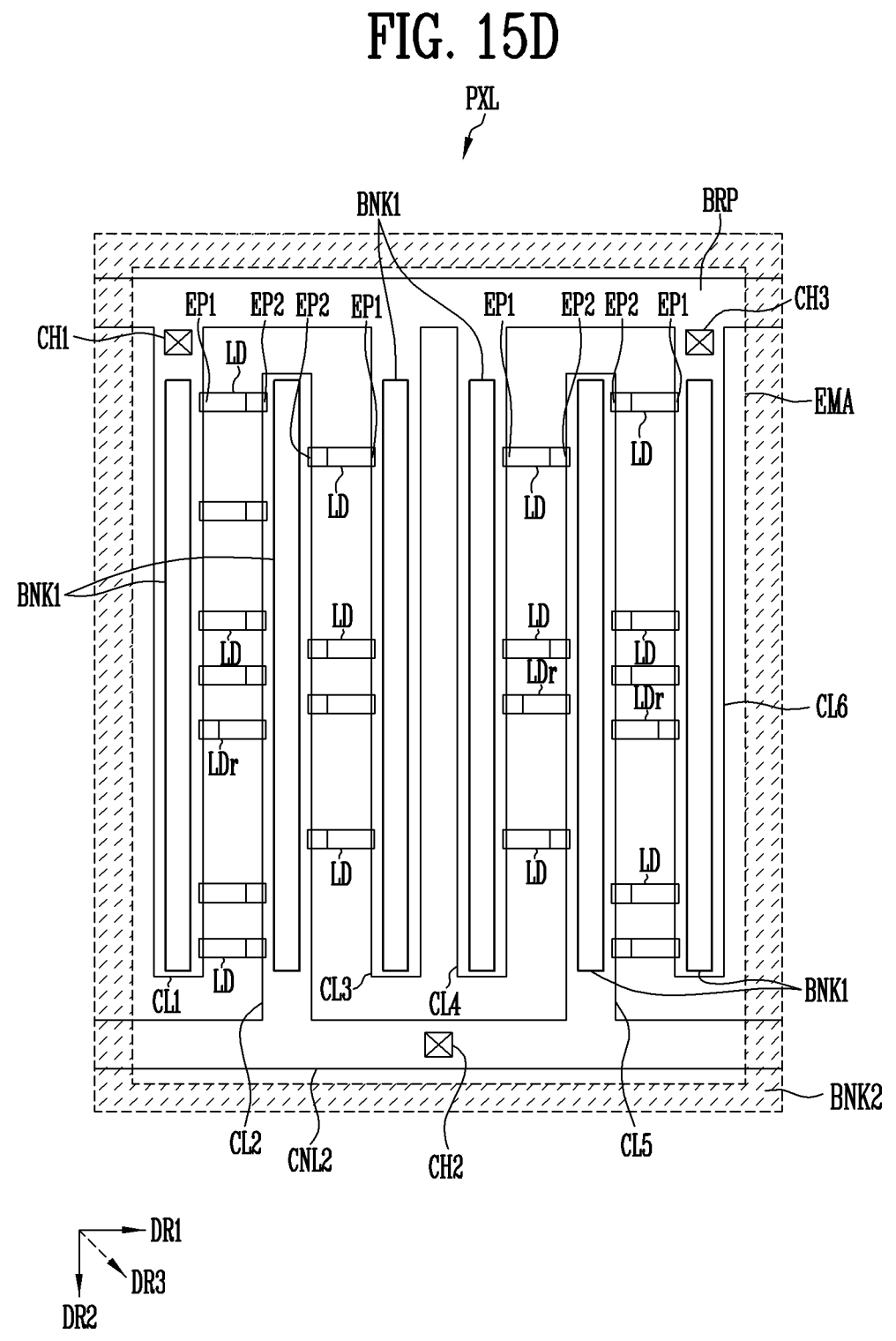

PXL

BNK1                    BRP

EP1   EP2 EP2 EP1      EP1   EP2 EP2 EP1        CH3

CH1

LD

EMA

BNK1

LD          LD

LD

LD          LD

LD          LDr

CL6

LDr         LDr

LD          LD

LD

LDr

LD          LD        LD

LD

CL1         CL3      CL4                        BNK1

BNK2

CL2   CNL2      CH2        CL5

PIXEL, DISPLAY DEVICE INCLUDING SAME, AND MANUFACTURING METHOD THEREFOR

CROSS-REFERENCE TO RELATED APPLICATION(S)

This application is a national entry of International Application No. PCT/KR2020/013012, filed on Sep. 24, 2020, which claims under 35 U.S.C. § 119(a) and 365(b) priority to and benefits of Korean Patent Application No. 10-2019-0124811, filed on Oct. 8, 2019 in the Korean Intellectual Property Office, the entire contents of which are incorporated herein by reference.

TECHNICAL FIELD

The disclosure relate to a pixel, a display device including the pixel, and a method of fabricating the display device.

DESCRIPTION OF THE RELATED ART

With an increase in interest in an information display and an increase in demand to use portable information media, demand for display devices is markedly increased, and commercialization thereof is in progress.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a pixel having enhanced reliability, a display device including the pixel, and a method of fabricating the display device.

A pixel in accordance with an embodiment of the disclosure may include: a first sub-pixel area and a second sub-pixel area adjacent to each other in a first direction; a first electrode and a second electrode disposed in each of the first sub-pixel area and the second sub-pixel area, and spaced apart from each other; a plurality of light emitting elements disposed between the first electrode and the second electrode in each of the first sub-pixel area and the second sub-pixel area; a first driving transistor disposed in the first sub-pixel area, and electrically connected to the first electrode; and a second driving transistor disposed in the second sub-pixel area, and electrically connected to the first electrode.

The first electrode of the first sub-pixel area and the first electrode of the second sub-pixel area may be electrically disconnected from each other, and the second electrode of the first sub-pixel area and the second electrode of the second sub-pixel area may be electrically connected to each other.

In an embodiment, each of the first sub-pixel area and the second sub-pixel area may include a first sub-area and a second sub-area spaced from each other in a second direction intersecting the first direction. The first electrode disposed in each of the first sub-pixel area and the second sub-pixel area may include a 1-1-th sub-electrode disposed in the first sub-area, and a 1-2-th sub-electrode disposed in the second sub-area. The second electrode provided in each of the first sub-pixel area and the second sub-pixel area may include a 2-1-th sub-electrode disposed in the first sub-area, and a 2-2-th sub-electrode disposed in the second sub-area.

In an embodiment, the light emitting elements of each of the first sub-pixel area and the second sub-pixel area may include: first light emitting elements disposed between the 1-1-th sub-electrode and the 2-1-th sub-electrode; and second light emitting elements disposed between the 1-2-th sub-electrode and the 2-2-th sub-electrode.

In an embodiment, the 1-1-th sub-electrode and the 2-1-th sub-electrode along with the first light emitting elements electrically connected in parallel therebetween of each of the first sub-pixel area and the second sub-pixel area may form a first set, and the 1-2-th sub-electrode and the 2-2-th sub-electrode along with the second light emitting elements electrically connected in parallel therebetween of each of the first sub-pixel area and the second sub-pixel area may form a second set.

In an embodiment, the pixel may further include a first contact electrode disposed in each of the first sub-pixel area and the second sub-pixel area and disposed on each of the 1-1-th and the 1-2-th sub-electrodes and the 2-1-th and the 2-2-th sub-electrodes.

In an embodiment, the pixel may further include a first intermediate electrode disposed in an area between the first sub-area and the second sub-area in each of the first sub-pixel area and the second sub-pixel area.

In an embodiment, the first intermediate electrode and the first contact electrode may be integral with each other on the 2-1-th sub-electrode disposed in the first sub-area of each of the first sub-pixel area and the second sub-pixel area.

In an embodiment, the first set and the second set of each of the first sub-pixel area and the second sub-pixel area may be electrically connected to each other by the first intermediate electrode.

In an embodiment, the first intermediate electrode may electrically connect the first contact electrode on the 2-1-th sub-electrode of the first set to the first contact electrode on the 1-2-th sub-electrode of the second set in each of the first sub-pixel area and the second sub-pixel area.

In an embodiment, the pixel may further include a third electrode disposed in each of the first sub-pixel area and the second sub-pixel area, and spaced apart from the first electrode and the second electrode. The third electrode may include a 3-1-th sub-electrode disposed in the first sub-area, and a 3-2-th sub-electrode disposed in the second sub-area. The 1-1-th sub-electrode and the 3-1-th sub-electrode may be electrically connected to each other by a connection line in each of the first sub-pixel area and the second sub-pixel area.

In an embodiment, each of the first sub-pixel area and the second sub-pixel area may further include a third sub-area disposed below the second sub-area in the second direction.

The first electrode of each of the first sub-pixel area and the second sub-pixel area may include a 1-3-th sub-electrode disposed in the third sub-area. The second electrode of each of the first sub-pixel area and the second sub-pixel area may further include a 2-3-th sub-electrode disposed in the third sub-area. The light emitting elements of each of the first sub-pixel area and the second sub-pixel area may include third light emitting elements disposed between the 1-3-th sub-electrode and the 2-3-th sub-electrode.

In an embodiment, the 1-3-th sub-electrode and the 2-3-th sub-electrode along with the third light emitting elements electrically connected in parallel therebetween may form a third set in each of the first sub-pixel area and the second sub-pixel area.

In an embodiment, the pixel may further include: a second contact electrode disposed on each of the 1-3-th sub-electrode and the 2-3-th sub-electrode in each of the first sub-pixel area and the second sub-pixel area, and the second contact electrode and the first contact electrode being disposed on a same layer; and a second intermediate electrode disposed in an area between the second sub-area and the third sub-area in each of the first sub-pixel area and the second sub-pixel area, and the intermediate electrode and the first contact electrode are integral with each other on the 2-2-th sub-electrode. The second intermediate electrode may electrically connect the first contact electrode on the 2-2-th sub-electrode of the second set to the second contact electrode on the 1-3-th sub-electrode of the third set in each of the first sub-pixel area and the second sub-pixel area.

In an embodiment, each of the first sub-pixel area and the second sub-pixel area may include a fourth sub-area disposed below the third sub-area in the second direction.

The first electrode of each of the first sub-pixel area and the second sub-pixel area may further include a 1-4-th sub-electrode disposed in the fourth sub-area. The second electrode of each of the first sub-pixel area and the second sub-pixel area may further include a 2-4-th sub-electrode disposed in the fourth sub-area. The light emitting elements of each of the first sub-pixel area and the second sub-pixel area may further include fourth light emitting elements disposed between the 1-4-th sub-electrode and the 2-4-th sub-electrode.

In an embodiment, the 1-4-th sub-electrode and the 2-4-th sub-electrode along with the fourth light emitting elements electrically connected in parallel therebetween may form a fourth set in each of the first sub-pixel area and the second sub-pixel area.

In an embodiment, the pixel may further include: a third contact electrode disposed on each of the 1-4-th sub-electrode and the 2-4-th sub-electrode in each of the first sub-pixel area and the second sub-pixel area, and the third contact electrode and the second contact electrode being disposed on a same layer; and a third intermediate electrode disposed in an area between the third sub-area and the fourth sub-area in each of the first sub-pixel area and the second sub-pixel area, and the third intermediate electrode and the second contact electrode are integral with each other on the 2-3-th sub-electrode. The third intermediate electrode may electrically connect the second contact electrode on the 2-3-th sub-electrode of the third set to the third contact electrode on the 1-4-th sub-electrode of the fourth set in each of the first sub-pixel area and the second sub-pixel area.

In an embodiment, the pixel may further include a third sub-pixel area adjacent to the second sub-pixel area in the first direction, and including a first sub-area, a second sub-area, and a third sub-area spaced apart from each other in the second direction. Third sub-pixel area may include: a first electrode including a 1-1-th sub-electrode disposed in the first sub-area, a 1-2-th sub-electrode disposed in the second sub-area and spaced apart from the 1-1-th sub-electrode, and a 1-3-th sub-electrode disposed in the third sub-area and spaced apart from the 1-2-th sub-electrode; a second electrode including a 2-1-th sub-electrode disposed in the first sub-area, a 2-2-th sub-electrode disposed in the second sub-area and spaced apart from the 2-1-th sub-electrode, and a 2-3-th sub-electrode disposed in the third sub-area and spaced apart from the 2-2-th sub-electrode; light emitting elements disposed between the first electrode and the second electrode; a third driving transistor electrically connected to the 1-1-th sub-electrode; a contact electrode disposed on each of the 1-1-th and 1-2-th sub-electrodes and the 2-1-th and 2-2-th sub-electrodes, and the contact electrode and the first contact electrode being disposed on a same layer; and an intermediate electrode disposed in each of an area between the first sub-area and the second sub-area and an area between the second sub-area and the third sub-area.

In an embodiment, the intermediate electrode may include a first sub-intermediate electrode integral with the contact electrode in the third sub-pixel area on the 2-1-th sub-electrode, and a second sub-intermediate electrode integral with the contact electrode on the 2-2-th sub-electrode. The first sub-intermediate electrode may electrically connect the 2-1-th sub-electrode to the 1-2-th sub-electrode. The second sub-intermediate electrode may electrically connect the 2-2-th sub-electrode to the 1-3-th sub-electrode.

A display device in accordance with an embodiment may include: a display area including pixel areas, and a non-display area; and a pixel disposed in each of the pixel areas.

In an embodiment, the pixel may include a first sub-pixel area and a second sub-pixel area disposed adjacent to each other in a first direction, and each of first sub-pixel area and the second sub-pixel area including a first sub-area, a second sub-area, and a third sub-area spaced apart from each other in a second direction intersecting the first direction; a first electrode disposed in each of the first sub-pixel area and the second sub-pixel area, and including a 1-1-th sub-electrode disposed in the first sub-area, a 1-2-th sub-electrode disposed in the second sub-area, and a 1-3-th sub-electrode disposed in the third sub-area; a second electrode disposed in each of the first sub-pixel area and the second sub-pixel area, and including a 2-1-th sub-electrode disposed in the first sub-area and spaced apart from the 1-1-th sub-electrode, a 2-2-th sub-electrode disposed in the second sub-area and spaced apart from the 1-2-th sub-electrode, and a 2-3-th sub-electrode disposed in the third sub-area and spaced apart from the 1-3-th sub-electrode; light emitting elements disposed between the first electrode and the second electrode in each of the first sub-pixel area and the second sub-pixel area; a first driving transistor electrically connected to the 1-1-th sub-electrode of the first sub-pixel area, and a second driving transistor electrically connected to the 1-1-th sub-electrode of the second sub-pixel area; a contact electrode disposed on each of the 1-1-th to 1-3-th sub-electrodes and the 2-1-th to 2-3-th sub-electrodes; and a first intermediate electrode and a second intermediate electrode disposed in each of the first sub-pixel area and the second sub-pixel area, the first intermediate electrode being disposed in an area between the first sub-area and the second sub-area, and the second intermediate electrode being disposed in an area between the second sub-area and the third sub-area.

In an embodiment, the first intermediate electrode and the contact electrode may be integral with each other on the 2-1-th sub-electrode, and electrically connect the 2-1-th sub-electrode to the 1-2-th sub-electrode. The second intermediate electrode and the contact electrode may be integral with each other on the 2-2-th sub-electrode, and electrically connect the 2-2-th sub-electrode to the 1-3-th sub-electrode.

A method of fabricating a display device in accordance with an embodiment may include disposing a pixel in a pixel area including a first sub-pixel area and a second sub-pixel area adjacent to each other in a first direction, and each including a first sub-area, a second sub-area, and a third sub-area spaced apart from each other in a second direction intersecting the first direction. The disposing of the pixel may include forming a first driving transistor and a second driving transistor, and forming a display element layer on the first driving transistor and the second driving transistor.

In an embodiment, the forming of the display element layer may include forming, a first conductive line and a second conductive line spaced apart from each other in each of the first sub-pixel area and the second sub-pixel area; supplying light emitting elements to each of the first sub-pixel area and the second sub-pixel area, and aligning the light emitting elements by supplying the first conductive line and the second conductive line with corresponding alignment voltages; forming a contact electrode on each of the first conductive line and the second conductive line, and forming an intermediate electrode integral with the contact electrode in each of an area between the first sub-area and the second sub-area and an area between the second sub-area and the third sub-area; and forming 1-1-th, 1-2-th, and 1-3-th sub-electrodes successively disposed in the second direction in each of the first sub-pixel area and the second sub-pixel area by removing a portion of the first conductive line, and forming 2-1-th, 2-2-th, and 2-3-th sub-electrodes successively disposed in the second direction in each of the first sub-pixel area and the second sub-pixel area by removing a portion of the second conductive line.

In an embodiment, The intermediate electrode disposed in the area between the first sub-area and the second sub-area may extend from the contact electrode on the 2-1-th sub-electrode to the contact electrode on the 1-2-th sub-electrode disposed in a row subsequent to the 2-1-th sub-electrode, and electrically connect the 2-1-th sub-electrode with the 1-2-th sub-electrode in a plan view.

The intermediate electrode disposed in the area between the second sub-area and the third sub-area may extend from the contact electrode on the 2-2-th sub-electrode to the contact electrode on the 1-3-th sub-electrode disposed in a row subsequent to the 2-2-th sub-electrode, and electrically connect the 2-2-th sub-electrode to the 1-3-th sub-electrode in a plan view.

In a pixel, a display device including the pixel, and a method of fabricating the display device in accordance with an embodiment, light emitting elements distributed to each of a plurality of sub-emission areas which form each pixel may be connected in a serial/parallel combination structure so that light output efficiency of the light emitting elements may be enhanced, and light output distribution of the light emitting elements in the sub-emission areas may be uniform.

BRIEF DESCRIPTION OF THE DRAWINGS

The above and other aspects and features of the disclosure will become more apparent by describing in detail embodiments thereof with reference to the attached drawings, in which:

FIGS. 7A to 7C are schematic circuit diagrams illustrating different embodiments of an electrical connection relationship of components included in one pixel illustrated in FIG. 5.

FIGS. 15A to 15F are schematic plan views sequentially illustrating a method of fabricating a pixel illustrated in FIG. 8.

FIG. 17 is a schematic plan view illustrating an embodiment of the first to third connection lines illustrated in FIG. 8.

DETAILED DESCRIPTION OF THE EMBODIMENTS

Figure 1A:
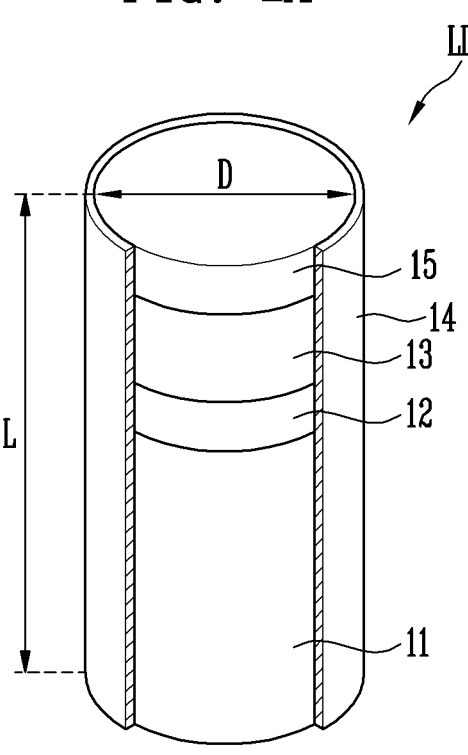
FIG. 1A is a schematic perspective view illustrating a light emitting element in accordance with an embodiment.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes within the spirit and the scope of the disclosure are encompassed in the disclosure.

Throughout the disclosure, like reference numerals refer to like parts throughout the various figures and embodiments. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In the disclosure, the singular forms are intended to include the plural meanings as well, unless the context clearly indicates otherwise. For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprise", "include", "have", etc. and variations thereof when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is directly under or below a second part, the first part may be not under or below the second part without a third part intervening between them.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments and required details of the disclosure are described with reference to the accompanying drawings in order to describe the disclosure in detail so that those having ordinary skill in the art to which the disclosure pertains may readily practice the disclosure. Furthermore, a singular form may include a plural form.

Figure 1B:
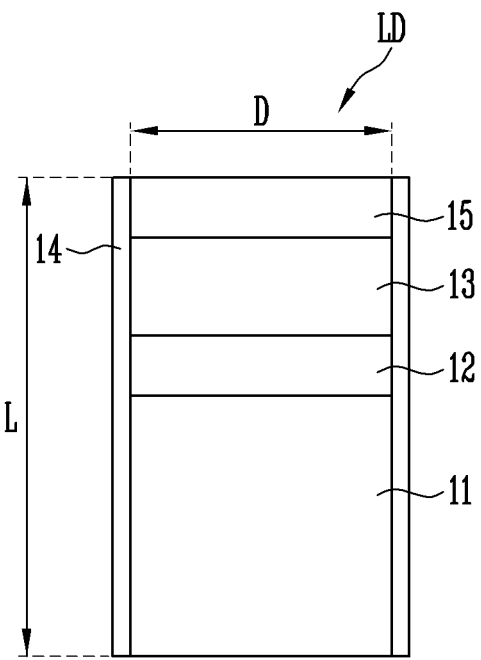
FIG. 1B is a schematic cross-sectional view illustrating the light emitting element of FIG. 1A.
Figure 2A:
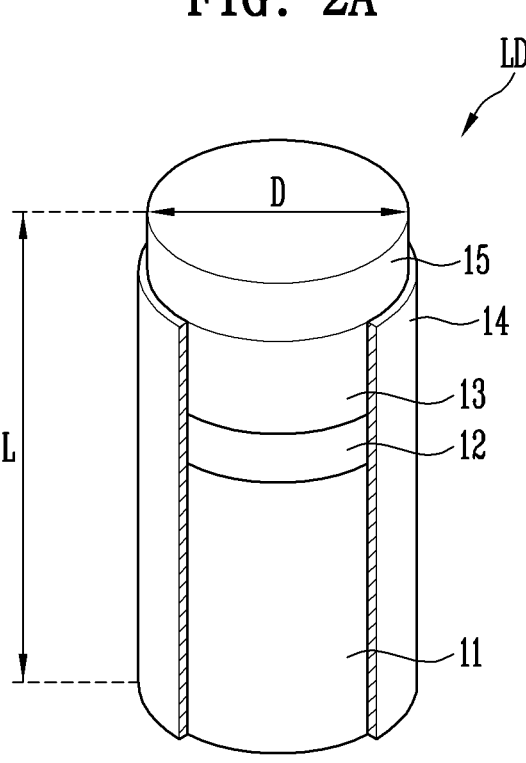
FIG. 2A is a perspective view schematically illustrating a light emitting element in accordance with an embodiment.
Figure 2B:
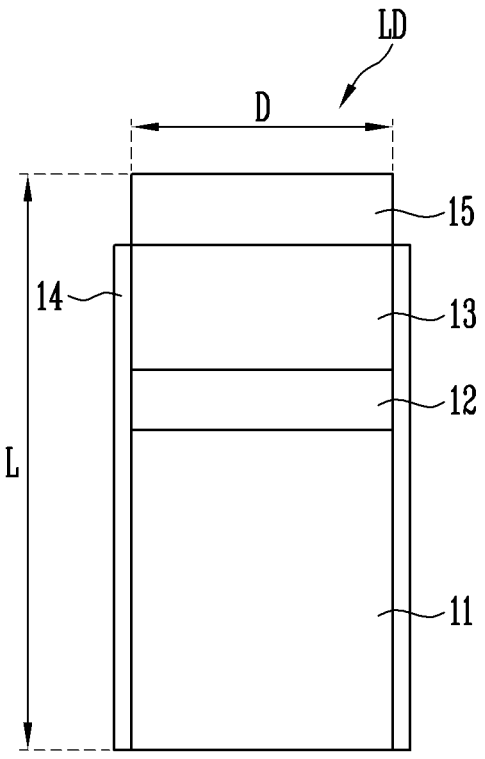
FIG. 2B is a schematic cross-sectional view illustrating the light emitting element of FIG. 2A.
Figure 3A:
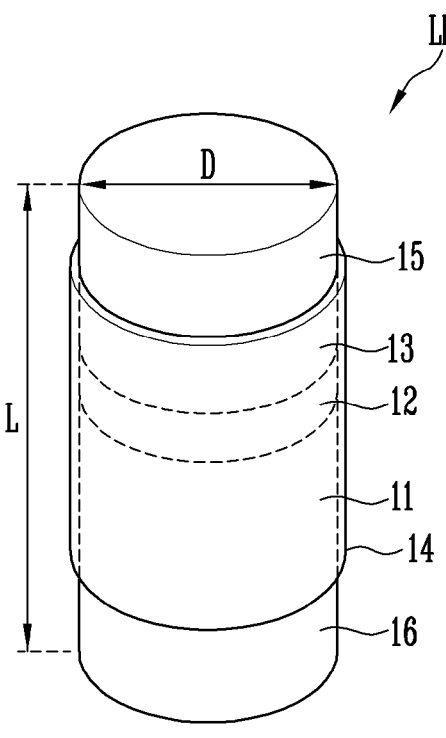
FIG. 3A is a perspective view schematically illustrating a light emitting element in accordance with an embodiment.
Figure 3B:
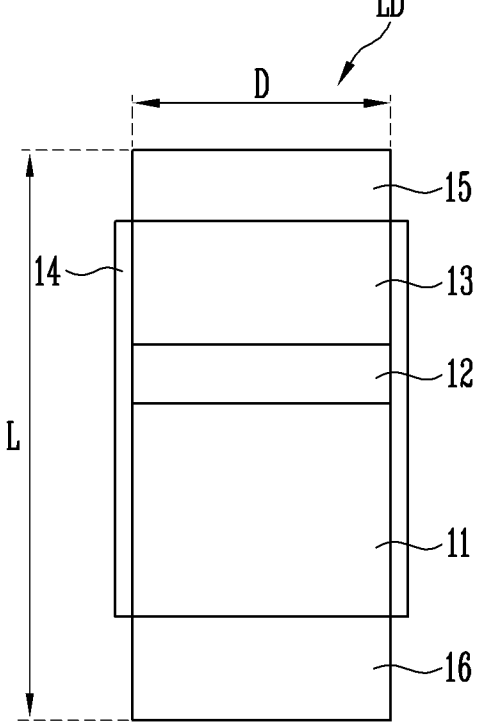
FIG. 3B is a schematic cross-sectional view illustrating the light emitting element of FIG. 3A.
Figure 4A:
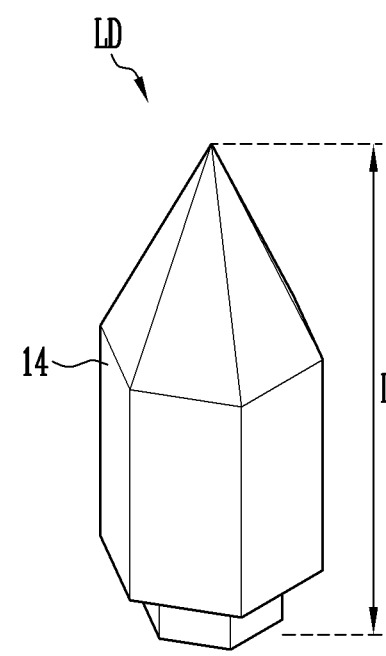
FIG. 4A is a schematic perspective view illustrating a light emitting element in accordance with an embodiment.
Figure 4B:
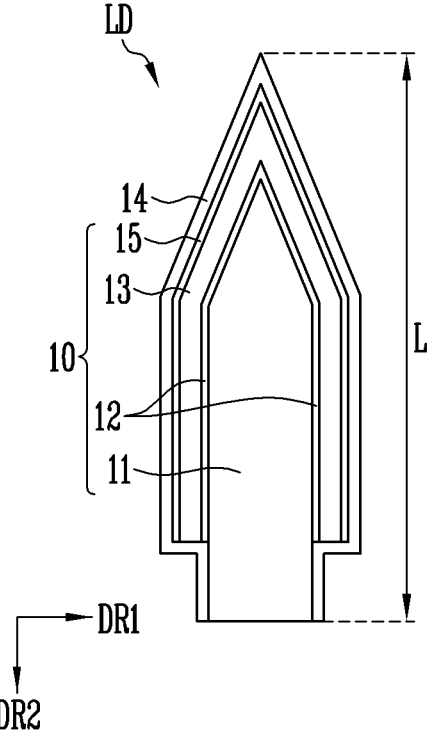
FIG. 4B is a schematic cross-sectional view illustrating the light emitting element of FIG. 4A.

FIG. 1A is a perspective view schematically illustrating a light emitting element in accordance with an embodiment. FIG. 1B is a schematic cross-sectional view illustrating the light emitting element of FIG. 1A. FIG. 2A is a perspective view schematically illustrating a light emitting element in accordance with an embodiment. FIG. 2B is a schematic cross-sectional view illustrating the light emitting element of FIG. 2A. FIG. 3A is a perspective view schematically illustrating a light emitting element in accordance with an embodiment. FIG. 3B is a schematic cross-sectional view illustrating the light emitting element of FIG. 3A. FIG. 4A is schematic a perspective view illustrating a light emitting element in accordance with an embodiment. FIG. 4B is a schematic cross-sectional view illustrating the light emitting element of FIG. 4A.

For the sake of explanation, a light emitting element fabricated by an etching method will be described with reference to FIGS. 1A, 1B, 2A, 2B, 3A, and 3B, and then a light emitting element fabricated by a growth method will be described with reference to FIGS. 4A and 4B. In an embodiment, the type and/or shape of the light emitting element LD is not limited to the embodiments illustrated in FIGS. 1A, 1B, 2A, 2B, 3A, 3B, 4A, and 4B. It is to be understood that the shapes disclosed herein may include shapes substantially identical or similar to the shapes.

Referring to FIGS. 1A, 1B, 2A, 2B, 3A, and 3B, the light emitting element LD may include a first semiconductor layer 11, a second semiconductor layer 13, and an active layer 12 interposed between the first and second semiconductor layers 11 and 13. For example, the light emitting element LD may be implemented as an emission stack formed by successively stacking the first semiconductor layer 11, the active layer 12, and the second semiconductor layer 13.

In an embodiment, the light emitting element LD may be formed in a shape extending in a direction. If the direction in which the light emitting element LD extends is defined as a longitudinal direction, the light emitting element LD may have one end and a remaining end in the extension direction. Any one of the first and second semiconductor layers 11 and 13 may be disposed in the one end of the light emitting element LD, and the other one of the first and second semiconductor layers 11 and 13 may be disposed in the remaining end thereof.

The light emitting element LD may have various shapes. For example, the light emitting element LD may have a rod-like shape or a bar-like shape extending in the longitudinal direction (for example, to have an aspect ratio greater than 1). In an embodiment, the length L of the light emitting element LD in the longitudinal direction may be greater than the diameter (D, or a width of a cross-section) thereof. The light emitting element LD may include a light emitting diode fabricated to have a small size, for example, with a length L and/or a diameter D corresponding to the microscale or the nanoscale. In an embodiment, the size of the light emitting element LD may be changed so as to meet requirements (or design conditions) of a lighting device or a self-emissive display device to which the light emitting element LD is to be applied.

The first semiconductor layer 11 may include, for example, at least one n-type semiconductor layer. For instance, the first semiconductor layer 11 may include an n-type semiconductor layer which may include any one semiconductor material of InAlGaN, GaN, AlGaN, InGaN, AlN, and InN and is doped with a first conductive dopant such as Si, Ge, or Sn. However, the constituent material of the first semiconductor layer 11 is not limited to thereto, and various other materials may be used to form the first semiconductor layer 11.

The active layer 12 may be disposed on the first semiconductor layer 11 and have a single or multiple quantum well structure. The location of the active layer 12 may be changed in various ways depending on the type of the light emitting element LD. The active layer 12 may emit light having a wavelength ranging from 400 nm to 900 nm, and use a double hetero structure. In an embodiment of the present disclosure, a cladding layer (not shown) doped with a conductive dopant may be formed over and/or under or below the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field of a voltage or more is applied to the opposite ends of the light emitting element LD, the light emitting element LD emits light by coupling of electron-hole pairs in the active layer 12. Since light emission of the light emitting element LD may be controlled based on the foregoing principle, the light emitting element LD may be used as a light source of various light emitting devices as well as a pixel of the display device.

The second semiconductor layer 13 may be disposed on the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which may include at least one semiconductor material of InAlGaN, GaN, AlGaN, InGaN, AlN, and InN, and is doped with a second conductive dopant such as Mg. However, the material for forming the second semiconductor layer 13 is not limited thereto, and various other materials may be used to form the second semiconductor layer 13.

In an embodiment, the first semiconductor layer 11 and the second semiconductor layer 13 may have different widths (or thicknesses) in the longitudinal direction L of the light emitting element LD. For example, the first semiconductor layer 11 may have a width (or a thickness) greater than that of the second semiconductor layer 13 in the longitudinal direction L of the light emitting element LD. Hence, as illustrated in FIGS. 1A to 3B, the active layer 12 of the light emitting element LD may be disposed at a position closer to an upper surface of the second semiconductor layer 13 than to a lower surface of the first semiconductor layer 11.

In an embodiment, the light emitting element LD may further include an additional electrode 15 disposed on the second semiconductor layer 13, as well as including the first semiconductor layer 11, the active layer 12, and the second semiconductor layer 13. In an embodiment, as shown in FIGS. 3A and 3B, the light emitting element LD may further include an additional electrode 16 disposed on one end of the first semiconductor layer 11.

Although each of the additional electrodes 15 and 16 may be an ohmic contact electrode, the disclosure is not limited thereto, and it may be a Schottky contact electrode depending on embodiments. Furthermore, each of the additional electrodes 15 and 16 may include metal or metallic oxide. For example, chrome (Cr), titanium (Ti), aluminum (Al), gold (Au), nickel (Ni), ITO, and an oxide or alloy thereof may be used alone or in combination with each other. However, the disclosure is not limited thereto.

Materials included in the respective additional electrodes 15 and 16 may be equal to or different from each other. The additional electrodes 15 and 16 may be transparent or semitransparent. Therefore, light generated from the light emitting element LD may pass through the additional electrodes 15 and 16 and be emitted outside the light emitting element LD. In an embodiment, in case that light generated from the light emitting element LD is emitted outside the light emitting element LD through an area other than the opposite ends of the light emitting element LD rather than passing through the additional electrodes 15 and 16, the additional electrodes 15 and 16 may include opaque metal.

In an embodiment, the light emitting element LD may further include an insulating layer 14. However, in an embodiment, the insulating layer 14 may be omitted, or may be provided to cover or overlap only some of the first semiconductor layer 11, the active layer 12, and the second semiconductor layer 13.

The insulating layer 14 may prevent the active layer 12 from short-circuiting because of making contact with a conductive material except the first semiconductor layer 11 and the second semiconductor layer 13. Furthermore, thanks to the insulating layer 14, occurrence of a defect on the surface of the light emitting element LD may be minimized, whereby the lifespan and efficiency of the light emitting element LD may be improved. In case that light emitting elements LD are disposed in close contact with each other, the insulating layer 14 may prevent an undesired short-circuit from occurring between the light emitting elements LD. It is not limited whether the insulating layer 14 is provided, so long as the active layer 12 may be prevented from short-circuiting with external conductive material.

As illustrated in FIGS. 1A and 1B, the insulating layer 14 may be provided in a shape enclosing an outer circumferential surface of the emission stack including the first semiconductor layer 11, the active layer 12, the second semiconductor layer 13, and the additional electrode 15. For the sake of explanation, FIG. 1A illustrates the insulating layer 14 a portion of which has been removed. The first semiconductor layer 11, the active layer 12, the second semiconductor layer 13, and the additional electrode 15 that are included in the light emitting element LD may be enclosed by the insulating layer 14.

Although in the above-mentioned embodiment the insulating layer 14 has been described as enclosing the overall outer circumferential surface of the first semiconductor layer 11, the active layer 12, the second semiconductor layer 13, and the additional electrode 15, the present disclosure is not limited thereto.

In an embodiment, as illustrated in FIGS. 2A and 2B, the insulating layer 14 may enclose the respective outer circumferential surfaces of the first semiconductor layer 11, the active layer 12, and the second semiconductor layer 13, and may not enclose the entirety of the outer circumferential surface of the additional electrode 15 disposed on the second semiconductor layer 13 or may enclose only a portion of the outer circumferential surface of the additional electrode 15 without enclosing the other portion of the outer circumferential surface of the additional electrode 15. Here, the insulating layer 14 may allow at least the opposite ends of the light emitting element LD to be exposed to the outside. For example, the insulating layer 14 may allow not only the additional electrode 15 disposed on one end of the second semiconductor layer 13 but also one end of the first semiconductor layer 11 to be exposed to the outside. In an embodiment, as illustrated in FIGS. 3A and 3B, in case that the additional electrodes 15 and 16 are respectively disposed on the opposite ends of the light emitting element LD, the insulating layer 14 may allow at least a portion of each of the additional electrodes 15 and 16 to be exposed to the outside. As an example, in an embodiment, the insulating layer 14 may not be provided.

In an embodiment, the insulating layer 14 may include a transparent insulating material. For example, the insulating layer 14 may include at least one insulating material selected from the group consisting of $SiO_2$, $Si_3N_4$, $Al_2O_3$, and $TiO_2$, but it is not limited thereto. In other words, various materials having insulating properties may be employed.

If the insulating layer 14 is provided in the light emitting element LD, the active layer 12 may be prevented from short-circuiting with a first and/or second electrode, which is not illustrated. Furthermore, thanks to the insulating layer 14, occurrence of a defect on the surface of the light emitting element LD may be minimized, whereby the lifespan and efficiency of the light emitting element LD may be improved. In case that light emitting elements LD are disposed in close contact with each other, the insulating layer 14 may prevent an undesired short-circuit from occurring between the light emitting elements LD.

The light emitting element LD may be employed as a light source for various display devices. The light emitting element LD may be fabricated through a surface treatment process. For example, the light emitting element LD may be surface-treated so that, in case that light emitting elements LD are mixed with a fluidic solution (or solvent) and supplied to each emission area (for example, an emission area of each pixel or an emission area of each sub-pixel), the light emitting elements LD may be evenly distributed rather than unevenly aggregating in the solution.

A light emitting device including the light emitting element LD described above may be used not only in a display device but also in various devices which requires a light source. For instance, in case that light emitting elements LD are disposed in the emission area of each pixel of a display panel, the light emitting elements LD may be used as a light source of the pixel. However, the application field of the light emitting element LD is not limited to the above-mentioned examples. For example, the light emitting element LD may also be used in other types of devices such as a lighting device, which requires a light source.

A light emitting element LD fabricated by the growth method will be described with reference to FIGS. 4A and 4B.

The following description of the light emitting element LD fabricated by the growth method will be focused on differences from the above-mentioned embodiments, and components of the light emitting element LD that are not separately explained in the following description may comply with that of the preceding embodiments. The same reference numerals will be used to designate the same components, and similar reference numerals will be used to designate similar components.

Referring to FIGS. 4A and 4B, the light emitting element LD in accordance with an embodiment may include a first semiconductor layer 11, a second semiconductor layer 13, and an active layer 12 interposed between the first and second semiconductor layers 11 and 13. In an embodiment, the light emitting element LD may include an emission pattern 10 having a core-shell structure. The emission pattern 10 may include a first semiconductor layer 11 disposed in a central portion of the light emitting element LD, an active layer 12 which encloses at least one side or a side of the first semiconductor layer 11, a second semiconductor layer 13 which encloses at least one side or a side of the active layer 12, and an additional electrode 15 which encloses at least one side or a side of the second semiconductor layer 13.

The light emitting element LD may be formed in a polypyramid shape extending in one direction or direction. For example, the light emitting element LD may have a hexagonal pyramid shape. If the direction in which the light emitting element LD extends is defined as a longitudinal direction L, the light emitting element LD may have one end (or a lower end) and a remaining end (or an upper end) in the longitudinal direction L. A portion of any one of the first and second semiconductor layers 11 and 13 on the one end (or the lower end) of the light emitting element LD may be exposed to the outside. A portion of the other one of the first and second semiconductor layers 11 and 13 on the remaining end (or the upper end) of the light emitting element LD may be exposed to the outside. For example, a portion of the first semiconductor layer 11 on the one end (or the lower end) of the light emitting element LD may be exposed, and a portion of the second semiconductor layer 13 on the remaining end (or the upper end) of the light emitting element LD may be exposed. In an embodiment, in case that the light emitting element LD may include the additional electrode 15, a portion of the additional electrode 15 that encloses at least one side or a side of the second semiconductor layer 13 on the remaining end (or the upper end) of the light emitting element LD may be exposed.

In an embodiment, the first semiconductor layer 11 may be disposed in a core, for example, a central (or middle) portion, of the light emitting element LD. The light emitting element LD may have a shape corresponding to the shape of the first semiconductor layer 11. For instance, if the first semiconductor layer 11 has a hexagonal pyramid shape, the light emitting element LD and the emission pattern 10 each may also have a hexagonal pyramid shape.

The active layer 12 may be provided and/or formed in a shape enclosing the outer circumferential surface of the first semiconductor layer 11 in the longitudinal direction L of the light emitting element LD. In detail, the active layer 12 may be provided and/or formed in a shape enclosing an area of the first semiconductor layer 11, other than a lower end of the opposite ends of the first semiconductor layer 11, in the longitudinal direction L of the light emitting element LD.

The second semiconductor layer 13 may be provided and/or formed in a shape enclosing the active layer 12 in the longitudinal direction L of the light emitting element LD, and may include a semiconductor layer having a type different from that of the first semiconductor layer 11. For example, the second semiconductor layer 13 may include at least one p-type semiconductor layer.

In an embodiment, the light emitting element LD may include the additional electrode 15 that encloses at least one side or a side of the second semiconductor layer 13. The additional electrode 15 may be an ohmic contact electrode electrically connected to the second semiconductor layer 13, but the disclosure is not limited thereto.

As described above, the light emitting element LD may have a hexagonal pyramid shape with the opposite ends protruding outward, and may be implemented as the emission pattern 10 with a core-shell structure including the first semiconductor layer 11 provided in the central portion thereof, the active layer 12 which encloses the first semiconductor layer 11, the second semiconductor layer 13 which encloses the active layer 12, and the additional electrode 15 which encloses the second semiconductor layer 13. The first semiconductor layer 11 may be disposed in the one end (or the lower end) of the light emitting element LD having a hexagonal pyramid shape, and the additional electrode 15 may be disposed in the remaining end (or the upper end) of the light emitting element LD.

In an embodiment, the light emitting element LD may further include an insulating layer 14 provided on the outer circumferential surface of the emission pattern 10 having a core-shell structure. The insulating layer 14 may include a transparent insulating material.

Figure 5:
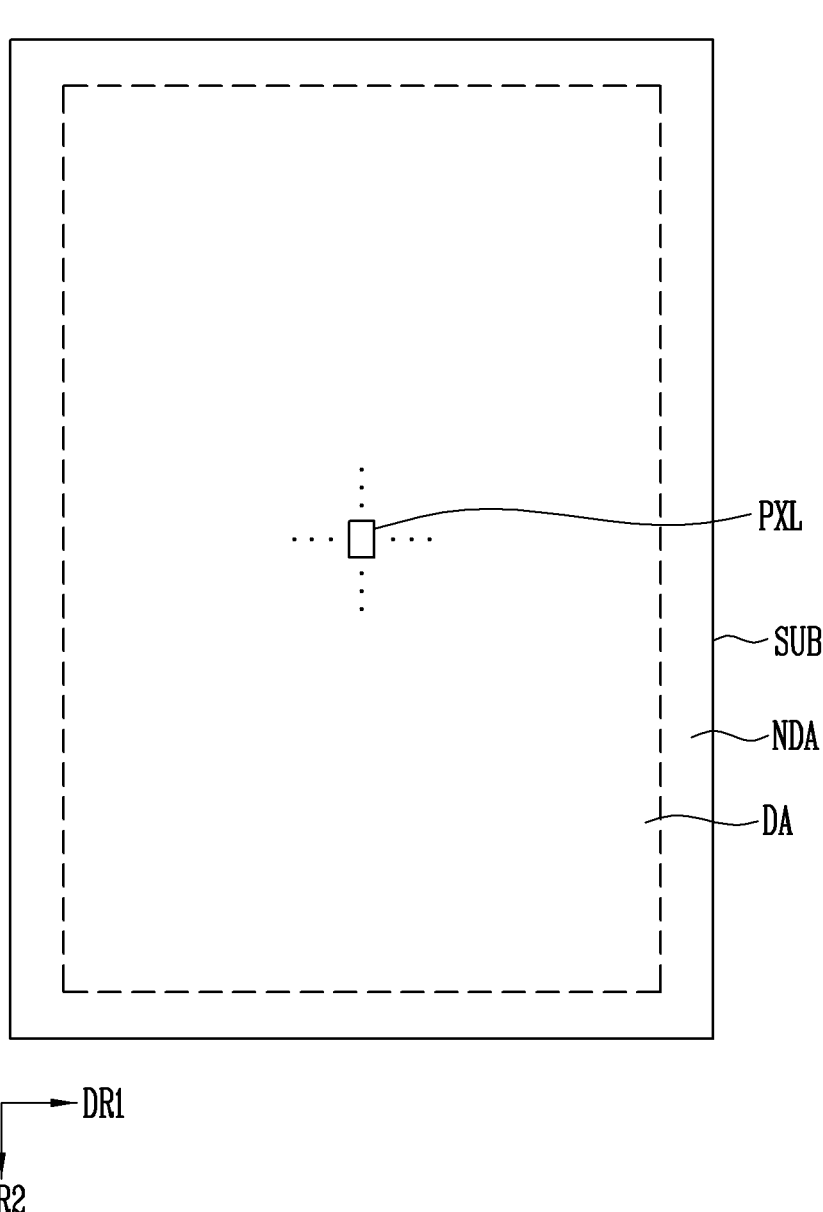
FIG. 5 illustrates a display device in accordance with an embodiment of the, and for example, is a schematic plan view of a display device using, as a light source, any one of the light emitting elements illustrated in FIGS. 1A, 1B, 2A, 2B, 3A, 3B, 4A, and 4B.

FIG. 5 illustrates a display device in accordance with an embodiment, and by way of example, is a schematic plan view of a display device using, as a light source, any one of the light emitting elements illustrated in FIGS. 1A, 1B, 2A, 2B, 3A, 3B, 4A, and 4B.

For the sake of explanation, FIG. 5 schematically illustrates the structure of the display device, focused on a display area in which an image is displayed. In an embodiment, although not illustrated, at least one driving circuit (for example, a scan driver and a data driver) and/or lines may be further provided in the display device.

Referring to FIGS. 1A, 1B, 2A, 2B, 3A, 3B, 4A, 4B, and 5, the display device in accordance with an embodiment may include a substrate SUB, pixels PXL which are provided in the substrate SUB and each of which may include at least one light emitting element LD, a driver (not illustrated) provided in the substrate SUB and driving the pixels PXL, and a line component (not illustrated) provided to connect the pixels PXL to the driver.

The display device may be classified into a passive-matrix type display device and an active-matrix type display device according to a method of driving the light emitting element LD. For example, in case that the display device is implemented as an active matrix type, each of the pixels PXL may include a driving transistor controlling the amount of current to be supplied to the light emitting element LD, and a switching transistor transmitting a data signal to the driving transistor.

Recently, active-matrix type display devices that selectively turn on each pixel PXL taking into account the resolution, the contrast, and the working speed have been mainstreamed. However, the disclosure is not limited thereto. For example, passive-matrix type display devices in which pixels PXL may be turned on by groups may also employ components (for example, first and second electrodes) for driving the light emitting element LD.

The substrate SUB may include a display area DA and a non-display area NDA.

In an embodiment, the display area DA may be disposed in a central portion of the display device, and the non-display area NDA may be disposed in a perimeter portion of the display device in such a way as to enclose the display area DA. The locations of the display area DA and the non-display area NDA are not limited thereto, and the locations thereof may be changed.

The display area DA may be an area in which the pixels PXL for displaying an image are provided. The non-display area NDA may be an area in which the driver for driving the pixels PXL and some of the line component for connecting the pixels PXL to the driver are provided.

The display area DA may have various shapes. For example, the display area DA may be provided in a closed polygonal shape including linear sides. For example, the display area DA may be provided in a circular and/or elliptical shape including a curved side. As a further example, the display device DA may be provided in various shapes such as a semi-circular shape and a semi-elliptical shape including a linear side and a curved side.

The non-display area NDA may be provided in at least one side or a side of the display area DA. In an embodiment, the non-display area NDA may enclose the periphery (or the edge) of the display area DA.

The substrate SUB may include a transparent insulating material to allow light transmission.

The substrate SUB may be a rigid substrate. For example, the rigid substrate SUB may be one of a glass substrate, a quartz substrate, a glass ceramic substrate, and a crystalline glass substrate. The substrate SUB may be a flexible substrate.

One area on the substrate SUB may be provided as the display area DA in which the pixels PXL are disposed, and the other area thereof may be provided as the non-display area NDA. For example, the substrate SUB may include the display area DA including pixel areas in which the respective pixels PXL are formed, and the non-display area NDA disposed around the display area DA.

The pixels PXL may be provided in the display area DA on the substrate SUB. In an embodiment, the pixels PXL may be arranged (or disposed) in the display area DA in a stripe or PENTILE™ arrangement structure, but the present disclosure is not limited thereto.

Each of the pixels PXL may include at least one light emitting element LD driven in response to a corresponding scan signal and a corresponding data signal. The light emitting element LD may have a small size corresponding to the micrometer scale or the nanometer scale and be connected in parallel to light emitting elements LD disposed adjacent thereto, but the disclosure is not limited thereto. The light emitting element LD may form a light source of each pixel PXL.

Each of the pixels PXL may include at least one light source which is driven by a signal (for example, a scan signal and a data signal) and/or a power supply (for example, a first driving power supply and a second driving power supply). For example, each of the pixels PXL may include a light emitting element LD illustrated in each of the embodiments of FIGS. 1A to 4B, for example, at least one subminiature light emitting element LD having a small size corresponding to the nanometer scale or the micrometer scale. However, in embodiments, the type of the light emitting element LD which may be used as a light source of each of the pixels PXL is not limited thereto.

In an embodiment, the color, the type, and/or the number of pixels PXL are not particularly limited. For example, the color of light emitted from each pixel PXL may be changed in various ways.

The driver may provide a signal and a power voltage to each of the pixels PXL through the line component and thus control the operation of the pixel PXL. For the sake of explanation, in FIG. 5, the line component is omitted.

The driver may include a scan driver to provide scan signals to the pixels PXL through scan lines, an emission driver to provide emission control signals to the pixels PXL through emission control lines, a data driver to provide data signals to the pixels PXL through data lines, and a timing controller. The timing controller may control the scan driver, the emission driver, and the data driver.

FIGS. 6A to 6E are schematic circuit diagrams illustrating various embodiments of an electrical connection relationship of components included in one pixel illustrated in FIG. 5.

For example, FIGS. 6A to 6E illustrate different embodiments of the electrical connection relationship of components included in a pixel PXL which may be employed in an active display device. However, the types of the components included in the pixel PXL to which embodiments may be applied are not limited thereto.

In FIGS. 6A to 6E, not only the components included in each of the pixels PXL illustrated in FIG. 5 but also an area in which the components are provided is embraced in the definition of the term "pixel PXL". In an embodiment, each pixel PXL illustrated in FIGS. 6A to 6E may be any one of the pixels PXL provided in the display device of FIG. 5. The pixels PXL may have structures substantially equal or similar to each other.

Referring to FIGS. 1A to 4B, 5, and 6A to 6E, each pixel PXL (hereinafter referred to as 'pixel') may include an emission unit EMU to generate light having a luminance corresponding to a data signal. The pixel PXL may selectively further include a pixel circuit 144 to drive the emission unit EMU.

In an embodiment, the emission unit EMU may include light emitting elements LD connected in parallel between a first power line PL1 to which a first driving power supply VDD is applied and a second power line PL2 to which a second driving power supply VSS is applied. For example, the emission unit EMU may include a first electrode EL1 (or "first alignment electrode") connected to the first driving power supply VDD via the pixel circuit 144 and the first power line PL1, a second electrode EL2 (or "second alignment electrode") connected to the second driving power supply VSS through the second power line PL2, and light emitting elements LD connected in parallel to each other in a same direction between the first and second electrodes EL1 and EL2. In an embodiment, the first electrode EL1 may be an anode electrode, and the second electrode EL2 may be a cathode electrode.

In an embodiment, each of the light emitting elements LD included in the emission unit EMU may include a first end connected to the first driving power supply VDD through the first electrode EL1, and a second end connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are connected in parallel to each other in a same direction (for example, in a forward direction) between the first electrode EL1 and the second electrode EL2 to which voltages having different potentials are respectively supplied may form respective valid light sources. The valid light sources may be grouped to form the emission unit EMU of the pixel PXL.

The light emitting elements LD of the emission unit EMU may emit light having a luminance corresponding to driving current supplied thereto through the pixel circuit 144. For example, during each frame period, the pixel circuit 144 may supply driving current corresponding to a gray scale of corresponding frame data to the emission unit EMU. The driving current supplied to the emission unit EMU may be divided into the light emitting elements LD connected to each other in a same direction. Hence, each of the light emitting elements LD may emit light having a luminance corresponding to current applied thereto, so that the emission unit EMU may emit light having a luminance corresponding to the driving current.

Figure 6A:
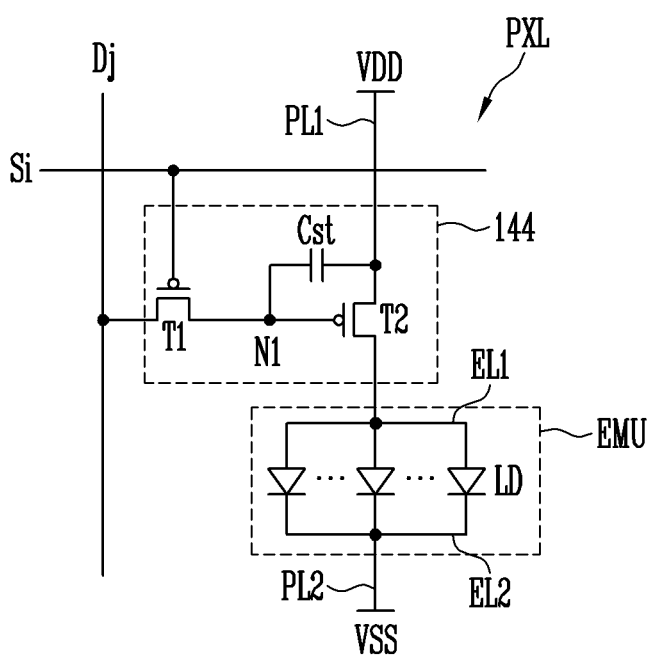
FIGS. 6A to 6E are schematic circuit diagrams illustrating various embodiments of an electrical connection relationship of components included in one pixel illustrated in FIG. 5.
Figure 6B:
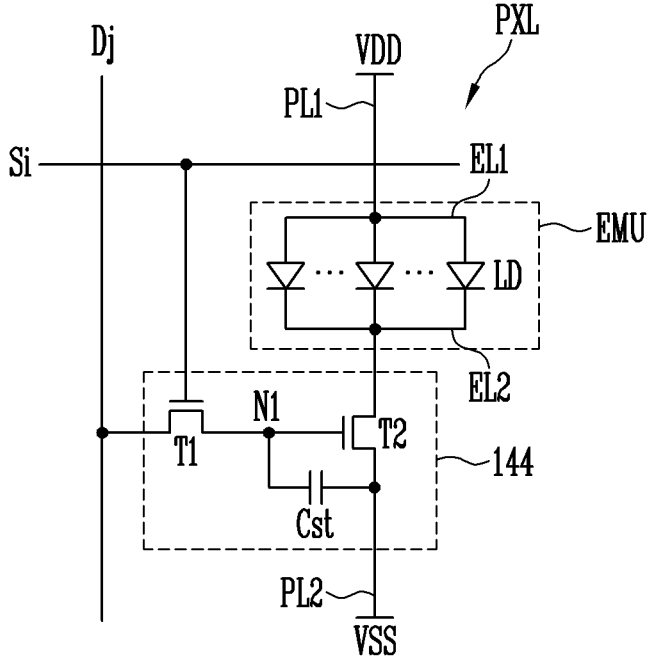
Figure 6C:
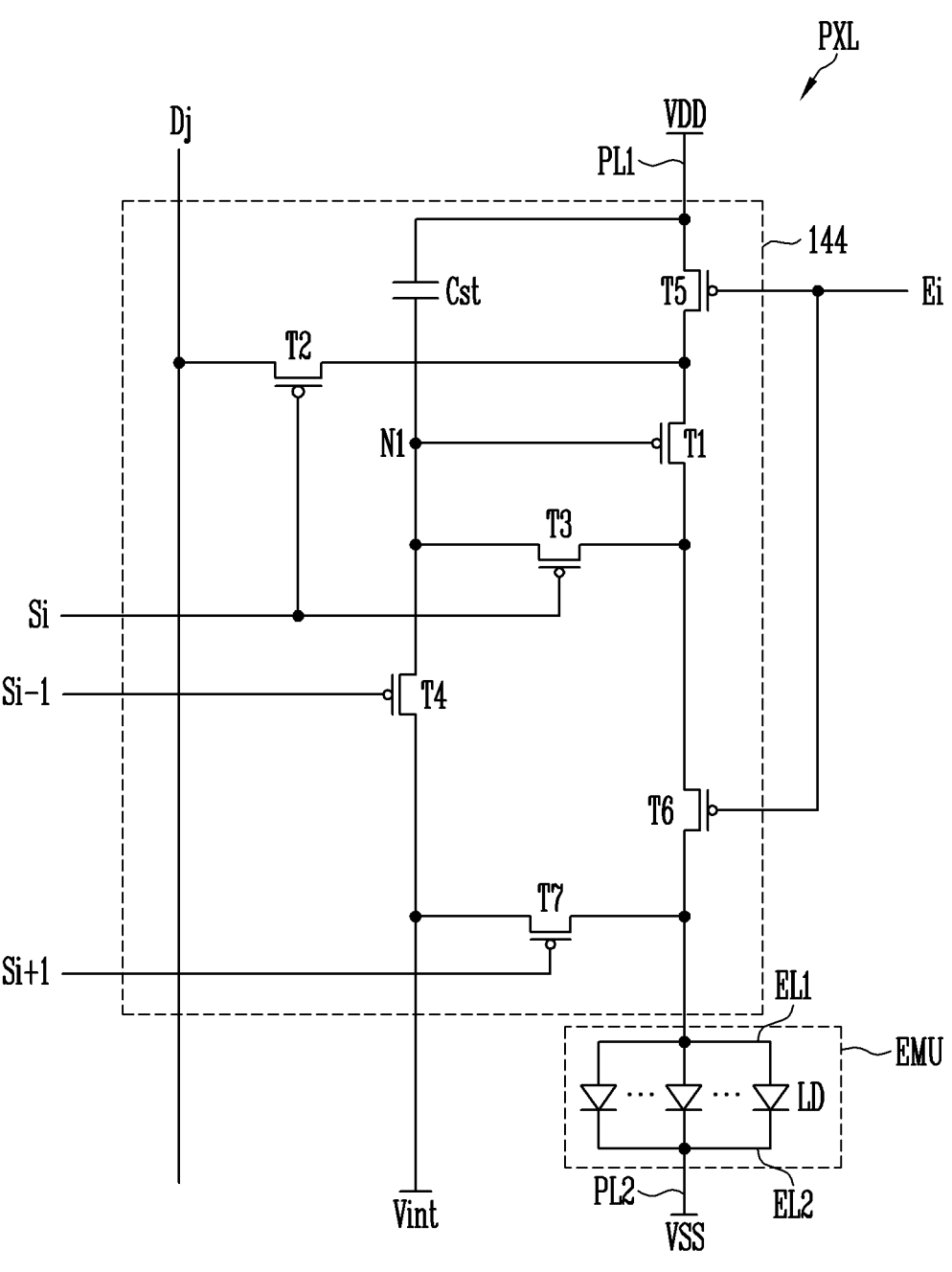
Figure 6D:
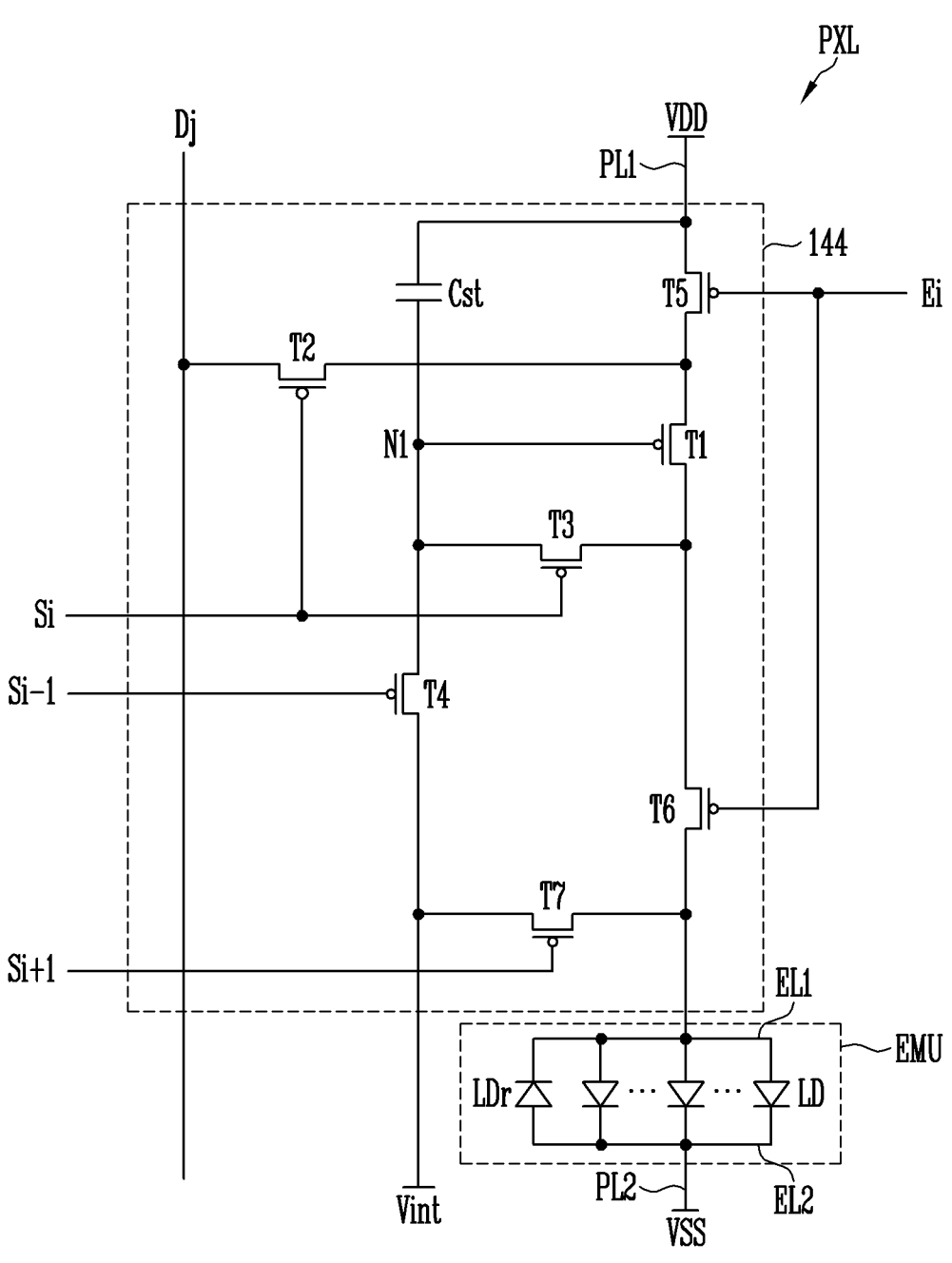
Figure 6E:
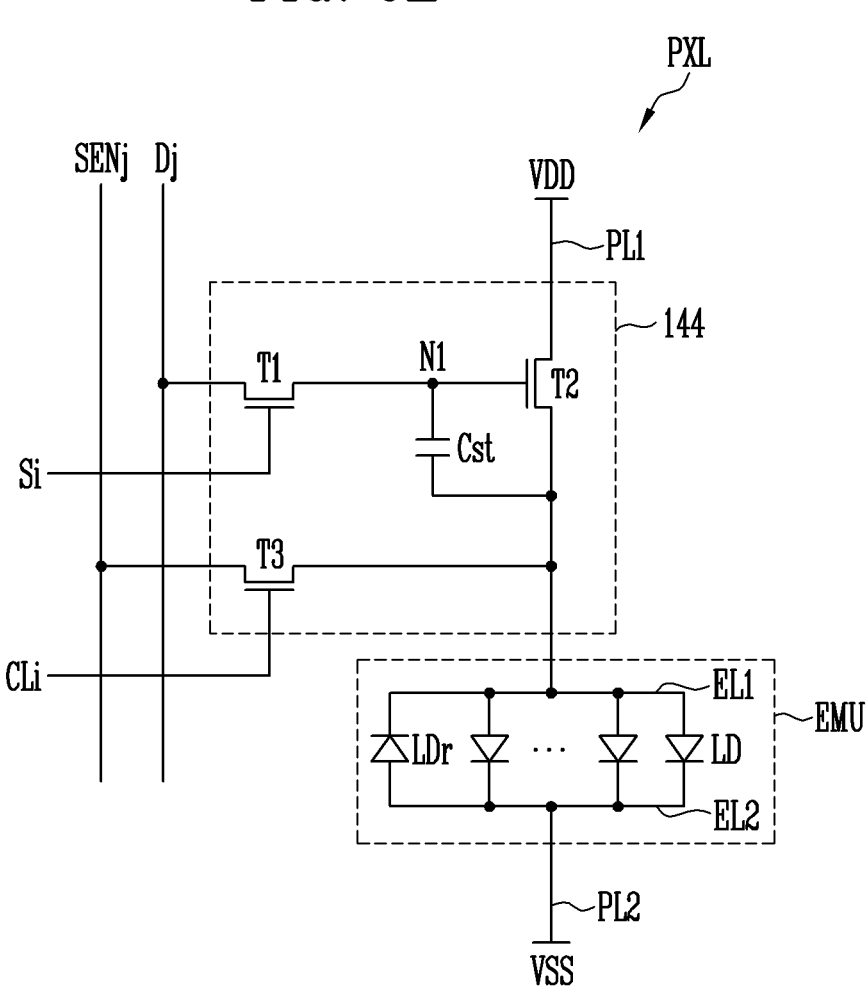

Although FIGS. 6A to 6E illustrate embodiments in which the light emitting elements LD are connected to each other in a same direction between the first and second driving power supplies VDD and VSS, the disclosure is not limited thereto. In an embodiment, the emission unit EMU may further include at least one invalid light source, as well as including the light emitting elements LD that form the respective valid light sources. For example, as illustrated in FIGS. 6D and 6E, at least a reverse light emitting element LDr may be further connected between the first and second electrodes EL1 and EL2 of the emission unit EMU. The reverse light emitting element LDr, along with the light emitting elements LD that form the valid light sources, may be connected in parallel to each other between the first and second electrodes EL1 and EL2. Here, the reverse light emitting element LDr may be connected between the first and second electrodes EL1 and EL2 in a direction opposite to that of the light emitting elements LD. Even in case that a driving voltage (for example, a normal directional driving voltage) is applied between the first and second electrodes EL1 and EL2, the reverse light emitting element LDr remains disabled. Hence, current substantially does not flow through the reverse light emitting element LDr.

The pixel circuit 144 may be connected to a scan line Si and a data line Dj of the corresponding pixel PXL. For example, if the pixel PXL is disposed in an i-th row (i is a natural number) and a j-th column (j is a natural number) of the display area DA, the pixel circuit 144 of the pixel PXL may be connected to an i-th scan line Si and a j-th data line Dj of the display area DA. In an embodiment, the pixel circuit 144 may include first and second transistors T1 and T2, and a storage capacitor Cst, as illustrated in FIGS. 6A and 6B. The structure of the pixel circuit 144 is not limited to the embodiments illustrated in FIGS. 6A and 6B.

First, referring to FIG. 6A, the pixel circuit 144 may include first and second transistors T1 and T2, and a storage capacitor Cst.

A first terminal of the first transistor T1 (the switching transistor) may be connected to the j-th data line Dj, and a second terminal thereof may be connected to a first node N1. Here, the first terminal and the second terminal of the first transistor T1 are different terminals, and, for example, if the first terminal is a source electrode, the second terminal may be a drain electrode. A gate electrode of the first transistor T1 may be connected to the i-th scan line Si.

In case that a scan signal having a voltage (for example, a low-level voltage) capable of turning on the first transistor T1 is supplied from the i-th scan line Si, the first transistor T1 is turned on to electrically connect the j-th data line Dj with the first node N1. Here, a data signal of a corresponding frame is supplied to the j-th data line Dj, whereby the data signal is transmitted to the first node N1. The data signal transmitted to the first node N1 may be storage into the storage capacitor Cst.

A first terminal of the second transistor T2 (driving transistor) may be connected to the first driving power supply VDD, and a second terminal thereof may be electrically connected to the first electrode EL1 for the light emitting elements LD. A gate electrode of the second transistor T2 may be connected to the first node N1. As such, the second transistor T2 may control the amount of driving current to be supplied to the light emitting elements LD in response to the voltage of the first node N1.

One electrode of the storage capacitor Cst may be connected to the first driving power supply VDD, and a remaining electrode thereof may be connected to the first node N1. The storage capacitor Cst is charged with a voltage corresponding to a data signal supplied to the first node N1, and maintains the charged voltage until a data signal of a subsequent frame is supplied.

FIGS. 6A and 6B each illustrate the pixel circuit 144 including the first transistor T1 to transmit a data signal to the pixel PXL, the storage capacitor Cst to store the data signal, and the second transistor T2 to supply driving current corresponding to the data signal to the light emitting elements LD.

However, the disclosure is not limited thereto, and the structure of the pixel circuit 144 may be changed in various ways. For example, the pixel circuit 144 may further include at least one transistor element such as a transistor element to compensate for the threshold voltage of the second transistor T2, a transistor element to initialize the first node N1, and/or a transistor element to control an emission time of the light emitting elements LD, or other circuit elements such as a boosting capacitor for boosting the voltage of the first node N1.

Furthermore, although in FIG. 6A the transistors, for example, the first and second transistors T1 and T2, included in the pixel circuit 144 have been illustrated as being formed of P-type transistors, the disclosure is not limited thereto. In other words, at least one of the first and second transistors T1 and T2 included in the pixel circuit 144 may be changed to an N-type transistor.

Referring to FIGS. 1A to 4B, 5, and 6B, the first and second transistors T1 and T2 in accordance with an embodiment may be formed of N-type transistors. The configuration and operation of the pixel circuit 144 illustrated in FIG. 6B, other than a change in connection positions of some or a number of components because of a change in the type of transistor, are similar to those of the pixel circuit 144 of FIG. 6A. Therefore, descriptions pertaining thereto will be simplified.

In an embodiment, the pixel circuit 144 illustrated in FIG. 6B may include first and second transistors T1 and T2 formed of N-type transistors, and a storage capacitor Cst. In case that the first and second transistors T1 and T2 are formed of N-type transistors, the emission unit EMU may be connected between the first driving power supply VDD and the pixel circuit 144 to secure stabilization of the storage capacitor Cst to be charged with a voltage corresponding to a data signal supplied to the first node N1. Here, the disclosure is not limited thereto. In an embodiment, the emission unit EMU illustrated in FIG. 6B may be connected between the pixel circuit 144 and the second driving power supply VSS. In an embodiment, the configuration of the pixel circuit 144 is not limited to the embodiments illustrated in FIGS. 6A and 6B. For example, the pixel circuit 144 may be formed in a same manner as that of the embodiments illustrated in FIGS. 6C and 6D.

As illustrated in FIGS. 6C and 6D, the pixel circuit 144 may be further connected to at least another scan line. For example, the pixel PXL disposed in the i-th row of the display area DA may be further connected to an i−1-th scan line Si−1 and/or an i+1-th scan line Si+1. In an embodiment, the pixel circuit 144 may be connected not only to the first and second driving power supplies VDD and VSS but also to a third power supply. For example, the pixel circuit 144 may also be connected to an initialization power supply Vint.

The pixel circuit 144 may include first to seventh transistors T1 to T7, and a storage capacitor Cst.

One electrode, for example, a source electrode, of the first transistor T1 (driving transistor) may be connected to the first driving power supply VDD via the fifth transistor T5, and another electrode thereof, for example, a drain electrode, may be connected to one ends of light emitting elements LD via the sixth transistor T6. A gate electrode of the first transistor T1 may be connected to a first node N1. The first transistor T1 may control driving current flowing between the first driving power supply VDD and the second driving power supply VSS via the light emitting elements LD in response to the voltage of the first node N1. The foregoing first transistor T1 may have a same configuration as that of the second transistor T2 described with reference to FIG. 6A.

The second transistor T2 (switching transistor) may be connected between the j-th data line Dj connected to the pixel PXL and the source electrode of the first transistor T1. A gate electrode of the second transistor T2 may be connected to the i-th scan line Si connected to the pixel PXL. In case that a scan signal having a gate-on voltage (for example, a low-level voltage) is supplied from the i-th scan line Si, the second transistor T2 may be turned on to electrically connect the j-th data line Dj to the source electrode of the first transistor T1. Hence, if the second transistor T2 is turned on, a data signal supplied from the j-th data line Dj may be transmitted to the first transistor T1. The foregoing second transistor T2 may have a same configuration as that of the first transistor T1 described with reference to FIG. 6A.

The third transistor T3 may be connected between the drain electrode of the first transistor T1 and the first node N1. A gate electrode of the third transistor T3 may be connected to the i-th scan line Si. In case that a scan signal having a gate-on voltage is supplied from the i-th scan line Si, the third transistor T3 may be turned on to electrically connect the drain electrode of the first transistor T1 to the first node N1.

The fourth transistor T4 may be connected between the first node N1 and an initialization power line to which the initialization power supply Vint is to be applied. A gate electrode of the fourth transistor T4 may be connected to a preceding scan line, for example, the i−1-th scan line Si−1. In case that a scan signal having a gate-on voltage is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 may be connected between the first driving power supply VDD and the first transistor T1. A gate electrode of the fifth transistor T5 may be connected to a corresponding emission control line, for example, an i-th emission control line Ei. The fifth transistor T5 may be turned off in cast that an emission control signal having a gate-off voltage is supplied to the i-th emission control line Ei, and may be turned on in other cases.

The sixth transistor T6 may be connected between the first transistor T1 and the first ends of the light emitting elements LD. A gate electrode of the sixth transistor T6 may be connected to the i-th emission control line Ei. The sixth transistor T6 may be turned off in case that an emission control signal having a gate-off voltage is supplied to the i-th emission control line Ei, and may be turned on in other cases.

The seventh transistor T7 may be connected between the initialization power line and the first ends of the light emitting elements LD. A gate electrode of the seventh transistor T7 may be connected to any one of scan lines of a subsequent set, for example, to the i+1-th scan line Si+1. In case that a scan signal having a gate-on voltage is supplied to the i+1-th scan line Si+1, the seventh transistor T7 may be turned on so that the voltage of the initialization power supply Vint may be supplied to the first ends of light emitting elements LD.

The storage capacitor Cst may be connected between the first driving power supply VDD and the first node N1. The storage capacitor Cst may store a voltage corresponding both to the data signal applied to the first node N1 during each frame period and to the threshold voltage of the first transistor T1.

Although in FIGS. 6A and 6D the transistors, for example, the first to seventh transistors T1 to T7, included in the pixel circuit 144 have been illustrated as being formed of P-type transistors, the disclosure is not limited thereto. For example, at least one of the first to seventh transistors T1 to T7 may be changed to an N-type transistor.

In an embodiment, the configuration of the pixel circuit 144 is not limited to the embodiments illustrated in FIGS. 6A to 6D. For example, the pixel circuit 144 may be formed in a same manner as that of an embodiment shown in FIG. 6E.

As illustrated in FIG. 6E, the pixel circuit 144 may be further connected to a control line CLi and a sensing line SENj. For example, the pixel circuit 144 of the pixel PXL disposed in the i-th row and the j-th column of the display area DA may be connected to an i-th control line CLi and a j-th sensing line SENj of the display area DA. The pixel circuit 144 described above may further include a third transistor T3 as well as including the first and second transistors T1 and T2 illustrated in FIGS. 6A and 6B.

The third transistor T3 is connected between the second transistor T2 and the j-th sensing line SENj. For example, one electrode of the third transistor T3 may be connected to one terminal (for example, a source electrode) of the second transistor T2 connected to the first electrode EL1, and another electrode of the third transistor T3 may be connected to the j-th sensing line SENj. In case that the sensing line is omitted, a gate electrode of the third transistor T3 may be connected to the j-th data line Dj.

In an embodiment, the gate electrode of the third transistor T3 is connected to the i-th control line CLi. In case that the i-th control line CLi is omitted, the gate electrode of the third transistor T3 may be connected to the i-th scan line Si. The third transistor T3 may be turned on by a control signal that has a gate-on voltage (for example, a high-level voltage) and is supplied to the i-th control line CLi during a sensing period, so that the j-th sensing line SENj and the second transistor T2 may be electrically connected to each other.

In an embodiment, the sensing period may be a period in which characteristic information of each of the pixels PXL disposed in the display area DA (for example, a threshold voltage, etc. of the second transistor T2) is extracted. During the above-mentioned sensing period, the second transistor T2 may be turned on by supplying a reference voltage capable of turning on the second transistor T2 to the first node N1 through the j-th data line Dj and the first transistor T1, or connecting each pixel PXL to a current source or the like within the spirit and the scope of the disclosure. Furthermore, the second transistor T2 may be connected to the j-th sensing line SENj by turning on the third transistor T3 by supplying a control signal having a gate-on voltage to the third transistor T3. Hence, the characteristic information of each pixel PXL that may include the threshold voltage, etc. of the second transistor T2 may be extracted through the j-th sensing line SENj. The extracted characteristic information may be used to convert image data to compensate for a deviation in characteristics between the pixels PXL.

Although FIG. 6E illustrates an embodiment where all of the first to third transistors T1 to T3 are N-type transistors, the disclosure is not limited thereto. For example, at least one of the first to third transistors T1 to T3 may be changed to a P-type transistor. Furthermore, although FIG. 6E illustrates an embodiment where the emission unit EMU is connected between the pixel circuit 144 and the second driving power supply VSS, the emission unit EMU may be connected between the first driving power supply VDD and the pixel circuit 144.

Although FIGS. 6A to 6E illustrate embodiments in which all light emitting elements LD of each emission unit EMU are connected in parallel to each other, the disclosure is not limited thereto. In an embodiment, the emission unit EMU may include at least one serial set including light emitting elements LD connected in parallel to each other. In other words, the emission unit EMU may be formed of a serial/ parallel combination structure. The foregoing configuration will be described below with reference to FIGS. 7A to 7C.

The structure of the pixel PXL which may be applied to the disclosure is not limited to the embodiments illustrated in FIGS. 6A to 6E, and the corresponding pixel PXL may have various structures. In an embodiment, each pixel PXL may be formed in a passive light emitting display device, or the like within the spirit and the scope of the disclosure. The pixel circuit 144 may be omitted, and the opposite ends of the light emitting elements LD included in the emission unit EMU may be connected to or directly connected to the scan lines Si−1, Si, and Si+1, the j-th data line Dj, the first power line PL1 to which the first driving power supply VDD is to be applied, the second power line PL2 to which the second driving power supply VSS is to be applied, and/or a control line.

Figure 7A:
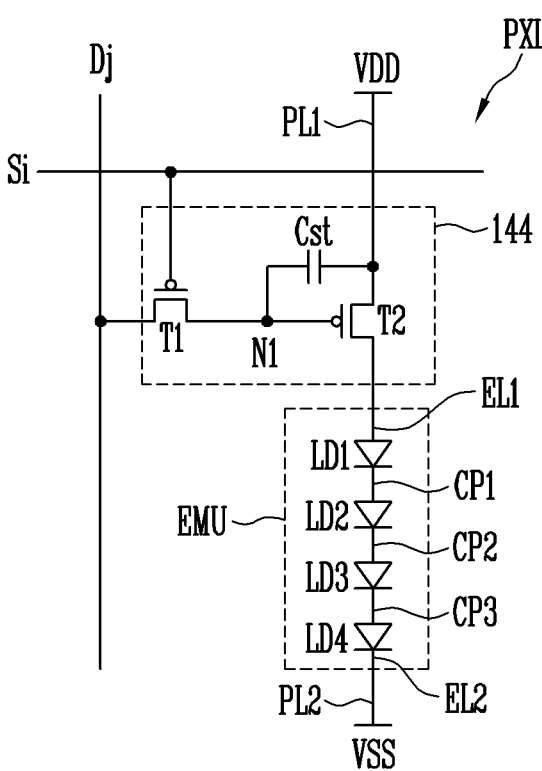
Figure 7B:
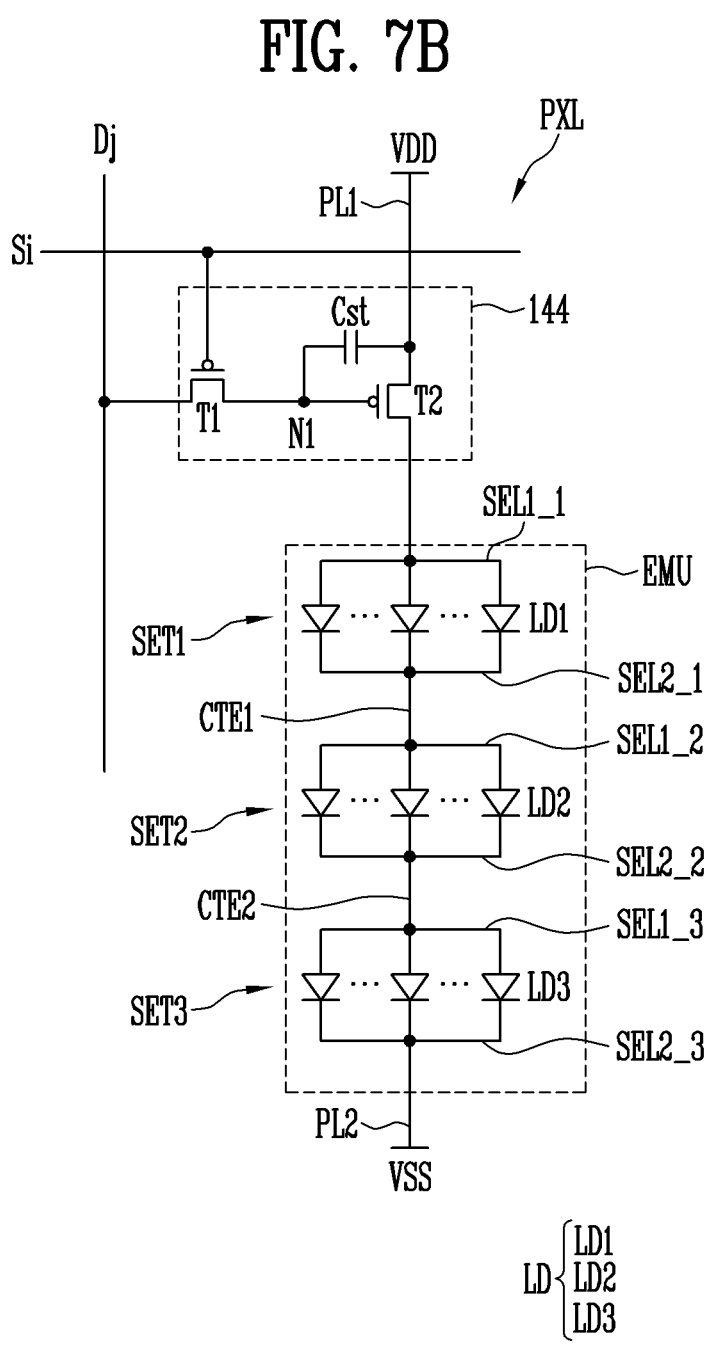
Figure 7C:
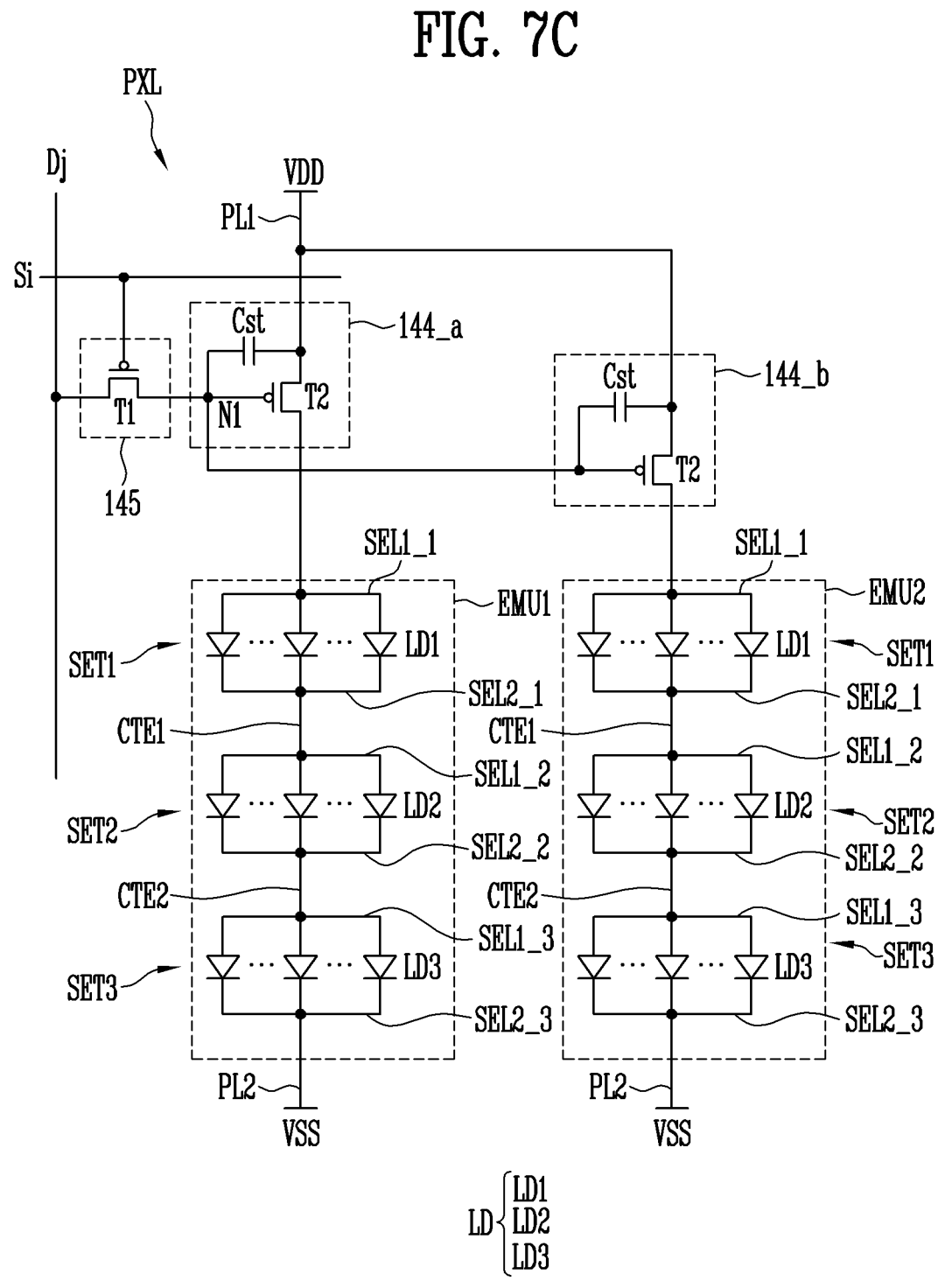

FIGS. 7A to 7C are schematic circuit diagrams illustrating different embodiments of an electrical connection relation-ship of components included in one pixel PXL illustrated in FIG. 5. As illustrated in FIGS. 7A to 7C, the emission unit EMU of each pixel PXL may include serial sets which are successively connected to each other. In the following descriptions of embodiments of FIGS. 7A to 7C, detailed explanations of components similar or equal to that of the embodiments of FIGS. 6A to 6E, for example, detailed explanations of the pixel circuit 144, will be omitted to avoid redundant explanation.

Although FIGS. 7A to 7C illustrate that the i-th scan line Si connected to the pixel circuit 144 intersect the first power line PL1, the i-th scan line Si and the first power line PL1 are insulated and electrically disconnected from each other.

First, referring to FIG. 7A, the emission unit EMU may include light emitting elements connected in series to each other. For example, the emission unit EMU may include a first light emitting element LD1, a second light emitting element LD2, a third light emitting element LD3, and a fourth light emitting element LD4 which are connected in series in a forward direction between the first driving power supply VDD and the second driving power supply VSS and thus form a valid light source. In the following embodiment, the term "light emitting element LD" or "light emitting elements LD" will be used to arbitrarily designate one light emitting element of the first to fourth light emitting elements LD1 to LD4 or collectively designate the first to fourth light emitting elements LD1 to LD4.

A first end (for example, a second semiconductor layer) of the first light emitting element LD1 may be connected to the first driving power supply VDD through the first electrode EL1, and a second end (for example, a first semiconductor layer) of the first light emitting element LD1 may be connected to a first end (for example, a second semicon-ductor layer) of the second light emitting element LD2 through a first conductive pattern CP1 connected between first and second serial sets. The first end of the second light emitting element LD2 may be connected to the first con-ductive pattern CP1, and a second end thereof (for example, a first semiconductor layer) may be connected to a first end (for example, a second semiconductor layer) of the third light emitting element LD3 through a second conductive pattern CP2 connected between second and third serial sets. The first end of the third light emitting element LD3 may be connected to the second conductive pattern CP2, and a second end thereof (for example, a first semiconductor layer) may be connected to a first end (for example, a second semiconductor layer) of the fourth light emitting element LD4 through a third conductive pattern CP3 connected between third and fourth serial sets. The first end of the fourth light emitting element LD4 may be connected to the third conductive pattern CP3, and a second end thereof (for example, a first semiconductor layer) may be connected to the second driving power supply VSS by the second elec-trode EL2.

As described above, the first to fourth light emitting elements LD1 to LD4 may be connected in series between the first and second electrodes EL1 and EL2 of the emission unit EMU.

In the case of the emission unit EMU having a structure in which the light emitting elements LD are connected in series to each other, a voltage to be applied between the first and second electrodes EL1 and EL2 may be increased, and the amount of driving current flowing through the emission unit EMU may be reduced, compared to those of the emission unit EMU having a structure in which the light emitting elements LD are connected in parallel to each other. Therefore, in case that the emission unit EMU of each pixel PXL has a serial structure, the power consumption of the display device may be reduced.

In an embodiment, at least one serial set may be provided in the form of including light emitting elements LD con-nected in parallel to each other. The emission unit EMU of each pixel PXL may be formed of a serial/parallel combi-nation structure. For example, the emission unit EMU may be as illustrated in FIG. 7B.

Referring to FIG. 7B, the emission unit EMU of the pixel PXL may include serial sets which are successively con-nected to each other between the first and second driving power supplies VDD and VSS. Each of the serial sets may include one or more light emitting elements LD which are connected in the forward direction between two sub-elec-trodes of the corresponding serial set.

The emission unit EMU may include first to third serial sets SET1 to SET3 which are successively connected between the first and second driving power supplies VDD and VSS.

The first serial set SET1 may include at least one first light emitting element LD1 connected between a 1-1-th sub-electrode SEL1_1 and a 2-1-th sub-electrode SEL2_1. For example, the first serial set SET1 may include the 1-1-th sub-electrode SEL1_1 connected to the first driving power supply VDD via the pixel circuit 144, the 2-1-th sub-electrode SEL2_1 connected to the second driving power supply VSS, and first light emitting elements LD1 connected between the 1-1-th sub-electrode SEL1_1 and the 2-1-th sub-electrode SEL2_1. A first end (for example, a second semiconductor layer) of each first light emitting element LD1 may be electrically connected to the 1-1-th sub-elec-trode SEL1_1 of the first serial set SET1, and a second end (for example, a first semiconductor layer) thereof may be electrically connected to the 2-1-th sub-electrode SEL2_1 of the first serial set SET1. The first light emitting elements LD1 may be connected in parallel between the 1-1-th and 2-1-th sub-electrodes SEL1_1 and SEL2_1 of the first serial set SET1 and connected in an identical direction (for example, in the forward direction) between the first and second driving power supplies VDD and VSS through the 1-1-th and 2-1-th sub-electrodes SEL1_1 and SEL2_1.

The second serial set SET2 may include at least one second light emitting element LD2 connected between a 1-2-th sub-electrode SEL1_2 and a 2-2-th sub-electrode SEL2_2. For example, the second serial set SET2 may include the 1-2-th sub-electrode SEL1_2 connected to the first driving power supply VDD via the pixel circuit 144 and the first serial set SET1, the 2-2-th sub-electrode SEL2_2 connected to the second driving power supply VSS, and second light emitting elements LD2 connected between the 1-2-th sub-electrode SEL1_2 and the 2-2-th sub-electrode SEL2_2. A first end (for example, a second semiconductor layer) of each second light emitting element LD2 may be electrically connected to the 1-2-th sub-electrode SEL1_2 of the second serial set SET2, and a second end (for example, a first semiconductor layer) thereof may be electrically connected to the 2-2-th sub-electrode SEL2_2 of the second serial set SET2. The second light emitting elements LD2 may be connected in parallel between the 1-2-th and 2-2-th sub-electrodes SEL1_2 and SEL2_2 of the second serial set SET2 and connected in an identical direction (for example, in the forward direction) between the first and second driving power supplies VDD and VSS by the 1-2-th and 2-2-th sub-electrodes SEL1_2 and SEL2_2.

The third serial set SET3 may include at least one third light emitting element LD3 connected between a 1-3-th sub-electrode SEL1_3 and a 2-3-th sub-electrode SEL2_3. For example, the third serial set SET3 may include the 1-3-th sub-electrode SEL1_3 connected to the first driving power supply VDD via the pixel circuit 144 and the previous serial sets, for example, the first and second serial sets SET1 and SET2, the 2-3-th sub-electrode SEL2_3 connected to the second driving power supply VSS, and third light emitting elements LD3 connected between the 1-3-th sub-electrode SEL1_3 and the 2-3-th sub-electrode SEL2_3. A first end (for example, a second semiconductor layer) of each third light emitting element LD3 may be electrically connected to the 1-3-th sub-electrode SEL1_3 of the third serial set SET3, and a second end (for example, a first semiconductor layer) thereof may be electrically connected to the 2-3-th sub-electrode SEL2_3 of the third serial set SET3. The third light emitting elements LD3 may be connected in parallel between the 1-3-th and 2-3-th sub-electrodes SEL1_3 and SEL2_3 of the third serial set SET3 and connected in an identical direction (for example, in the forward direction) between the first and second driving power supplies VDD and VSS through the 1-3-th and 2-3-th sub-electrodes SEL1_3 and SEL2_3.

In the foregoing embodiment, the 1-1-th sub-electrode SEL1_1 of the first serial set SET1 may be an anode electrode of the emission unit EMU of each pixel PXL. The 2-3-th sub-electrode SEL2_3 of the third serial set SET3 may be a cathode electrode of the emission unit EMU.

Furthermore, the emission unit EMU may include intermediate electrodes to electrically connect successive serial sets of the first to third serial sets SET1 to SET3. For example, the emission unit EMU may include a first intermediate electrode CTE1 disposed between the first serial set SET1 and the second serial set SET2, and a second intermediate electrode CTE2 disposed between the second serial set SET2 and the third serial set SET3.

The first serial set SET1 and the second serial set SET2 may be connected to each other by the first intermediate electrode CTE1. For example, the 2-1-th sub-electrode SEL2_1 of the first serial set SET1 may be connected to the first intermediate electrode CTE1, and the 1-2-th sub-electrode SEL1_2 of the second serial set SET2 may be connected to the first intermediate electrode CTE1. The second serial set SET2 and the third serial set SET3 may be connected to each other by the second intermediate electrode CTE2. For example, the 2-2-th sub-electrode SEL2_2 of the second serial set SET2 may be connected to the second intermediate electrode CTE2, and the 1-3-th sub-electrode SEL1_3 of the third serial set SET3 may be connected to the second intermediate electrode CTE2.

As described above, in the case of the emission unit EMU including the light emitting elements LD connected to each other in a serial/parallel combination structure, driving current/voltage conditions may be readily adjusted according to specifications of a product to which the emission unit EMU is applied.

In the emission unit EMU of the pixel PXL including the light emitting elements LD connected to each other in a serial/parallel combination structure, the driving current thereof may be reduced, compared to that of the emission unit EMU including the light emitting elements LD connected in parallel to each other. Furthermore, in the emission unit EMU of the pixel PXL including the light emitting elements LD connected to each other in the serial/parallel combination structure, driving voltages to be applied to the opposite ends of the emission unit EMU may be reduced, compared to that of the emission unit EMU including the light emitting elements LD all connected in series to each other. In case that all of the light emitting elements LD are connected only in series, if at least one of the light emitting elements LD connected in series to each other is not completely oriented in the forward direction, a path along which the driving current is able to flow in the pixel PXL is blocked, whereby a dark spot defect may be caused. On the other hand, in case that the light emitting elements LD are connected to each other in the serial/parallel mixed structure, even if some or a number of light emitting elements LD in each serial set are not correctly connected in the forward direction or defects occur in some or a number of light emitting elements LD, the driving current is allowed to flow through the other light emitting elements LD of the corresponding serial set. Therefore, defects of the pixel PXL may be prevented or reduced.

In an embodiment, each pixel PXL may include of sub-areas. Sub-emission units EMU1 and EMU2 provided in the sub-areas may be grouped to form the emission unit EMU of the pixel PXL. Here, each of the sub-emission units EMU1 and EMU2 may include at least one serial set formed of light emitting elements LD connected in parallel to each other.

Referring to FIG. 7C, the emission unit EMU of the pixel PXL may include first and second sub-emission units EMU1 and EMU2 which are connected between the first and second driving power supplies VDD and VSS. Each of the first and second sub-emission units EMU1 and EMU2 may include first to third serial sets SET1 to SET3 which are successively connected between the first and second driving power supplies VDD and VSS. Each of the first to third serial sets SET1 to SET3 may include one or more light emitting elements LD which are connected in the forward direction between two sub-electrodes of the corresponding serial set.

The pixel PXL may include a first sub-area in which the first sub-emission unit EMU1 is provided, and a second sub-area in which the second sub-emission unit EMU2 is provided.

In the first sub-area, a first pixel circuit 144_a connected to the first sub-emission unit EMU1 may be disposed. In the second sub-area, a second pixel circuit 144_b connected to the second sub-emission unit EMU2 may be disposed. Furthermore, the pixel PXL may include a common circuit 145 connected with the first and second pixel circuits 144_a and 144_b.

The common circuit 145 may store or record a data signal applied from the j-th data line Dj in response to a scan signal provided from the i-th scan line Si, and provide the data signal to the first and second pixel circuits 144_a and 144_b. The common circuit 145 may include a first transistor T1 connected to the i-th scan line Si and the j-th data line Dj. The first transistor T1 is substantially the same as the first transistor T1 (the switching transistor) described with reference to FIG. 6A, and repetitive explanation thereof will thus be omitted.

The first and second pixel circuits 144_a and 144_b may provide driving current corresponding to the data signal stored in the common circuit 145 to respective light emitting elements LD provided in corresponding sub-emission units.

In an embodiment, the first and second pixel circuits 144_a and 144_b each may include a second transistor T2 (the driving transistor) and a storage capacitor Cst which have been described with reference to FIG. 6A. For example, the first pixel circuit 144_a may include the second transistor T2 and the storage capacitor Cst, and supply driving current corresponding to a data signal (for example, a data signal stored in the storage capacitor Cst) to the light emitting elements LD of the first sub-emission unit EMU1. Likewise, the second pixel circuit 144$b$ may include the second transistor T2 and the storage capacitor Cst, and supply driving current corresponding to a data signal (for example, a data signal stored in the storage capacitor Cst) to the light emitting elements LD of the second sub-emission unit EMU2. Here, the second transistor T2 and the storage capacitor Cst are substantially the same as the second transistor T2 and the storage capacitor Cst that have been described with reference to FIG. 6A, and detailed explanation thereof will thus be omitted.

As described above, the first and second pixel circuits 144_$a$ and 144_$b$ may have a same circuit structure, and respectively uniformly provide, to the light emitting elements LD of the corresponding sub-emission units, driving currents transmitted from the common circuit 145 and corresponding to the data signals stored in the related storage capacitors Cst. For example, driving current corresponding to a data signal may be transmitted to the first node N1, and the total driving current is thereafter distributed on the first node N1 to the first and second pixel circuits 144_$a$ and 144_$b$, so that the distributed driving currents are respectively provided to the light emitting elements LD of the first and second sub-emission units EMU1 and EMU2. Here, driving current that flows to the light emitting elements LD of each of the first and second sub-emission unit EMU1 and EMU2 may be controlled by the second transistor T2 of the corresponding one of the first and second pixel circuits 144_$a$ and 144_$b$ regardless of characteristics of each of the light emitting elements LD. Therefore, uniform driving current may be provided to the light emitting elements LD of each of the first and second sub-emission units EMU1 and EMU2.

In other words, since driving current is independently provided to the light emitting elements LD of each of the first and second sub-emission units EMU1 and EMU2, identical or similar driving currents may be respectively provided to the light emitting elements LD even if the light emitting elements LD have a deviation in characteristics (for example, a voltage drop deviation), so that the light emitting elements LD may generally uniformly emit light.

As described above, in case that the first and second sub-emission units EMU1 and EMU2 each including the light emitting elements LD connected in a serial/parallel combination structure form the emission unit EMU of the pixel PXL, the pixel PXL may be prevented from being defective, and the light emitting elements LD provided to the pixel PXL may generally uniformly emit light.

Figure 8:
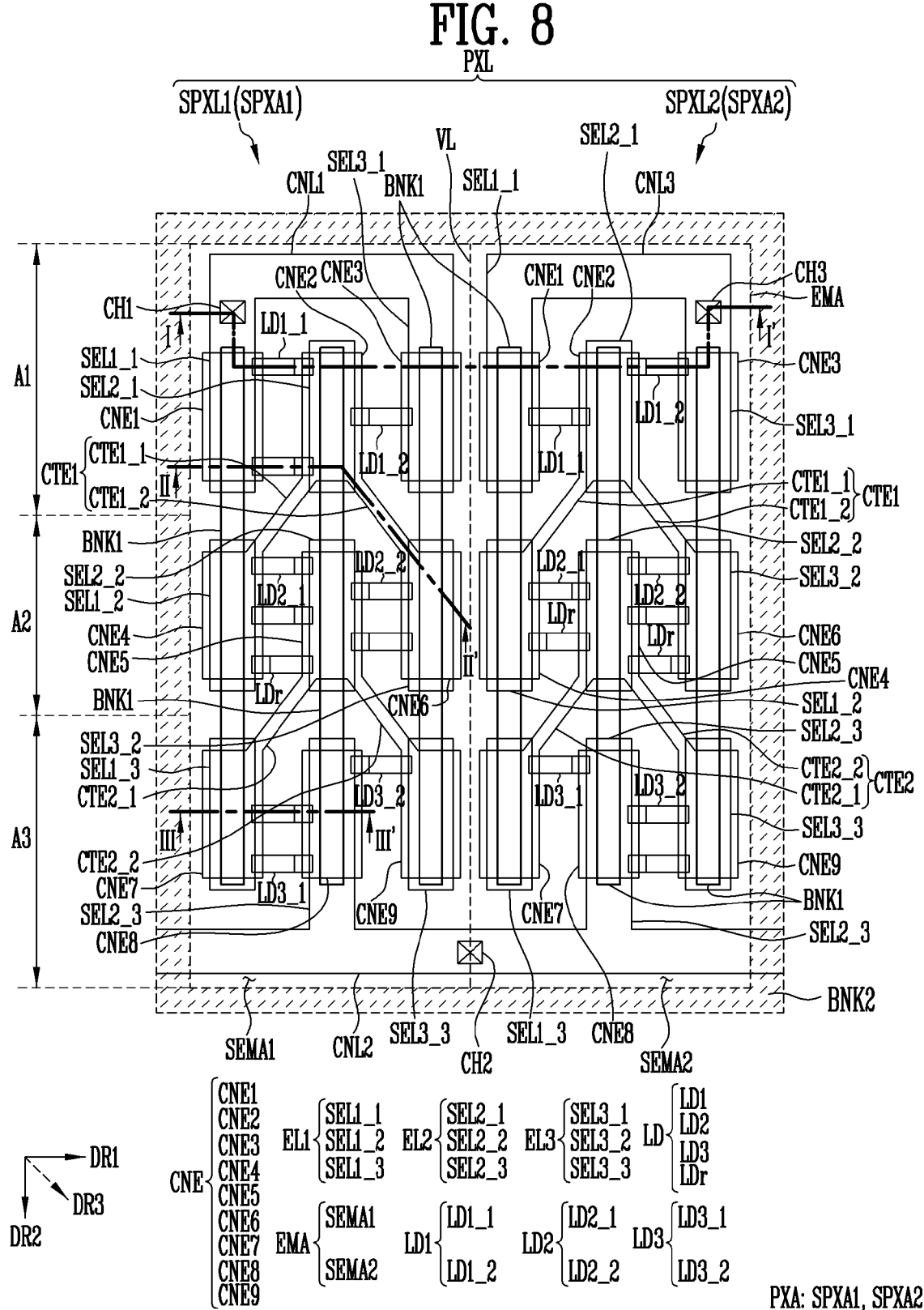
FIG. 8 is a schematic plan view illustrating one pixel of the pixels illustrated in FIG. 5.
Figure 9:
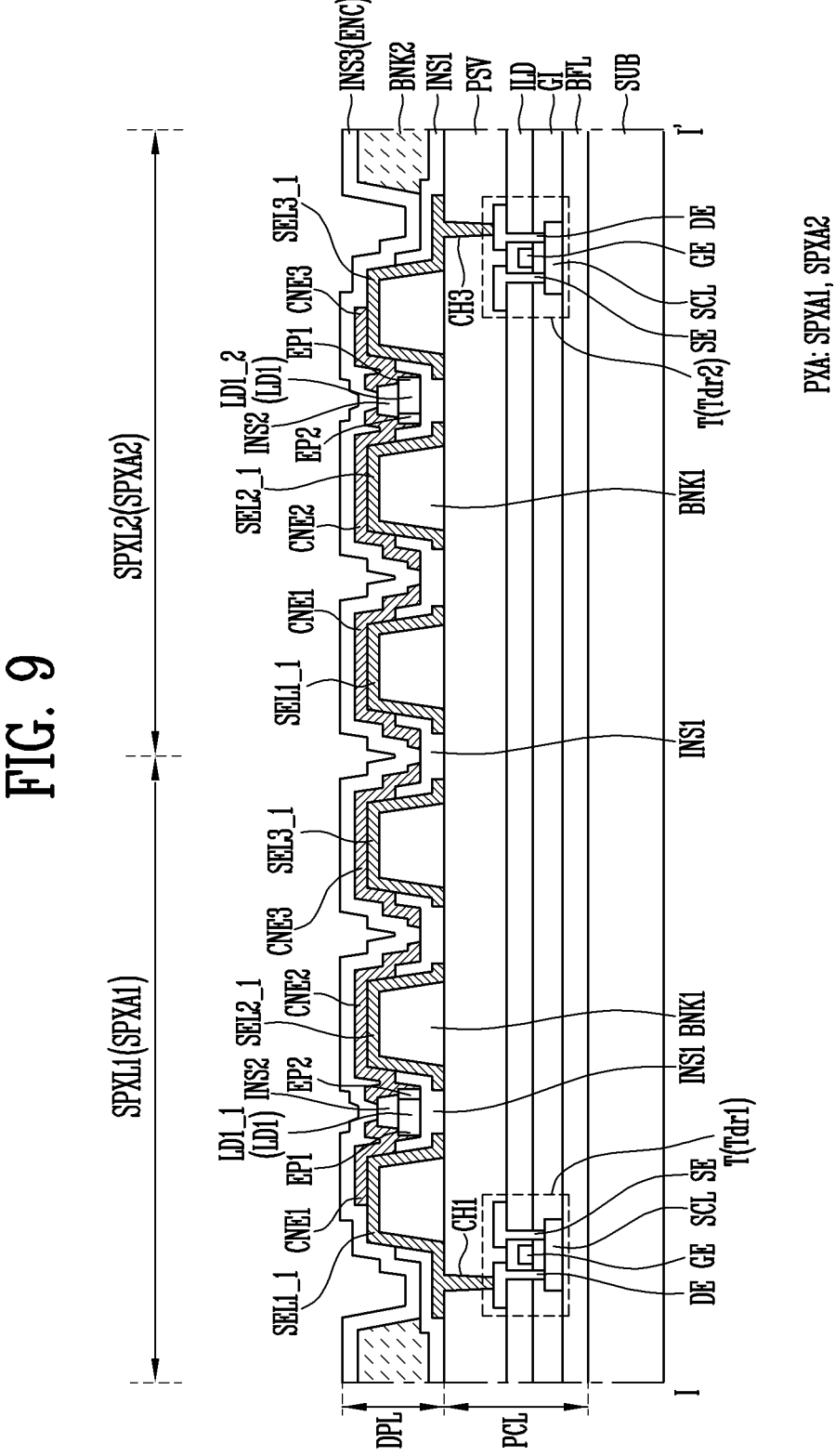
FIG. 9 is a schematic cross-sectional view taken along line I-I' of FIG. 8.
Figure 10:
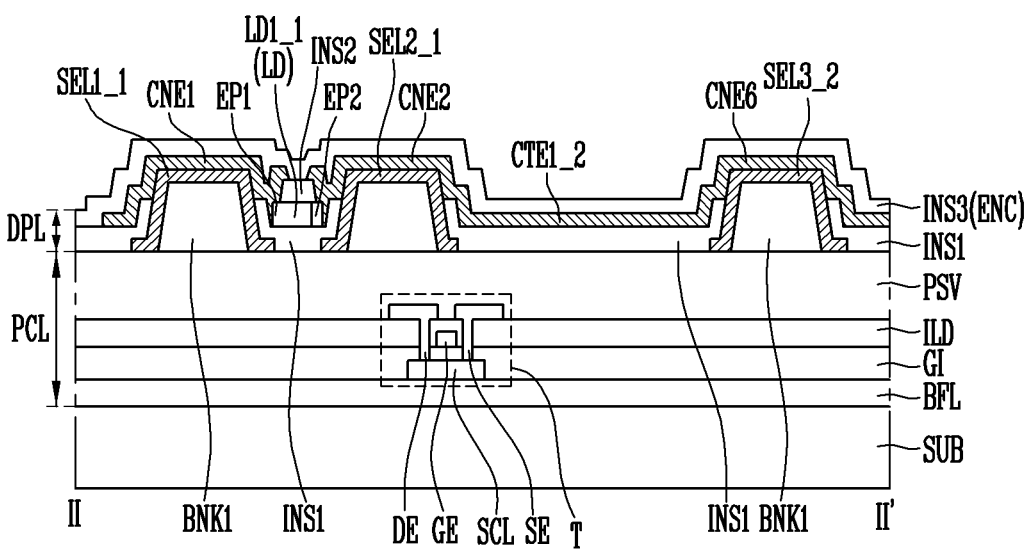
FIG. 10 is a schematic cross-sectional view taken along line II-II' of FIG. 8.
Figure 11:
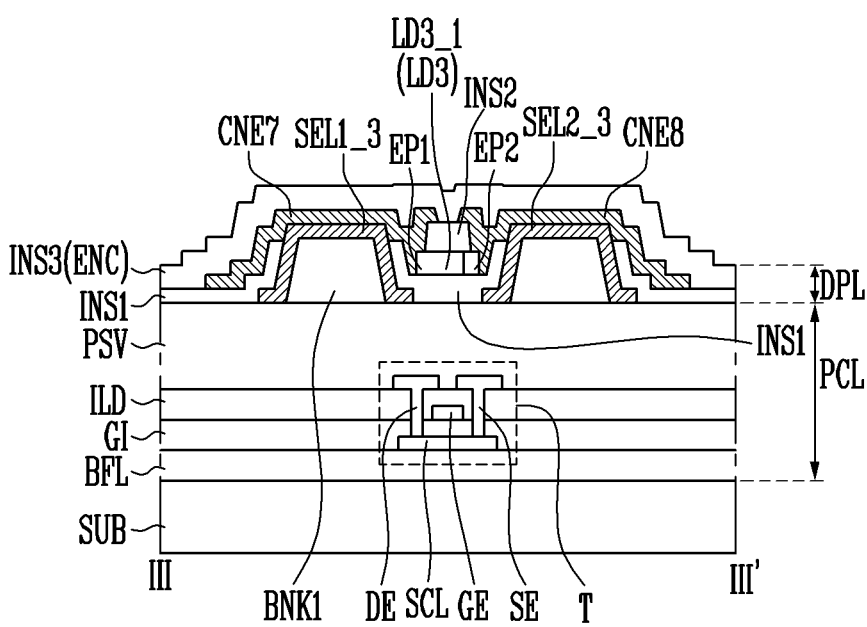
FIG. 11 is a schematic cross-sectional view taken along line III-III' of FIG. 8.
Figure 12:
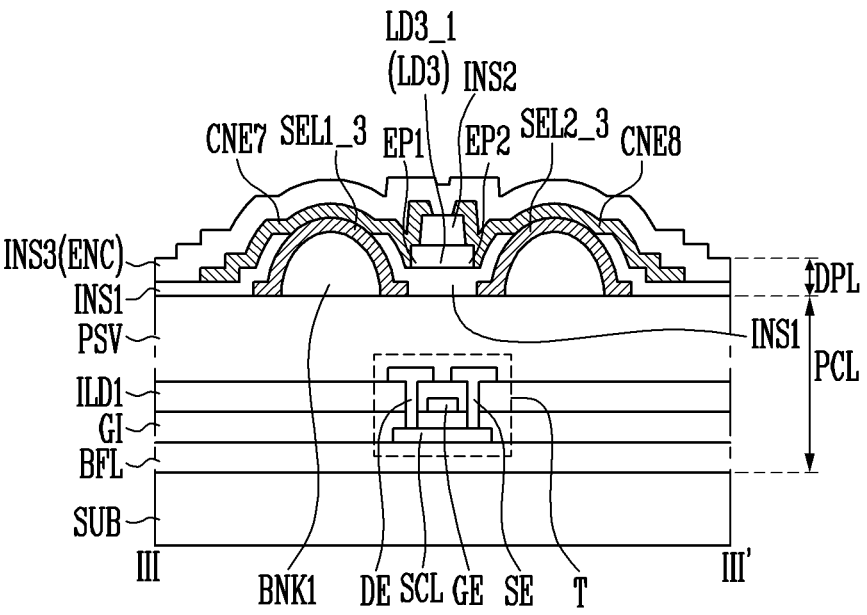
FIG. 12 illustrates an embodiment of a first bank pattern illustrated in FIG. 11, and is a schematic cross-sectional view corresponding to line III-III' of FIG. 8.
Figure 13:
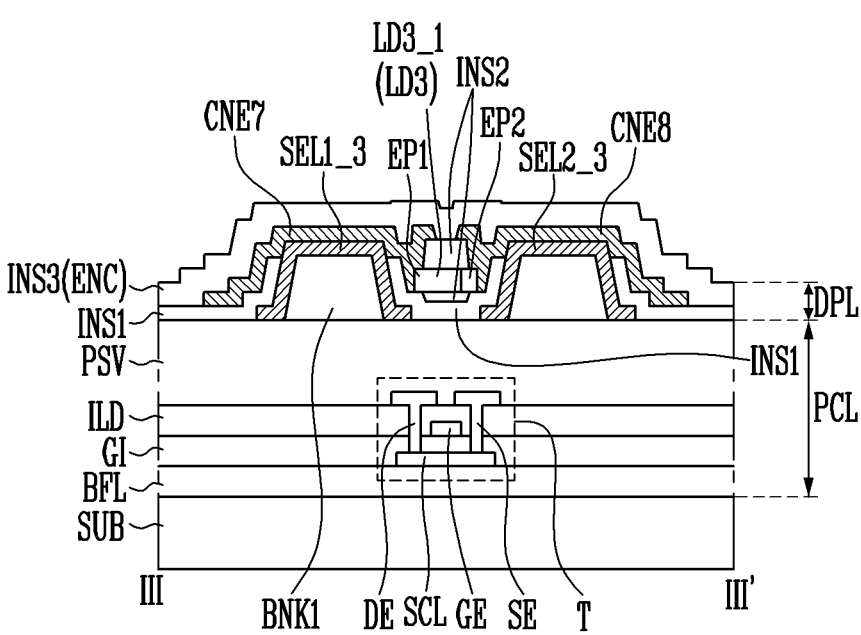
FIG. 13 illustrates an embodiment of a display element layer illustrated in FIG. 11, and is a schematic cross-sectional view corresponding to line III-III' of FIG. 8.

FIG. 8 is a schematic plan view illustrating one pixel of the pixels illustrated in FIG. 5. FIG. 9 is schematic a cross-sectional view taken along line I-I' of FIG. 8. FIG. 10 is a schematic cross-sectional view taken along line II-II' of FIG. 8. FIG. 11 is a schematic cross-sectional view taken along line III-III' of FIG. 8. FIG. 12 illustrates an embodiment of a first bank pattern illustrated in FIG. 11, and is a schematic cross-sectional view corresponding to line III-III' of FIG. 8. FIG. 13 illustrates an embodiment of a display element layer illustrated in FIG. 11, and is a schematic cross-sectional view corresponding to line III-III' of FIG. 8.

The pixel illustrated in FIG. 8 may be any one of the pixels respectively illustrated in FIGS. 6A to 6E, and 7A to 7C. For example, the pixel illustrated in FIG. 8 may be the pixel illustrated in FIG. 7C.

For the sake of explanation, illustration of transistors connected to the light emitting elements and signal lines connected to the transistors is omitted in FIG. 8.

Although FIGS. 8 to 13 illustrate the structure of a pixel PXL, for example, illustrate that each electrode is formed of a single electrode layer and each insulating layer is formed of a single insulating layer, the disclosure is not limited thereto.

In the description of embodiments, "components are provided and/or formed on a same layer" may mean that the components are formed through a same process, and "components are provided and/or formed on different layers may mean that the components are formed through different processes.

Referring to FIGS. 1A to 4B, 5, 7C, and 8 to 13, the display device in accordance with an embodiment may include a substrate SUB, a line component, and at least one pixel PXL.

The substrate SUB may include a transparent insulating material to allow light transmission. The substrate SUB may be a rigid substrate or a flexible substrate.

For example, the rigid substrate SUB may be one of a glass substrate, a quartz substrate, a glass ceramic substrate, and a crystalline glass substrate.

The flexible substrate SUB may be either a film substrate or a plastic substrate which may include an organic polymer material. For example, the flexible substrate SUB may include at least one of the following: polystyrene, polyvinyl alcohol, polymethyl methacrylate, polyethersulfone, poly-acrylate, polyetherimide, polyethylene naphthalate, polyethylene terephthalate, polyphenylene sulfide, polyarylate, polyimide, polycarbonate, triacetate cellulose, and cellulose acetate propionate.

However, materials constituting the substrate SUB may be changed, and include, for example, fiber reinforced plastic (FRP).

Material applied to the substrate SUB may have resistance (thermal resistance) to high treatment temperatures during a process of fabricating the display device. The substrate SUB may include a display area DA including at least one pixel area PXA in which the pixel PXL is disposed, and a non-display area NDA disposed around or adjacent to the display area DA.

In an embodiment, pixels PXL may be arranged in the display area DA in a matrix shape and/or a stripe shape along pixel rows extending in a first direction DR1 and pixel columns extending in a second direction DR2 intersecting the first direction DR1, but the disclosure is not limited thereto. In an embodiment, the pixels PXL may be disposed in the display area DA on the substrate SUB in various arrangement manners.

The pixel area PXA in which each pixel PXL is disposed may include an emission area EMA from which light is emitted, and a peripheral area which encloses a perimeter of the emission area EMA. Here, the term "peripheral area" may include a non-emission area from which no light is emitted.

In an embodiment, each pixel PXL may include first and second sub-pixels SPXL1 and SPXL2.

The first sub-pixel SPXL1 may be provided in a first sub-area SPXA1, and the second sub-pixel SPXL2 may be provided in a second sub-area SPXA2. The first sub-area SPXA1 may include a first sub-emission area SEMA1 which emits light. The second sub-area SPXA2 may include a second sub-emission area SEMA2 which emits light. The first sub-emission area SEMA1 and the second sub-emission area SEMA2 may form the emission area EMA of each pixel PXL. In an embodiment, the peripheral area (or the non-emission area) of each pixel PXL may enclose the first and second sub-emission areas SEMA1 and SEMA2.

The first and second sub-pixels SPXL1 and SPXL2 may be bilaterally symmetrical with respect to a virtual line VL extending in the second direction DR2.

Each of the first and second sub-pixels SPXL1 and SPXL2 may include a substrate SUB, a pixel circuit layer PCL, and a display element layer DPL. For example, the first sub-pixel SPXL1 may include a substrate SUB, a pixel circuit layer PCL having a first pixel circuit 144_a, and a display element layer DPL including light emitting elements LD. The second sub-pixel SPXL2 may include the substrate SUB, a pixel circuit layer PCL having a second pixel circuit 144_b, and a display element layer DPL including light emitting elements LD.

In an embodiment, each pixel PXL including the first and second sub-pixels SPXL1 and SPXL2 may include a common circuit 145. The common circuit 145 may be electrically connected to each of the first and second pixel circuits 144_a and 144_b.

The pixel circuit layer PCL of each of the first and second sub-pixels SPXL1 and SPXL2 may include a buffer layer BFL, a pixel circuit including at least one transistor T and signal lines (not illustrated) connected to the transistor T, and a passivation layer PSV which covers or overlaps the pixel circuit.

The buffer layer BFL may prevent impurities from diffusing into the transistor T. Although the buffer layer BFL may be provided in a single-layer structure, the buffer layer BFL may be provided in a multi-layer structure having at least two or more layers. In case that the buffer layer BFL has a multi-layer structure, the respective layers may be formed of an identical material or different materials. The buffer layer BFL may be omitted depending on the material of the substrate SUB or processing conditions.

The transistor T included in each of the first and second sub-pixels SPXL1 and SPXL2 may include a driving transistor to control the amount of driving current to be supplied to the light emitting elements LD. For example, the first sub-pixel SPXL1 may include a first driving transistor T (Tdr1) to control the amount of driving current to be supplied to the light emitting elements LD provided in the first sub-emission area SEMA1. The second sub-pixel SPXL2 may include a second driving transistor T (Tdr2) to control the amount of driving current to be supplied to the light emitting elements LD provided in the second sub-emission area SEMA2. In an embodiment, the first driving transistor T (Tdr1) may be the second transistor T2 of the first pixel circuit 144_a described with reference to FIG. 7C. The second driving transistor T (Tdr2) may be the second transistor T2 of the second pixel circuit 144_b described with reference to FIG. 7C.

Each of the first driving transistor T (Tdr1) and the second driving transistor T (Tdr2) may include a transistor semiconductor pattern SCL, a gate electrode GE, a first terminal SE, and a second terminal DE. The first terminal SE may be either a source electrode or a drain electrode, and the second terminal DE may be the other electrode. For example, in case that the first terminal SE is a source electrode, the second terminal DE may be a drain electrode.

The transistor semiconductor pattern SCL may be provided and/or formed on the buffer layer BFL. The transistor semiconductor pattern SCL may include a first contact area which contacts the first terminal SE, and a second contact area which contacts the second terminal DE. An area between the first contact area and the second contact area may be a channel area. The transistor semiconductor pattern SCL may be a semiconductor panel formed of polysilicon, amorphous silicon, an oxide semiconductor, etc., within the spirit and the scope of the disclosure. The channel area may be an intrinsic semiconductor, which is an undoped semiconductor pattern. Each of the first contact area and the second area may be a semiconductor pattern doped with impurities.

The gate electrode GE may be provided and/or formed on the transistor semiconductor pattern SCL with a gate insulating layer GI interposed therebetween.

The first terminal SE and the second terminal DE may respectively contact the first contact area and the second contact area of the transistor semiconductor pattern SCL through corresponding contact holes that pass through an interlayer insulating layer ILD and the gate insulating layer GI.

Although in the foregoing embodiment there has been described that the first and second terminals SE and DE of each of the first driving transistor T (Tdr1) and the second driving transistor T (Tdr2) are separate electrodes electrically connected with the transistor semiconductor pattern SCL, the disclosure is not limited thereto. In an embodiment, the first terminal SE of each of the first driving transistor T (Tdr1) and the second driving transistor T (Tdr2) may be one contact area of the first and second contact areas adjacent to the channel area of the corresponding transistor semiconductor pattern SCL. The second terminal DE of each of the first driving transistor T (Tdr1) and the second driving transistor T (Tdr2) may be the other contact area of the first and second contact areas adjacent to the channel area of the corresponding transistor semiconductor pattern SCL. The second terminal DE of each of the first driving transistor T (Tdr1) and the second driving transistor T (Tdr2) may be electrically connected to the light emitting elements LD of the corresponding sub-pixel by a bridge electrode, a contact electrode, or the like within the spirit and the scope of the disclosure. For example, the second terminal DE of the first driving transistor T (Tdr1) may be electrically connected to the light emitting elements LD of the first sub-pixel SPXL1 by a bridge electrode or a contact electrode. Furthermore, the second terminal DE of the second driving transistor T (Tdr2) may be electrically connected to the light emitting elements LD of the second sub-pixel SPXL2 by a bridge electrode or a contact electrode.

In an embodiment, the common circuit 145 included in each pixel PXL may include a switching transistor T1 connected to each of the first driving transistor T (Tdr1) and the second driving transistor T (Tdr2) and to transmit a data signal thereto. The switching transistor T1 included in the common circuit 145 may also include a transistor semiconductor pattern SCL, a gate electrode GE, a first terminal SE, and a second terminal DE, in a same manner as that of the first driving transistor T (Tdr1) and the second driving transistor T (Tdr2). In the following embodiment, the term "transistor T" or "transistors T" will be used to arbitrarily designate at least one transistor of the first driving transistor T (Tdr1), the second driving transistor T (Tdr2), and the switching transistor T1 or collectively designate the first driving transistor T (Tdr1), the second driving transistor T (Tdr2), and the switching transistor T1.

In an embodiment, the transistor T included in the pixel circuit layer PCL of each of the first and second sub-pixels SPXL1 and SPXL2 may be formed of an LTPS thin-film transistor, but the disclosure is not limited thereto. In an embodiment, the transistor T may be formed of an oxide semiconductor thin-film transistor. Furthermore, there has been illustrated the case where the transistor T is a thin-film transistor having a top gate structure, but the disclosure is not limited thereto. In an embodiment, the transistor T may be a thin film transistor having a bottom gate structure.

The passivation layer PSV may be provided and/or formed on the transistor T and signal lines and cover or overlap the transistor T and the signal lines. The passivation layer PSV may be provided in the form of an organic insulating layer, an inorganic insulating layer, or a structure including the organic insulating layer disposed on the inorganic insulating layer. The inorganic insulating layer may include at least one of silicon oxide (SiOx), silicon nitride (SiNx), silicon oxynitride (SiON), and metallic oxide such as AlOx. The organic insulating layer may include an organic insulating material allowing light to pass therethrough. The organic insulating layer may include, for example, at least one of polyacrylates resin, epoxy resin, phenolic resin, polyamides resin, polyimides rein, unsaturated polyesters resin, poly-phenylen ethers resin, polyphenylene sulfides resin, and benzocyclobutene resin.

Hereinbelow, the display element layer DPL will be described.

The display element layer DPL of each of the first and second sub-pixels SPXL1 and SPXL2 may include a first bank pattern BNK1, first to third electrodes EL1 to EL3, a contact electrode CNE, first and second intermediate electrodes CTE1 and CTE2, and light emitting elements LD.

The first bank pattern BNK1 may be a support component which supports each of the first to third electrodes EL1 to EL3 so as to change a surface profile of each of the first to third electrodes EL1 to EL3 so that light emitted from the light emitting elements LD may more effectively travel in an image display direction of the display device.

The first bank pattern BNK1 may be provided and/or formed between the passivation layer PSV and the first to third electrodes EL1 to EL3 in the emission area of each of the first and second sub-pixels SPXL1 and SPXL2. For example, each first bank pattern BNK1 may be provided and/or formed between the passivation layer PSV and the first electrode EL1, between the passivation layer PSV and the second electrode EL2, and between the passivation layer PSV and the third electrode EL3. The first bank pattern BNK1 may include an inorganic insulating layer formed of an inorganic material, or an organic insulating layer formed of an organic material. In an embodiment, the first bank pattern BNK1 may include an organic insulating layer having a single layer structure and/or an inorganic insulating layer having a single layer structure, but the disclosure is not limited thereto. In an embodiment, the first bank pattern BNK1 may be provided in the form of a multi-layer structure formed by stacking at least one organic insulating layer and at least one inorganic insulating layer.

The first bank pattern BNK1 may have a trapezoidal cross-section which is reduced in width from one surface or a surface of the passivation layer PSV upward, but the present disclosure is not limited thereto. In an embodiment, the first bank pattern BNK1 may include a curved surface having a cross-section having a semi-elliptical shape, a semi-circular shape, etc., which is reduced in width upward from one surface or a surface of the passivation layer PSV, as illustrated in FIG. 12. In a cross-sectional view, the shape of the first bank pattern BNK1 is not limited to the foregoing embodiments, and may be changed in various ways within a range in which the efficiency of light emitted from each of the light emitting elements LD may be enhanced. First bank patterns BNK1 adjacent to each other may be disposed on a same plane on the passivation layer PSV and have a same height.

Each pixel PXL may include a second bank pattern BNK2 which encloses at least one side or a side of each of the first and second sub-emission areas SEMA1 and SEMA2. For example, the second bank pattern BNK2 included in each pixel PXL may enclose at least one side or a side of the first sub-emission area SEMA1 of the first sub-pixel SPXL1 and enclose at least one side or a side of the second sub-emission area SEMA2 of the second sub-pixel SPXL2.

The second bank pattern BNK2 may be a structure to define (or divide) the respective emission areas EMA of each pixel PXL and a pixel PXL adjacent thereto and, for example, may be a pixel defining layer. The second bank pattern BNK2 may include at least one light block material and/or reflective material, thus preventing a light leakage defect in which light (or rays) leaks between each pixel PXL and the pixels PXL adjacent thereto. In an embodiment, a reflective material layer may be formed on the second bank pattern BNK2 so as to further enhance the efficiency of light emitted from each pixel PXL. Although the second bank pattern BNK2 may be formed and/or provided on a layer different from that of the first bank pattern BNK1, the disclosure is not limited thereto. In an embodiment, the second bank pattern BNK2 may be formed and/or provided on a same layer as that of the first bank pattern BNK1. In an embodiment, the second bank pattern BNK2 may be formed on a layer different from that of the first bank pattern BNK1 and disposed on a first insulating layer INS1.

The first to third electrodes EL1, EL2, and EL3 included in each of the first and second sub-pixels SPXL1 and SPXL2 may be spaced apart from each other. The second electrode EL2 may be disposed between the first electrode EL1 and the third electrode EL3. In an embodiment, the first electrode EL1 and the second electrode EL2 may be spaced apart from each other by a distance. The second electrode EL2 and the third electrode EL3 may be spaced apart from each other by a distance.

In each of the first and second sub-emission areas SEMA1 and SEMA2, the distance between the first electrode EL1 and the second electrode EL2 may be the same as the distance between the second electrode EL2 and the third electrode EL3. Hence, the light emitting elements LD may be more regularly aligned in the first and second sub-emission areas SEMA1 and SEMA2. However, the disclosure is not limited thereto. In an embodiment, the distance between the first electrode EL1 and the second electrode EL2 may differ from the distance between the second electrode EL2 and the third electrode EL3.

In an embodiment, the third electrode EL3 of the first sub-pixel SPXL1 and the first electrode EL1 of the second sub-pixel SPXL2 may be disposed adjacent to each other and spaced apart from each other by a distance. The distance between the third electrode EL3 of the first sub-pixel SPXL1 and the first electrode EL1 of the second sub-pixel SPXL2 may differ from the distance between two adjacent electrodes in each of the first and second sub-pixels SPXL1 and SPXL2. For example, the distance between the third electrode EL3 of the first sub-pixel SPXL1 and the first electrode EL1 of the second sub-pixel SPXL2 may be less than the distance between the first electrode EL1 and the second electrode EL2 of the first sub-pixel SPXL1.

Each of the first to third electrodes EL1, EL2, and EL3 may be provided and/or formed on the first bank pattern BNK1 and have a surface profile corresponding to the shape of the first bank pattern BNK1. For example, each of the first to third electrodes EL1, EL2, and EL3 may include a protrusion corresponding to the first bank pattern BNK1, and a planar portion corresponding to the passivation layer PSV. The first to third electrodes EL1, EL2, and EL3 may be formed of material having a reflectivity to allow light emitted from each of the light emitting elements LD to travel in an image display direction of the display device.

Each of the first to third electrodes EL1, EL2, and EL3 may be made of conductive material having a reflectivity. The conductive material may include opaque metal that has an advantage in reflecting, in the image display direction of the display device, light emitted from the light emitting elements LD. The opaque metal may include metal, for example, Ag, Mg, Al, Pt, Pd, Au, Ni, Nd, Ir, Cr, Ti, and an alloy thereof. In an embodiment, each of the first to third electrodes EL1, EL2, and EL3 may include a transparent conductive material. The transparent conductive material may include conductive oxide such as indium tin oxide (ITO), indium zinc oxide (IZO), zinc oxide (ZnO), or indium tin zinc oxide (ITZO), or a conductive polymer such as PEDOT. In case that each of the first to third electrodes EL1, EL2, and EL3 may include a transparent conductive material, a separate conductive layer formed of opaque metal for reflecting light emitted from the light emitting elements LD in the image display direction of the display device may be further included. However, the material of each of the first to third electrodes EL1, EL2, and EL3 is not limited to the foregoing materials.

Although each of the first to third electrodes EL1, EL2, and EL3 may be provided and/or formed in a single-layer structure, the disclosure is not limited thereto. In an embodiment, each of the first to third electrodes EL1, EL2, and EL3 may be provided and/or formed in a multi-layer structure formed by stacking at least two materials among metals, alloys, conductive oxides, and conductive polymers. Each of the first to third electrodes EL1, EL2, and EL3 may have a multi-layer structure including at least two layers to minimize distortion resulting from a signal delay in case that signals (or voltages) are transmitted to opposite ends of each of the light emitting elements LD. For example, each of the first to third electrodes EL1, EL2, and EL3 may be formed of a multi-layer structure in which layers are stacked in a sequence of ITO/Ag/ITO.

As described above, since each of the first to third electrodes EL1, EL2, and EL3 have a surface profile corresponding to the shape of the first bank pattern BNK1 disposed therebelow, light emitted from each of the light emitting elements LD may be reflected by each of the first to third electrodes EL1, EL2, and EL3 and more reliably travel in the image display direction of the display device. Consequently, the efficiency of light emitted from each of the light emitting elements LD may be further enhanced.

The first bank pattern BNK1 and the first to third electrodes EL1, EL2, and EL3 each may function as a reflective component to guide light emitted from the light emitting elements LD in a desired direction and thus enhance the optical efficiency of the display device. In other words, the first bank pattern BNK1 and the first to third electrodes EL1, EL2, and EL3 each may function as a reflective component to enable light emitted from the light emitting elements LD to travel in the image display direction of the display device, thus enhancing the light output efficiency of the light emitting elements LD.

In an embodiment, each of the first to third electrodes EL1, EL2, and EL3 included in each of the first and second sub-pixels SPXL1 and SPXL2 may include sub-electrodes disposed in an identical column. For example, the first electrode EL1 may include 1-1-th to 1-3-th sub-electrodes SEL1_1, SEL1_2, and SEL1_3 disposed in an identical column in the second direction DR2 and spaced apart from each other. The second electrode EL2 may include 2-1-th to 2-3-th sub-electrodes SEL2_1, SEL2_2, and SEL2_3 disposed in an identical column in the second direction DR2 and spaced apart from each other. The third electrode EL3 may include 3-1-th to 3-3-th sub-electrodes SEL3_1, SEL3_2, and SEL3_3 disposed in an identical column in the second direction DR2 and spaced apart from each other.

The 1-1-th sub-electrode SEL1_1, the 2-1-th sub-electrode SEL2_1, and the 3-1-th sub-electrode SEL3_1 may be disposed in an identical row in the corresponding sub-emission area of each of the first and second sub-pixels SPXL1 and SPXL2, and spaced apart from each other. For example, the 1-1-th sub-electrode SEL1_1 may be spaced apart from the 2-1-th sub-electrode SEL2_1 by a distance. The 2-1-th sub-electrode SEL2_1 may be spaced apart from the 3-1-th sub-electrode SEL3_1 by a distance.

In an embodiment, the 1-1-th sub-electrode SEL1_1 and the 3-1-th sub-electrode SEL3_1 of the first sub-pixel SPXL1 may be connected to each other by a first connection line CNL1. For example, the first connection line CNL1 may be integral with and electrically and/or physically connected with the 1-1-th sub-electrode SEL1_1 and the 3-1-th sub-electrode SEL3_1. Hence, the first connection line CNL1 may be regarded as one area of the 1-1-th sub-electrode SEL1_1 or one area of the 3-1-th sub-electrode SEL3_1. The 1-1-th sub-electrode SEL1_1, the first connection line CNL1, and the 3-1-th sub-electrode SEL3_1 may be integral with each other and form one independent conductive pattern.

The 1-1-th sub-electrode SEL1_1 and the 3-1-th sub-electrode SEL3_1 of the second sub-pixel SPXL2 may be connected to each other by a third connection line CNL3. The third connection line CNL3 may be integral with and electrically and/or physically connected with the 1-1-th sub-electrode SEL1_1 and the 3-1-th sub-electrode SEL3_1. Hence, the first connection line CNL1 may be regarded as one area of the 1-1-th sub-electrode SEL1_1 or one area of the 3-1-th sub-electrode SEL3_1. The 1-1-th sub-electrode SEL1_1, the third connection line CNL3, and the 3-1-th sub-electrode SEL3_1 may be integral with each other and form one independent conductive pattern.

The 1-2-th sub-electrode SEL1_2, the 2-2-th sub-electrode SEL2_2, and the 3-2-th sub-electrode SEL3_2 may be disposed in an identical row in the corresponding sub-emission area of each of the first and second sub-pixels SPXL1 and SPXL2, and spaced apart from each other. For example, the 1-2-th sub-electrode SEL1_2 may be spaced apart from the 2-2-th sub-electrode SEL2_2 by a distance. The 2-2-th sub-electrode SEL2_2 may be spaced apart from the 3-2-th sub-electrode SEL3_2 by a distance.

The 1-3-th sub-electrode SEL1_3, the 2-3-th sub-electrode SEL2_3, and the 3-3-th sub-electrode SEL3_3 may be disposed in an identical row in the corresponding sub-emission area of each of the first and second sub-pixels SPXL1 and SPXL2, and spaced apart from each other. For example, the 1-3-th sub-electrode SEL1_3 may be spaced apart from the 2-3-th sub-electrode SEL2_3 by a distance. The 2-3-th sub-electrode SEL2_3 may be spaced apart from the 3-3-th sub-electrode SEL3_3 by a distance.

The 2-3-th sub-electrode SEL2_3 of the first sub-pixel SPXL1 and the 2-3-th sub-electrode SEL2_3 of the second sub-pixel SPXL2 may be electrically and/or physically connected to each other by a second connection line CNL2. The second connection line CNL2 may be integrally provided and/or formed with the 2-3-th sub-electrode SEL2_3 of the first sub-pixel SPXL1 and the 2-3-th sub-electrode SEL2_3 of the second sub-pixel SPXL2 and thus connected with the 2-3-th sub-electrode SEL2_3 of each of the first and second sub-pixels SPXL1 and SPXL2. Since the second connection line CNL2 may be integrally provided and/or formed with the 2-3-th sub-electrode SEL2_3 of each of the first and second sub-pixels SPXL1 and SPXL2, the second connection line CNL2 may be one area of the 2-3-th sub-electrode SEL2_3 of each of the first and second sub-pixels SPXL1 and SPXL2. In other words, the second connection line CNL2 may be one area of the 2-3-th sub-electrode SEL2_3 of the first sub-pixel SPXL1, or one area of the 2-3-th sub-electrode SEL2_3 of the second sub-pixel SPXL2.

In an embodiment, the second connection line CNL2 may be provided in common to the first sub-pixel SPXL1 and the second sub-pixel SPXL2, and connected, through the second contact hole CH2, to a driving voltage line (for example, the second power line PL2 of FIG. 7C) to which the second driving power supply VSS is to be applied. The first and third connection lines CNL1 and CNL3 may be provided in only the corresponding sub-pixel. For example, the first connection line CNL1 may be provided in only the first sub-pixel SPXL1. The third connection line CNL3 may be provided in only the second sub-pixel SPXL2.

In an embodiment, the sub-emission area of each of the first and second sub-pixels SPXL1 and SPXL2 in the second direction DR2 may include first to third areas A1 to A3 divided (or spaced apart) from each other in the second direction DR2. Furthermore, the sub-emission area of each of the first and second sub-pixels SPXL1 and SPXL2 may be divided into the first to third areas A1 to A3 depending on locations of the sub-electrodes. For example, the first sub-emission area SEMA1 of the first sub-pixel SPXL1 may be divided into a first area A1 in which the 1-1-th, 2-1-th, and 3-1-th sub-electrodes SEL1_1, SEL2_1, and SEL3_1 are located (or disposed), a second area A2 in which the 1-2-th, 2-2-th, and 3-2-th sub-electrodes SEL1_2, SEL2_2, and SEL3_2 are located, and a third area A3 in which the 1-3-th, 2-3-th, and 3-3-th sub-electrodes SEL1_3, SEL2_3, and SEL3_3 are located. Likewise, the second sub-emission area SEMA2 of the second sub-pixel SPXL2 may be divided into a first area A1 in which the 1-1-th, 2-1-th, and 3-1-th sub-electrodes SEL1_1, SEL2_1, and SEL3_1 are located, a second area A2 in which the 1-2-th, 2-2-th, and 3-2-th sub-electrodes SEL1_2, SEL2_2, and SEL3_2 are located, and a third area A3 in which the 1-3-th, 2-3-th, and 3-3-th sub-electrodes SEL1_3, SEL2_3, and SEL3_3 are located.

In the first area A1 of each of the first and second sub-pixels SPXL1 and SPXL2, the 1-1-th, 2-1-th, and 3-1-th sub-electrodes SEL1_1, SEL2_1, and SEL3_1, along with light emitting elements LD connected in parallel therebetween, may form a first serial set SET1. In the second area A2 of each of the first and second sub-pixels SPXL1 and SPXL2, the 1-2-th, 2-2-th, and 3-2-th sub-electrodes SEL1_2, SEL2_2, and SEL3_2, along with light emitting elements LD connected in parallel therebetween, may form a second serial set SET2. In the third area A3 of each of the first and second sub-pixels SPXL1 and SPXL2, the 1-3-th, 2-3-th, and 3-3-th sub-electrodes SEL1_3, SEL2_3, and SEL3_3, along with light emitting elements LD connected in parallel therebetween, may form a third serial set SET3.

In the sub-emission area of each of the first and second sub-pixels SPXL1 and SPXL2, the first to third serial sets SET1 to SET3 may be disposed. The first to third serial sets SET1 to SET3 may form a sub-emission unit of the corresponding sub-pixel. For example, in the first sub-emission area SEMA1 of the first sub-pixel SPXL1, first to third serial sets SET1 to SET3 may be disposed. The first to third serial sets SET1 to SET3 may form a first sub-emission unit EMU1. In the second sub-emission area SEMA2 of the second sub-pixel SPXL2, first to third serial sets SET1 to SET3 may be disposed. The first to third serial sets SET1 to SET3 may form a second sub-emission unit EMU2. The first sub-emission unit EMU1 and the second sub-emission unit EMU2 may be grouped to form the emission unit EMU of each pixel PXL.

The 1-1-th and 3-1-th sub-electrodes SEL1_1 and SEL3_1 included in the first serial set SET1 of each of the first and second sub-pixels SPXL1 and SPXL2 may correspond to an anode electrode of the sub-emission unit of the corresponding sub-pixel. The 2-3-th sub-electrode SEL2_3 included in the third serial set SET3 may correspond to a cathode electrode of the sub-emission unit of the corresponding sub-pixel. For example, the 1-1-th and 3-1-th sub-electrodes SEL1_1 and SEL3_1 of the first sub-pixel SPXL1 may correspond to an anode electrode of the first sub-emission unit EMU1 of the first sub-pixel SPXL1. The 2-3-th sub-electrode SEL2_3 of the first sub-pixel SPXL1 may correspond to a cathode electrode of the first sub-emission unit EMU1. Furthermore, the 1-1-th and 3-1-th sub-electrodes SEL1_1 and SEL3_1 of the second sub-pixel SPXL2 may correspond to an anode electrode of the second sub-emission unit EMU2 of the second sub-pixel SPXL2. The 2-3-th sub-electrode SEL2_3 of the second sub-pixel SPXL2 may correspond to a cathode electrode of the second sub-emission unit EMU2.

In an embodiment, the 1-1-th and 3-1-th sub-electrodes SEL1_1 and SEL3_1 of the first sub-pixel SPXL1 may be electrically connected, through a first contact hole CH1, to the first pixel circuit 144_a included in the pixel circuit layer PCL of the first sub-pixel SPXL1. For example, the 1-1-th and 3-1-th sub-electrodes SEL1_1 and SEL3_1 of the first sub-pixel SPXL1 may be electrically connected to the first driving transistor T (Tdr1) through the first contact hole CH1.

The 1-1-th and 3-1-th sub-electrodes SEL1_1 and SEL3_1 of the second sub-pixel SPXL2 may be electrically connected, through a third contact hole CH3, to the second pixel circuit 144_b included in the pixel circuit layer PCL of the second sub-pixel SPXL2. For example, the 1-1-th and 3-1-th sub-electrodes SEL1_1 and SEL3_1 of the second sub-pixel SPXL2 may be electrically connected to the second driving transistor T (Tdr2) through the third contact hole CH3.

In the foregoing embodiment, each of the light emitting elements LD may be formed of a light emitting element which is made of material having an inorganic crystal structure and has a subminiature size, for example, ranging from the nanoscale to the microscale. For example, each of the light emitting elements LD may be a subminiature light emitting element fabricated by an etching method, or a subminiature light emitting element fabricated by a growth method. The type, the size, the shape, etc. of the light emitting elements LD may be changed in various ways. Although at least two to several tens of light emitting elements LD may be aligned and/or provided in the emission area EMA of each pixel PXL, the number of light emitting elements LD is not limited thereto. In an embodiment, the number of light emitting elements LD aligned and/or provided in the emission area EMA of each pixel PXL may be changed in various ways.

Although in FIG. 8 there has been described an example in which the respective light emitting elements LD are arranged (or aligned) along the second direction DR2 in a horizontal direction, for example, in the first direction DR1, between adjacent two sub-electrodes in the corresponding serial set, the disclosure is not limited thereto. In an embodiment, at least one of the light emitting elements LD may be arranged and/or connected in a third direction DR3 (for example, a direction inclined to the first direction DR1 or the second direction DR2) or a vertical direction between two adjacent sub-electrodes in the corresponding serial set. Furthermore, in an embodiment, at least one reverse light emitting element LDr connected in a reverse direction between two adjacent sub-electrodes in each serial set may be further disposed, or at least one defective light emitting element, for example, an invalid light source (not illustrated), which is not connected to two adjacent sub-electrodes in each serial set, may be further disposed between the two sub-electrodes.

The light emitting elements LD may be diffused in a solution and supplied into the emission area EMA of each pixel PXL.

In an embodiment, the light emitting elements LD may be supplied to the emission area EMA of each pixel PXL by an inkjet printing method, a slit coating method, or other various methods. For example, the light emitting elements LD may be mixed with a volatile solvent and supplied to the emission area EMA of each pixel PXL by an inkjet printing method or a slit coating method. Here, if the first to third electrodes EL1, EL2, and EL3 disposed in the emission area EMA of each pixel PXL are supplied with corresponding alignment signals (or alignment voltages), an electric field is formed between two adjacent electrodes of the first to third electrodes EL1, EL2, and EL3, so that the light emitting elements LD may be aligned between the two adjacent electrodes. After the light emitting elements LD are aligned, the solvent may be removed by a volatilization method or other methods. In this way, the light emitting elements LD may be provided between the first to third electrodes EL1, EL2, and EL3.

Before the light emitting elements LD are aligned in the emission area EMA of each pixel PXL, the first electrode EL1 and the third electrode EL3 may be electrically and/or physically connected. For example, the first electrode EL1 and the third electrode EL3 may be integrally provided and/or formed and thus electrically and/or physically connected to each other. In case that the first electrode EL1 and the third electrode EL3 are integrally provided and/or formed, the third electrode EL3 may be one area of the first electrode EL1.

After the light emitting elements LD are aligned in the emission area EMA of each pixel PXL, each of the first to third electrodes EL1, EL2, and EL3 may include sub-electrodes disposed in an identical column and spaced apart from each other. For example, the first electrode EL1 may include 1-1-th, 1-2-th, and 1-3-th sub-electrodes SEL1_1, SEL1_2, and SEL1_3 disposed in an identical column and spaced apart from each other by removing or disconnecting a portion of the first electrode EL1 after the light emitting elements LD are aligned. The second electrode EL2 may include 2-1-th, 2-2-th, and 2-3-th sub-electrodes SEL2_1, SEL2_2, and SEL2_3 disposed in an identical column and spaced apart from each other by removing or disconnecting a portion of the second electrode EL2 after the light emitting elements LD are aligned. Likewise, the third electrode EL3 may include 3-1-th, 3-2-th, and 3-3-th sub-electrodes SEL3_1, SEL3_2, and SEL3_3 disposed in an identical column and spaced apart from each other by removing or disconnecting a portion of the third electrode EL3 after the light emitting elements LD are aligned.

In an embodiment, the first connection line CNL1 and the third connection line CNL3 may remain electrically and/or physically connected to each other before the light emitting elements LD are aligned in the emission area EMA of each pixel PXL, and then be electrically and/or physically separated from each other after the light emitting elements LD are aligned. After the light emitting elements LD are aligned in the emission area EMA of each pixel PXL, the first and third connection lines CNL1 and CNL3 may be separated from each other, so that the pixel PXL may be provided in the form of including the first sub-pixel SPXL1 and the second sub-pixel SPXL2. Here, the pixel area PXA in which each pixel PXL is disposed may include the first sub-area SPXA1 in which the first sub-pixel SPXL1 is provided, and the second sub-area SPXA2 in which the second sub-pixel SPXL2 is provided.

As described above, in case that the light emitting elements LD are aligned in the emission area EMA of each pixel PXL, the first to third electrodes EL1, EL2, and EL3 may function as alignment electrodes (or alignment lines) for alignment of the light emitting elements LD. For example, the first and third electrodes EL1 and EL3 may be first alignment electrodes to which an identical first alignment signal (or an identical first alignment voltage) is to be applied. The second electrode EL2 may be a second alignment electrode to which a second alignment signal (or a second alignment voltage) is to be applied. The first alignment signal and the second alignment signal may have different voltage levels. If the first to third electrodes EL1, EL2, and EL3 are supplied with corresponding alignment signals, each electric field may be formed between the first and second electrodes EL1 and EL2 and between the second and third electrodes EL2 and EL3. The light emitting elements LD may be aligned in the emission area EMA of the pixel PXL by the electric fields formed between the first to third electrodes EL1 to EL3.

After the light emitting elements LD are aligned in the emission area EMA of the pixel PXL, each of the first to third electrodes EL1 to EL3 may be provided, by removing a portion thereof, in the form of including three sub-electrodes disposed in an identical column and spaced apart from each other. The sub-electrodes may function as a driving electrode for driving the light emitting elements LD.

Although in the foregoing embodiment there has been described an example where each of the first to third electrodes EL1 to EL3 is provided, by removing a portion thereof after the alignment of the light emitting elements LD, in the form of including three sub-electrodes disposed in an identical column and spaced apart from each other, the disclosure is not limited thereto. In an embodiment, each of the first to third electrodes EL1 to EL3 is provided, by removing a portion thereof after the alignment of the light emitting elements LD, in the form of including two sub-electrodes disposed in an identical column and spaced apart from each other or including four sub-electrodes disposed in an identical column and spaced apart from each other. In case that each of the first to third electrodes EL1 to EL3 may include two sub-electrodes disposed in an identical column and spaced apart from each other, the sub-emission area of each of the first and second sub-pixels SPXL1 and SPXL2 may be divided into two areas depending on respective locations of the two sub-electrodes. In case that each of the first to third electrodes EL1 to EL3 may include four sub-electrodes disposed in an identical column and spaced apart from each other, the sub-emission area of each of the first and second sub-pixels SPXL1 and SPXL2 may be divided into four areas depending on respective locations of the four sub-electrodes.

In an embodiment, at the step of aligning the light emitting elements LD in the emission area EMA of each pixel PXL, the light emitting elements LD to be supplied to the emission area EMA may be controlled to be relatively biased and aligned by controlling alignment signals (or alignment voltages) to be respectively applied to the first to third electrodes EL1, EL2, and EL3 or forming a magnetic field. For example, at the alignment step of the light emitting elements LD, as the waveforms of the alignment signals are adjusted or a magnetic field is formed in the emission area EMA, the number of light emitting elements LD oriented in the forward direction such that one end of the opposite ends EP1 and EP2 of each of the light emitting elements LD is oriented toward the first alignment electrode and the other end thereof is oriented toward the second alignment electrode may be controlled to be greater than the number of reverse light emitting elements LDr oriented in a direction opposite thereto.

Each of the light emitting elements LD may include a light emitting element fabricated by an etching method, or a core-shell light emitting element fabricated by a growth method. In case that each of the light emitting elements LD is a light emitting element fabricated by the etching method, each light emitting element LD may include an emission stack (or a stacked pattern) formed by successively stacking a first semiconductor layer 11, an active layer 12, a second semiconductor layer 13, and an additional electrode 15 in the longitudinal direction L of each light emitting element LD. In case that each of the light emitting elements LD is a light emitting element that has a core-shell structure and is fabricated by the growth method, each light emitting element LD may include an emission pattern 10 having a first semiconductor layer 11 disposed in a central portion of the light emitting element LD, an active layer 12 which encloses at least one side or a side of the first semiconductor layer 11, a second semiconductor layer 13 which encloses at least one side or a side of the active layer 12, and an additional electrode 15 which encloses at least one side or a side of the second semiconductor layer 13.

Each of the light emitting elements LD may include a first end EP1 electrically connected to one sub-electrode of two sub-electrodes adjacent to each other in the first direction DR1, and a second end EP2 electrically connected to the other sub-electrode of the two sub-electrodes. In an embodiment, the first end EP1 of each light emitting element LD may be a second semiconductor layer 13 including a p-type semiconductor layer, and the second end EP2 thereof may be a first semiconductor layer 11 including an n-type semiconductor layer. In other words, in the emission area EMA of the pixel PXL, each light emitting element LD may be connected in the forward direction between two sub-electrodes adjacent to each other in the first direction DR1. As described above, the light emitting elements LD connected in the forward direction between the two adjacent sub-electrodes may form valid light sources of each of the first to third serial sets SET1 to SET3.

The first end EP1 of each of the light emitting elements LD may be connected to or directly connected to one sub-electrode of two sub-electrodes adjacent to each other in the first direction DR1, or may be connected to the one sub-electrode through a contact electrode CNE. Furthermore, the second end EP2 of each of the light emitting elements LD may be connected to or directly connected to the remaining sub-electrode of the two adjacent sub-electrodes, or may be connected to the remaining sub-electrode through a contact electrode CNE.

The light emitting elements LD may be provided and/or formed on the first insulating layer INS1 in the emission area EMA of each pixel PXL.

The first insulating layer INS1 may be formed and/or provided under or below each of the light emitting elements LD aligned (or arranged) between two adjacent sub-electrodes of the sub-electrodes that form each serial set in the emission area EMA of each pixel PXL. The first insulating layer INS1 may be charged into space between each of the light emitting elements LD and the passivation layer PSV to stably support the light emitting elements LD and prevent the light emitting elements LD from being removed from the passivation layer PSV.

Furthermore, in the emission area EMA of each pixel PXL, the first insulating layer INS1 may expose one area of each of the sub-electrodes that form each serial set, and cover or overlap the other area other than the one area. Here, the contact electrode CNE may be provided and/or formed in one area of each of the exposed sub-electrodes, so that each of the sub-electrodes and the contact electrode CNE may be electrically and/or physically connected to each other.

The first insulating layer INS1 may be formed of an inorganic insulating layer including an inorganic material, or an organic insulating layer including an organic material. Although in an embodiment the first insulating layer INS1 may be formed of an inorganic insulating layer having an advantage in protecting the light emitting elements LD from the pixel circuit layer PCL of each of the first and second sub-pixels PXL1 and PXL2, the disclosure is not limited thereto. In an embodiment, the first insulating layer INS1 may be formed of an organic insulating layer that has an advantage in planarization of support surfaces of the light emitting elements LD.

A second insulating layer INS2 may be provided and/or formed on the light emitting elements LD. The second insulating layer INS2 may be provided and/or formed on each of the light emitting elements LD to cover or overlap a portion of an upper surface of each of the light emitting elements LD, and expose the opposite ends EP1 and EP2 of each of the light emitting elements LD to the outside. The second insulating layer INS2 may be formed in an independent pattern in the emission area EMA of each pixel PXL, but the disclosure is not limited thereto.

The second insulating layer INS2 may have a single-layer structure or a multi-layer structure, and include an inorganic insulating layer including at least one inorganic material or an organic insulating layer including at least one organic material. The second insulating layer INS2 may fix each of the light emitting elements LD aligned in the emission area EMA of each pixel PXL. In an embodiment, the second insulating layer INS2 may include an inorganic insulating layer that has an advantage in protecting the active layer 12 of each of the light emitting elements LD from external oxygen, water, etc., within the spirit and the scope of the disclosure. However, the disclosure is not limited thereto. The second insulating layer INS2 may be formed of an organic insulating layer including an organic material, depending on design conditions of the display device to which the light emitting elements LD are applied.

In an embodiment, after the alignment of the light emitting elements LD in the emission area EMA of each pixel PXL has been completed, the second insulating layer INS2 is formed on the light emitting elements LD so that the light emitting elements LD may be prevented from being removed from the aligned position. As illustrated in FIG. 13, in case that a gap (or space) is present between the first insulating layer INS1 and the light emitting elements LD before the formation of the second insulating layer INS2, the gap may be filled with the second insulating layer INS2 during a process of forming the second insulating layer INS2. Consequently, the light emitting elements LD may be more stably supported. Hence, the second insulating layer INS2 may be formed of an organic insulating layer that has an advantage in filling the gap between the first insulating layer INS1 and the light emitting elements LD with the second insulating layer INS2.

In an embodiment, the second insulating layer INS2 may be formed on each of the light emitting elements LD so that the active layer 12 of each of the light emitting elements LD may be prevented from contacting external conductive material. The second insulating layer INS2 may cover or overlap only a portion of the surface of each of the light emitting elements LD such that the opposite ends EP1 and EP2 of each of the light emitting elements LD may be exposed to the outside.

The light emitting elements LD of each of the first and second sub-pixels SPXL1 and SPXL2 may include at least one first light emitting element LD1 included in the first serial set SET1, at least one second light emitting element LD2 included in the second serial set SET2, and at least one third light emitting elements LD3 included in the third serial set SET3.

The first light emitting elements LD1 may include 1-1-th light emitting elements LD1_1 connected in the forward direction between the 1-1-th sub-electrode SEL1_1 and the 2-1-th sub-electrode SEL2_1, and 1-2-th light emitting elements LD1_2 connected in the forward direction between the 3-1-th sub-electrode SEL3_1 and the 2-1-th sub-electrode SEL2_1.

The second light emitting elements LD2 may include 2-1-th light emitting elements LD2_1 connected in the forward direction between the 1-2-th sub-electrode SEL1_2 and the 2-2-th sub-electrode SEL2_2, and 2-2-th light emitting elements LD2_2 connected in the forward direction between the 3-2-th sub-electrode SEL3_2 and the 2-2-th sub-electrode SEL2_2.

The third light emitting elements LD3 may include 3-1-th light emitting elements LD3_1 connected in the forward direction between the 1-3-th sub-electrode SEL1_3 and the 2-3-th sub-electrode SEL2_3, and 3-2-th light emitting elements LD3_2 connected in the forward direction between the 3-3-th sub-electrode SEL3_3 and the 2-3-th sub-electrode SEL2_3.

In an embodiment, the light emitting elements LD aligned (or arranged) in the sub-emission area of each of the first and second sub-pixels SPXL1 and SPXL2 may include at least one reverse light emitting element LDr connected between two adjacent sub-electrodes in a direction (for example, a reverse direction) opposite to the forward direction.

Contact electrodes CNE may be respectively disposed on the 1-1-th to 1-3-th sub-electrodes SEL1_1, SEL1_2, and SEL1_3, the 2-1-th to 2-3-th sub-electrodes SEL2_1, SEL2_2, and SEL2_3, and the 3-1-th to 3-3-th sub-electrodes SEL3_1, SEL3_2, and SEL3_3.

The contact electrodes CNE may be formed of various transparent conductive materials. For example, each contact electrode CNE may include at least one of various conductive materials, for example, ITO, IZO, and ITZO, and may be substantially transparent or semi-transparent to satisfy a transmittancy. However, the material of the contact electrode CNE is not limited to those of the foregoing embodiments. In an embodiment, the contact electrode CNE may be formed of various opaque conductive materials.

In an embodiment, the contact electrodes CNE may include first to ninth contact electrodes CNE1 to CNE9.

The first contact electrode CNE1 may be provided on the 1-1-th sub-electrode SEL1_1, and connect the 1-1-th sub-electrode SEL1_1 with one end of the opposite ends EP1 and EP2 of each of the 1-1-th light emitting elements LD1_1. In a plan view, the first contact electrode CNE1 may overlap one end or an end of each of the 1-1-th light emitting elements LD1_1 and the 1-1-th sub-electrode SEL1_1.

The second contact electrode CNE2 may be provided on the 2-1-th sub-electrode SEL2_1, and connect one side or a side of the 2-1-th sub-electrode SEL2_1 with a remaining end of the opposite ends EP1 and EP2 of each of the 1-1-th light emitting elements LD1_1. Furthermore, the second contact electrode CNE2 may connect another side of the 2-1-th sub-electrode SEL2_1 with one end of the opposite ends EP1 and EP2 of each of the 1-2-th light emitting elements LD1_2. In a plan view, the second contact electrode CNE2 may overlap the remaining end of each of the 1-1-th light emitting elements LD1_1, overlap the 2-1-th sub-electrode SEL2_1, and overlap one end or an end of each of the 1-2-th light emitting elements LD1_2.

The third contact electrode CNE3 may be provided on the 3-1-th sub-electrode SEL3_1, and connect the 3-1-th sub-electrode SEL3_1 with a remaining end of the opposite ends EP1 and EP2 of each of the 1-2-th light emitting elements LD1_2. In a plan view, the third contact electrode CNE3 may overlap the remaining end of each of the 1-2-th light emitting elements LD1_2 and the 3-1-th sub-electrode SEL3_1.

The first contact electrode CNE1, the second contact electrode CNE2, and the third contact electrode CNE3 may be provided in the first area A1 in which the first serial set SET1 of each of the first and second sub-pixels SPXL1 and SPXL2 is located.

The fourth contact electrode CNE4 may be provided on the 1-2-th sub-electrode SEL1_2, and connect the 1-2-th sub-electrode SEL1_2 with one end of the opposite ends EP1 and EP2 of each of the 2-1-th light emitting elements LD2_1. In a plan view, the fourth contact electrode CNE4 may overlap the one end or an end of each 2-1-th light emitting element LD2_1 and the 1-2-th sub-electrode SEL1_2.

The fifth contact electrode CNE5 may be provided on the 2-2-th sub-electrode SEL2_2, and connect one side or a side of the 2-2-th sub-electrode SEL2_2 with a remaining end of the opposite ends EP1 and EP2 of each 2-1-th light emitting element LD2_1. Furthermore, the fifth contact electrode CNE5 may connect another side of the 2-2-th sub-electrode SEL2_2 with one end of the opposite ends EP1 and EP2 of each 2-2-th light emitting element LD2_2. In a plan view, the fifth contact electrode CNE5 may overlap the remaining end of each of the 2-1-th light emitting elements LD2_1, the 2-2-th sub-electrode SEL2_2, and the one end of each 2-2-th light emitting element LD2_2.

The sixth contact electrode CNE6 may be provided on the 3-2-th sub-electrode SEL3_2, and connect the 3-2-th sub-electrode SEL3_2 with a remaining end of the opposite ends EP1 and EP2 of each 2-2-th light emitting element LD2_2. In a plan view, the sixth contact electrode CNE6 may overlap the remaining end of each 2-2-th light emitting elements LD2_2 and the 3-2-th sub-electrode SEL3_2.

The fourth contact electrode CNE4, the fifth contact electrode CNE5, and the sixth contact electrode CNE6 may be provided in the second area A2 in which the second serial set SET2 of each of the first and second sub-pixels SPXL1 and SPXL2 is located.

The second contact electrode CNE2 disposed in the first serial set SET1 may be electrically and/or physically connected, by the first intermediate electrode CTE1, with the fourth contact electrode CNE4 and the sixth contact electrode CNE6 that are disposed in the second serial set SET2.

The first intermediate electrode CTE1 of each of the first and second sub-pixels SPXL1 and SPXL2 may be located in a boundary between the first area A1 in which the first serial set SET1 is located and the second area A2 in which the second serial set SET2 is located, in a plan view. The first intermediate electrode CTE1 may include a 1-1-th intermediate electrode CTE1_1 to connect the second contact electrode CNE2 with the fourth contact electrode CNE4, and a 1-2-th intermediate electrode CTE1_2 to connect the second contact electrode CNE2 with the sixth contact electrode CNE6.

The 1-1-th intermediate electrode CTE1_1 may extend in an area between the first area A1 and the second area A2 in a direction, for example, a direction perpendicular to the third direction DR3, inclined to the first direction DR1 or the second direction DR2, and electrically and/or physically connect the second contact electrode CNE2 of the first area A1 with the fourth contact electrode CNE4 of the second area A2. Hence, the 1-1-th intermediate electrode CTE1_1 may function as a connection electrode (or a bridge electrode) to connect the second contact electrode CNE2 of the first area A1 with the fourth contact electrode CNE4 of the second area A2.

Furthermore, the 1-2-th intermediate electrode CTE1_2 may extend in the third direction DR3 in an area between the first area A1 and the second area A2, and electrically and/or physically connect the second contact electrode CNE2 of the first area A1 with the sixth contact electrode CNE6 of the second area A2. Hence, the 1-2-th intermediate electrode CTE1_2 may function as a connection electrode (or a bridge electrode) to connect the second contact electrode CNE2 of the first area A1 with the sixth contact electrode CNE6 of the second area A2.

The first intermediate electrode CTE1 may be provided on a same layer as that of the contact electrode CNE on each of the sub-electrodes, and include a same material or a similar material as that and be formed through a same process as that of the contact electrode CNE.

In an embodiment, the 1-1-th intermediate electrode CTE1_1 may be formed integrally with the second contact electrode CNE2 and/or the fourth contact electrode CNE4. In case that the 1-1-th intermediate electrode CTE1_1 is formed integrally with the second contact electrode CNE2 and/or the fourth contact electrode CNE4, the 1-1-th intermediate electrode CTE1_1 may be regarded as one area of the second contact electrode CNE2 and/or one area of the fourth contact electrode CNE4. The 1-2-th intermediate electrode CTE1_2 may be formed integrally with the second contact electrode CNE2 and/or the sixth contact electrode CNE6. In case that the 1-2-th intermediate electrode CTE1_2 is formed integrally with the second contact electrode CNE2 and/or the sixth contact electrode CNE6, the 1-2-th intermediate electrode CTE1_2 may be regarded as one area of the second contact electrode CNE2 and/or one area of the sixth contact electrode CNE6. The 1-2-th intermediate electrode CTE1_2 may be formed integrally with the 1-1-th intermediate electrode CTE1_1.

As described above, the first intermediate electrode CTE1, the second contact electrode CNE2, the fourth contact electrode CNE4, and the sixth contact electrode CNE6 may be integrally formed and thus electrically and/or physically connected to each other. Hence, the first serial set SET1 and the second serial set SET2 of each of the first and second sub-pixels SPXL1 and SPXL2 may be electrically and/or physically connected to each other.

The seventh contact electrode CNE7 may be provided on the 1-3-th sub-electrode SEL1_3, and connect the 1-3-th sub-electrode SEL1_3 with one end of the opposite ends EP1 and EP2 of each 3-1-th light emitting element LD3_1. In a plan view, the seventh contact electrode CNE7 may overlap the one end of each 3-1-th light emitting element LD3_1 and the 1-3-th sub-electrode SEL1_3.

The eighth contact electrode CNE8 may be provided on the 2-3-th sub-electrode SEL2_3, and connect one side or a side of the 2-3-th sub-electrode SEL2_3 with a remaining end of the opposite ends EP1 and EP2 of each 3-1-th light emitting element LD3_1. Furthermore, the eighth contact electrode CNE8 may connect another side of the 2-3-th sub-electrode SEL2_3 with one end of the opposite ends EP1 and EP2 of each 3-2-th light emitting element LD3_2. In a plan view, the eighth contact electrode CNE8 may overlap the remaining end of each 3-1-th light emitting elements LD3_1, the one end of each 3-2-th light emitting element LD3_2, and the 2-3-th sub-electrode SEL2_3.

The ninth contact electrode CNE9 may be provided on the 3-3-th sub-electrode SEL3_3, and connect one side or a side of the 3-3-th sub-electrode SEL3_3 with a remaining end of the opposite ends EP1 and EP2 of each 3-2-th light emitting element LD3_2. In a plan view, the ninth contact electrode CNE9 may overlap the remaining end of each 3-2-th light emitting element LD3_2 and the 3-3-th sub-electrode SEL3_3.

The seventh contact electrode CNE7, the eighth contact electrode CNE8, and the ninth contact electrode CNE9 may be provided in the third area A3 in which the third serial set SET3 of each of the first and second sub-pixels SPXL1 and SPXL2 is located.

The fifth contact electrode CNE5 disposed in the second serial set SET2 may be electrically and/or physically connected, by the second intermediate electrode CTE2, with the seventh contact electrode CNE7 and the ninth contact electrode CNE9 that are disposed in the third serial set SET3.

The second intermediate electrode CTE2 may be provided on a same layer as that of the contact electrode CNE on each of the sub-electrodes, and include a same material or a similar material as that and be formed through a same process as that of the contact electrode CNE.

The second intermediate electrode CTE2 of each of the first and second sub-pixels SPXL1 and SPXL2 may be located in a boundary area between the second area A2 in which the second serial set SET2 is located and the third area A3 in which the third serial set SET3 is located. The second intermediate electrode CTE2 may include a 2-1-th intermediate electrode CTE2_1 to connect the fifth contact electrode CNE5 with the seventh contact electrode CNE7, and a 2-2-th intermediate electrode CTE2_2 to connect the fifth contact electrode CNE5 with the ninth contact electrode CNE9.

The 2-1-th intermediate electrode CTE2_1 may extend in a direction perpendicular to the third direction DR3 in the area between the second area A2 and the third area A3, and electrically and/or physically connect the fifth contact electrode CNE5 of the second area A2 with the seventh contact electrode CNE7 of the third area A3. Hence, the 2-1-th intermediate electrode CTE2_1 may function as a connection electrode (or a bridge electrode) configured to connect the fifth contact electrode CNE5 of the second area A2 with the seventh contact electrode CNE7 of the third area A3.

The 2-2-th intermediate electrode CTE2_2 may extend in the third direction DR3 in the area between the second area A2 and the third area A3, and electrically and/or physically connect the fifth contact electrode CNE5 of the second area A2 with the ninth contact electrode CNE9 of the third area A3. Hence, the 2-2-th intermediate electrode CTE2_2 may function as a connection electrode (or a bridge electrode) to connect the fifth contact electrode CNE5 of the second area A2 with the ninth contact electrode CNE9 of the third area A3.

The 2-1-th intermediate electrode CTE2_1 may be formed integrally with the fifth contact electrode CNE5 and/or the seventh contact electrode CNE7. In case that the 2-1-th intermediate electrode CTE2_1 is formed integrally with the fifth contact electrode CNE5 and/or the seventh contact electrode CNE7, the 2-1-th intermediate electrode CTE2_1 may be regarded as one area of the fifth contact electrode CNE5 and/or one area of the seventh contact electrode CNE7. The 2-2-th intermediate electrode CTE2_2 may be formed integrally with the fifth contact electrode CNE5 and/or the ninth contact electrode CNE9. In case that the 2-2-th intermediate electrode CTE2_2 is formed integrally with the fifth contact electrode CNE5 and/or the ninth contact electrode CNE9, the 2-2-th intermediate electrode CTE2_2 may be regarded as one area of the fifth contact electrode CNE5 and/or one area of the ninth contact electrode CNE9.

As described above, the second intermediate electrode CTE2, the fifth contact electrode CNE5, the seventh contact electrode CNE7, and the ninth contact electrode CNE9 may be integrally formed and thus electrically and/or physically connected to each other. Hence, the second serial set SET2 and the third serial set SET3 of each of the first and second sub-pixels SPXL1 and SPXL2 may be electrically and/or physically connected to each other.

In an embodiment, at the step of forming the second contact electrode CNE2 of the first serial set SET1 and the fourth and sixth contact electrodes CNE4 and CNE6 of the second serial set SET2, the first intermediate electrode CTE1 to connect the first light emitting elements LD1 of the first serial set SET1 in series with the second light emitting elements LD2 of the second serial set SET2 may be simultaneously formed. Furthermore, at the step of forming the fifth contact electrode CNE5 of the second serial set SET2 and the seventh and ninth contact electrodes CNE7 and CNE9 of the third serial set SET3, the second intermediate electrode CTE2 to connect the second light emitting elements LD2 of the second serial set SET2 in series with the third light emitting elements LD3 of the third serial set SET3 may be simultaneously formed. Hence, a process of fabricating each pixel PXL including the first and second sub-pixels SPXL1 and SPXL2 and a display device including the pixel PXL may be facilitated, so that the product yield may be enhanced.

Each of the first to ninth contact electrodes CNE1 to CNE9 may have a bar shape extending in the second direction DR2, but the disclosure is not limited thereto, and for example, it may be changed in various shapes so long as it may reliably electrically and/or physically connect one sub-electrode disposed thereunder with one of the opposite ends EP1 and EP2 of each of the light emitting elements LD.

A third insulating layer INS3 (ENC) may be provided and/or formed on the first to ninth contact electrodes CNE1 to CNE9. The third insulating layer INS3 (ENC) may be an encapsulation layer to cover or overlap the pixel circuit layer PCL and the display element layer DPL that are provided in each pixel PXL. The third insulating layer INS3 (ENC) may be an inorganic insulating layer including an inorganic material or an organic insulating layer including an organic material. For example, the third insulating layer INS3 (ENC) may have a structure formed by alternately stacking at least one inorganic layer and at least one organic layer each other.

According to the foregoing embodiment, the emission area EMA of each pixel PXL may be divided into the first sub-emission area SEMA1 and the second sub-emission area SEMA2 in the first direction DR1. The pixel circuit layer PCL including the pixel circuit provided with the driving transistor and the display element layer DPL including the light emitting elements LD may be formed in each of the first and second sub-emission areas SEMA1 and SEMA2. Furthermore, each of the first and second sub-emission area SEMA1 and SEMA2 is divided into the first to third areas A1, A2, and A3 in the second direction DR2. In each of the first to third areas A1, A2, and A3, at least two light emitting elements LD connected in parallel to each other between the sub-electrodes may be provided. Furthermore, the first intermediate electrode CTE1 and/or the second intermediate electrode CTE2 disposed (or provided) in boundaries between the first to third areas A1, A2, and A3 may connect one contact electrode CNE of a preceding area of two successive areas with at least one contact electrode CNE of a subsequent area. In this way, the light emitting elements LD provided (or supplied) to the first and second sub-emission areas SEMA1 and SEMA2 may be connected in a serial/parallel combination structure and thus form the sub-emission unit of each of the first and second sub-emission areas SEMA1 and SEMA2. The first sub-emission unit EMU1 of the first sub-emission area SEMA1 and the second sub-emission unit EMU2 of the second sub-emission area SEMA2 may be grouped to form the emission unit EMU of one pixel PXL.

In accordance with the foregoing embodiment, the first and second sub-emission units EMU1 and EMU2 each having a serial/parallel combination structure may be provided, so that each of the first and second sub-pixels SPXL1 and SPXL2 may be reliably driven, and driving current to be supplied to the panel of the display device may be reduced. Hence, the power consumption efficiency may be improved. Furthermore, driving current may be supplied to the light emitting elements LD of the first sub-pixel SPXL1 through the first driving transistor T (Tdr1) included in the first pixel circuit 144a, and driving current may be supplied to the light emitting elements LD of the second sub-pixel SPXL2 through the second driving transistor T (Tdr2) included in the second pixel circuit 144b. Hence, the driving currents may be independently respectively supplied to the light emitting elements LD of the first and second sub-emission units EMU1 and EMU2. Hence, driving currents equal or similar to each other may be respectively supplied to the light emitting elements LD of the first and second sub-emission units EMU1 and EMU2, so that the light emitting elements LD may generally uniformly emit light. Consequently, the first and second sub-emission units EMU1 and EMU2 may be grouped to form the emission unit EMU of each pixel PXL, so that pixels PXL provided in the display area DA of the display device may form a uniform light output distribution.

Figure 14:
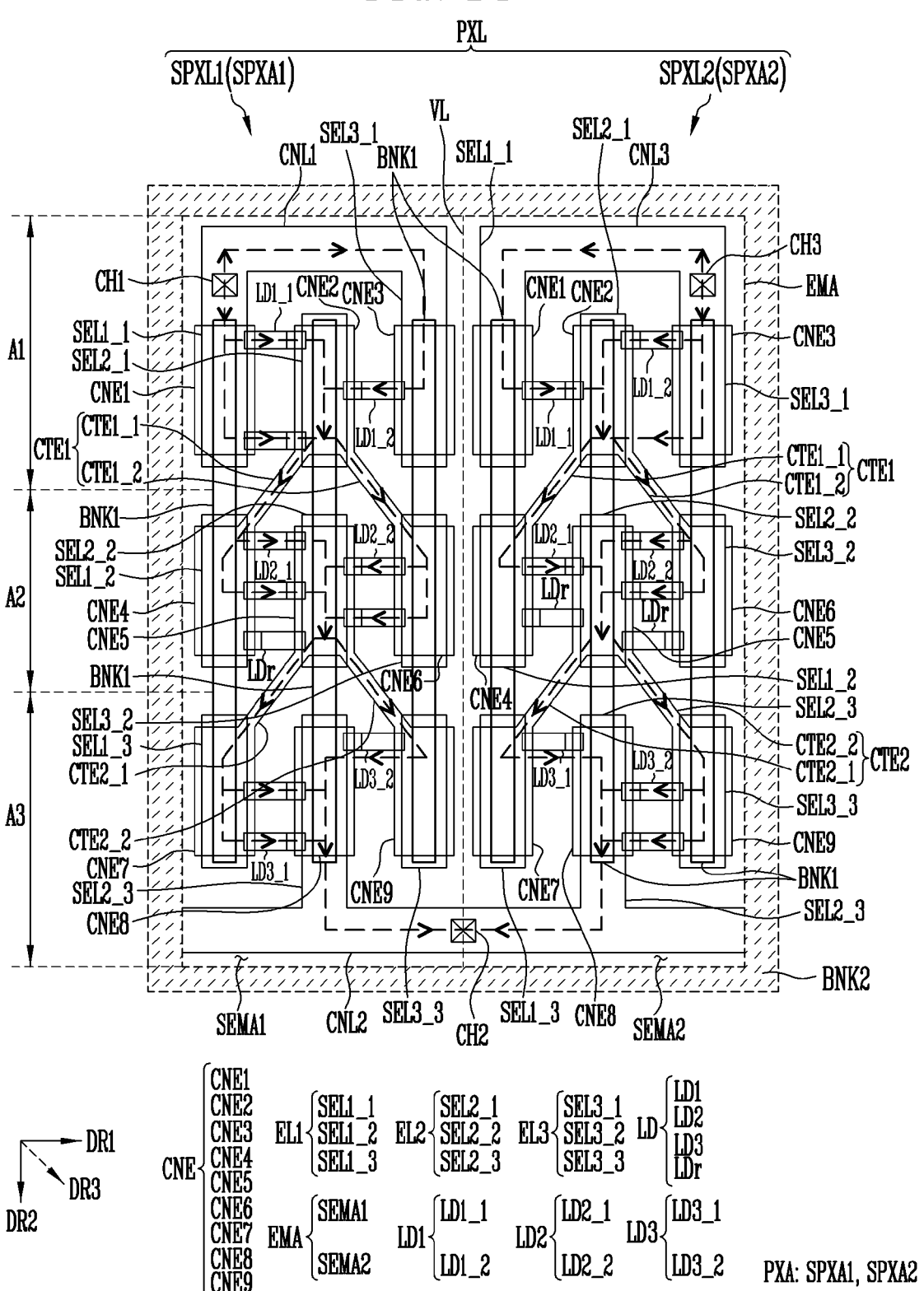
FIG. 14 is a schematic plan view illustrating driving current flowing through a pixel in accordance with an embodiment of the present disclosure and, for example, illustrates the flow of driving current flowing through the pixel of FIG. 8.

FIG. 14 is a schematic plan view illustrating driving current flowing through a pixel in accordance with an embodiment and, for example, illustrates the flow of driving current flowing through the pixel of FIG. 8. In detail, in FIG. 14, the flow of driving current flowing through the pixel PXL of FIG. 8 in case that the pixel PXL is driven to emit light in response to a data signal having a gray scale is designated by the dotted arrows.

Referring to FIGS. 1A to 5, 7C, and 8 to 14, if driving current flows from the first power line PL1 to the second power line PL2 via the first and second sub-pixels SPXL1 and SPXL2 by the driving transistor of each of the first and second sub-pixels SPXL1 and SPXL2 included in each pixel PXL, the driving current may be drawn into the corresponding sub-emission unit through the first and third contact holes CH1 and CH3. For example, the driving current may be supplied to the 1-1-th and 3-1-th sub-electrodes SEL1_1 and SEL3_1 of the first sub-emission unit EMU1 of the first sub-pixel SPXL1 through the first contact hole CH1, and supplied to the 1-1-th and 3-1-th sub-electrodes SEL1_1 and SEL3_1 of the second sub-emission unit EMU2 of the second sub-pixel SPXL2 through the third contact hole CH3.

The driving current supplied to the 1-1-th and 3-1-th sub-electrodes SEL1_1 and SEL3_1 of each of the first and second sub-emission units EMU1 and EMU2 may flow to the 2-1-th sub-electrode SEL2_1 via the 1-1-th light emitting elements LD1_1 and the 1-2-th light emitting elements LD1_2 of the first serial set SET1. Therefore, each of the 1-1-th and 1-2-th light emitting elements LD1_1 and LD1_2 may emit light at a luminance corresponding to related distributed current.

The driving current that flows through the 2-1-th sub-electrode SEL2_1 of the first serial set SET1 of each of the first and second sub-emission units EMU1 and EMU2 may be drawn to the 1-2-th and 3-2-th sub-electrodes SEL1_2 and SEL3_2 of the second serial set SET2 through the first intermediate electrode CTE1. The driving current flows to the 2-2-th sub-electrode SEL2_2 of the second serial set SET2 via the 2-1-th light emitting elements LD2_1 connected in the forward direction between the 1-2-th sub-electrode SEL1_2 and the 2-2-th sub-electrode SEL2_2, and the 2-2-th light emitting elements LD2_2 connected in the forward direction between the 3-2-th sub-electrode SEL3_2 and the 2-2-th sub-electrode SEL2_2. Therefore, each of the 2-1-th and 2-2-th light emitting elements LD2_1 and LD2_2 may emit light at a luminance corresponding to related distributed current.

The driving current that flows through the 2-2-th sub-electrode SEL2_2 of the second serial set SET2 of each of the first and second sub-emission units EMU1 and EMU2 may be drawn to the 1-3-th and 3-3-th sub-electrodes SEL1_3 and SEL3_3 of the third serial set SET3 through the second intermediate electrode CTE2. The driving current flows to the 2-3-th sub-electrode SEL2_3 of the third serial set SET3 via the 3-1-th light emitting elements LD3_1 connected in the forward direction between the 1-3-th sub-electrode SEL1_3 and the 2-3-th sub-electrode SEL2_3, and the 3-2-th light emitting elements LD3_2 connected in the forward direction between the 3-3-th sub-electrode SEL3_3 and the 2-3-th sub-electrode SEL2_3. Therefore, each of the 3-1-th and 3-2-th light emitting elements LD3_1 and LD3_2 may emit light at a luminance corresponding to related distributed current.

The driving current that flows through the 2-3-th sub-electrode SEL2_3 of the third serial set SET3 of each of the first and second sub-emission units EMU1 and EMU2 may be drawn to the driving voltage line (for example, the second power line PL2) via the second contact hole CH2 and the second connection line CNL2. In this way, the driving current of each pixel PXL including the first and second sub-pixels SPXL1 and SPXL2 may flow successively via the first light emitting elements LD1 of the first serial set SET1, the second light emitting elements LD2 of the second serial set SET2, and the third light emitting elements LD3 of the third serial set SET3. Hence, each pixel PXL may emit light having a luminance corresponding to a data signal supplied during each frame period. Furthermore, each pixel PXL may have a light output distribution similar or identical to that of adjacent pixels PXL because identical or similar driving currents are respectively supplied to the light emitting elements LD included in the first sub-emission unit EMU1 and the light emitting elements LD included in the second sub-emission unit EMU2 of the second sub-pixel SPXL2.

FIGS. 15A to 15F are schematic plan views sequentially illustrating a method of fabricating a pixel illustrated in FIG. 8. FIGS. 16A to 16F are schematic cross-sectional views sequentially illustrating a method of fabricating the pixel illustrated in FIG. 10.

Hereinafter, the method of fabricating the pixel illustrated in FIGS. 8 and 10 in accordance with an embodiment will be described with reference to FIGS. 15A to 15F and FIGS. 16A to 16F.

Referring to FIGS. 1A to 5, 7C, 8 to 10, 15A, and 16A, the pixel circuit layer PCL of the pixel PXL is formed on the substrate SUB. The pixel PXL may include an emission area EMA, and a peripheral area disposed around the emission area EMA.

The pixel circuit layer PCL may include the first and second pixel circuits 144_a and 144b each including at least one transistor T, the signal lines connected to each of the first and second pixel circuits 144_a and 144_b, and the passivation layer PSV. Here, the signal lines may include the second power supply line PL2 to which the second driving power supply VSS is to be applied.

The passivation layer PSV may include a first contact hole CH1 which expose a transistor T, for example, the first driving transistor T (Tdr1) included in the first pixel circuit 144_a, a second contact hole CH2 which exposes the second power line PL2, and a third contact hole CH3 which exposes the second driving transistor T (Tdr2) included in the second pixel circuit 144_b.

Subsequently, the first bank pattern BNK1 is formed on the passivation layer PSV. Each first bank pattern BNK1 may be spaced apart from an adjacent first bank pattern BNK1 by a distance on the passivation layer PSV. In a plan view, the first bank pattern BNK1 may have a bar shape extending in the second direction DR2, but the disclosure is not limited thereto. The first bank pattern BNK1 may include an inorganic insulating layer formed of an inorganic material, or an organic insulating layer formed of an organic material.

Referring to FIGS. 1A to 5, 7C, 8 to 10, 15B, 16A, and 16B, first to sixth conductive lines CL1 to CL6, a bridge pattern BRP, and the second connection line CNL2 that include conductive materials (or substances) with high reflectivities are formed on the passivation layer PSV including the first bank pattern BNK1.

Each of the first to sixth conductive lines CL1 to CL6 may be formed on the corresponding first bank pattern BNK1 in the emission area EMA of the pixel PXL, and spaced apart from an adjacent conductive line. Here, a distance between the third conductive line CL3 and the fourth conductive line CL4 may be less than a distance between two other adjacent conductive lines. Accordingly, the light emitting elements LD input to the emission area EMA may be aligned in only a desired area during a subsequent process, taking into account the degree of integration of components included in the emission area EMA of each pixel PXL. However, the present disclosure is not limited thereto. In an embodiment, the distance between the third conductive line CL3 and the fourth conductive line CL4 may be the same as the distance between two other adjacent conductive lines.

In an embodiment, the first conductive line CL1 may be connected to the first driving transistor T (Tdr1) of the first pixel circuit 144a through the first contact hole CH1. The sixth conductive line CL6 may be connected to the second driving transistor T (Tdr2) of the second pixel circuit 144_b through the third contact hole CH3.

The bridge pattern BRP may extend in the first direction DR1 and be connected with the first conductive line CL1, the third conductive line CL3, the fourth conductive line CL4, and the sixth conductive line CL6 of the first to sixth conductive lines CL1 to CL6. In an embodiment, the bridge pattern BRP, the first conductive line CL1, the third conductive line CL3, the fourth conductive line CL4, and the sixth conductive line CL6 may be integrally formed and electrically and/or physically connected to each other. In an embodiment, the bridge pattern BRP may be provided in common between each pixel PXL and pixels PXL adjacent thereto. Pixels PXL that are disposed in an identical row in the first direction DR1 may be connected in common to the bridge pattern BRP.

The second connection line CNL2 may extend in the first direction DR1 and be connected to the second conductive line CL2 and the fifth conductive line CL5 of the first to sixth conductive lines CL1 to CL6. In an embodiment, the second connection line CNL2, the second conductive line CL2, and the fifth conductive line CL5 may be integrally formed and electrically and/or physically connected to each other. The second connection line CNL2 may be electrically connected to the second power line PL2 through the second contact hole CH2. In an embodiment, the second connection line CNL2 may be provided in common between each pixel PXL and pixels PXL adjacent thereto. Pixels PXL that are disposed in an identical row in the first direction DR1 may be connected in common to the second connection line CNL2.

In a plan view, the first to sixth conductive lines CL1 to CL6 may be successively provided and/or formed along the first direction DR1 in the emission area EMA of the pixel PXL. Furthermore, each of the first to sixth conductive lines CL1 to CL6 may extend in the second direction DR2 in the emission area EMA of the pixel PXL.

Subsequently, an insulating material layer INSM is formed on the passivation layer PSV including the first to sixth conductive lines CL1 to CL6, the bridge pattern BRP, the second connection line CNL2, etc., within the spirit and the scope of the disclosure. The insulating material layer INSM may include an inorganic insulating layer including an inorganic material, or an organic insulating layer including an organic material.

Referring to FIGS. 1A to 5, 7C, 8 to 10, 15C, 16A, and 16B, the second bank pattern BNK2 is formed in the peripheral area provided around the emission area EMA of the pixel PXL. Here, the second bank pattern BNK2 may be formed on the insulating material layer INSM. The second bank pattern BNK2 may be a pixel defining layer to define (or divide) the emission areas EMA between the pixel PXL and pixels adjacent to the pixel PXL. The second bank pattern BNK2 may include an inorganic insulating layer including an inorganic material, and/or an organic insulating layer including an organic material. In an embodiment, the second bank pattern BNK2 may be formed through a same process as that of the first bank pattern BNK1 formed in the emission area EMA of the pixel PXL.

Referring to FIGS. 1A to 5, 7C, 8 to 10, 15D, and 16A to 16C, the first to sixth conductive lines CL1 to CL6 are respectively supplied with corresponding alignment signals (or alignment voltages) by the bridge pattern BRP and the second connection line CNL2 so that an electric field may be formed between two adjacent conductive lines. Here, a first alignment signal (or a first alignment voltage) may be applied to each of the first and third conductive lines CL1 and CL3 and the fourth and sixth conductive lines CL4 and CL6 that are connected to the bridge pattern BRP. A second alignment signal (or a second alignment voltage) having a voltage level different from that of the first alignment signal may be applied to each of the second and fifth conductive lines CL2 and CL5 that are connected to the second connection line CNL2.

For example, in case that AC power or DC power having a voltage and period is repeatedly applied several times to each of the first to sixth conductive lines CL1 to CL6, an electric field may be formed between two adjacent conductive lines of the first to sixth conductive lines CL1 to CL6, the electric field corresponding to a difference between respective potentials of the two adjacent conductive lines. Here, since the same alignment signal is applied to the third conductive line CL3 and the fourth conductive line CL4, a different in potential between the two conductive lines CL3 and CL4 may not occur.

While electric fields are formed between the first to sixth conductive lines CL1 to CL6 formed in the emission area EMA of the pixel PXL, a mixed solution including light emitting elements LD are supplied to the emission area EMA through an inkjet printing method or the like within the spirit and the scope of the disclosure. For example, an inkjet nozzle is disposed on the insulating material layer INSM, and a solvent mixed with light emitting elements LD may be supplied onto the emission area EMA of the pixel PXL through the inkjet nozzle. Here, the solvent may be any one of acetone, water, alcohol, and toluene, but the disclosure is not limited thereto. For example, the solvent may have the form of ink or paste. A method of supplying the light emitting elements LD to the emission area EMA of the pixel PXL is not limited to that of the foregoing embodiment. The method of supplying the light emitting elements LD may be changed in various ways.

After the light emitting elements LD have been supplied to the emission area EMA of the pixel PXL, the solvent may be removed.

In case that the light emitting elements LD are supplied to the emission area EMA of the pixel PXL, self-alignment of the light emitting elements LD may be induced by the electric fields formed between the first to sixth conductive lines CL1 to CL6. Hence, the light emitting elements LD may be aligned between the first conductive line CL1 and the second conductive line CL2, between the second conductive line CL2 and the third conductive line CL3, between the fourth conductive line CL4 and the fifth conductive line CL5, and between the fifth conductive line CL5 and the sixth conductive line CL6. Each of the light emitting elements LD may be aligned on the insulating material layer INSM in the emission area EMA of the pixel PXL.

The light emitting elements LD may be coupled or connected in the forward direction between two conductive lines adjacent to each other in the first direction DR1. For example, the first end EP1 of each of the light emitting elements LD that are aligned between the first conductive line CL1 and the second conductive line CL2 may be connected to the first conductive line CL1, and the second end EP2 thereof may be connected to the second conductive line CL2. Furthermore, the first end EP1 of each of the light emitting elements LD that are aligned between the second conductive line CL2 and the third conductive line CL3 may be connected to the third conductive line CL3, and the second end EP2 thereof may be connected to the second conductive line CL2. The first end EP1 of each of the light emitting elements LD that are aligned between the fourth conductive line CL4 and the fifth conductive line CL5 may be connected to the fourth conductive line CL4, and the second end EP2 thereof may be connected to the fifth conductive line CL5. Furthermore, the first end EP1 of each of the light emitting elements LD that are aligned between the fifth conductive line CL5 and the sixth conductive line CL6 may be connected to the sixth conductive line CL6, and the second end EP2 thereof may be connected to the fifth conductive line CL5.

In an embodiment, the light emitting elements LD may include at least one reverse light emitting element LDr connected in a direction opposite to the forward direction depending on a wavelength, etc. of an alignment signal applied to each of two adjacent conductive lines.

At the step of aligning the light emitting elements LD, a ratio of the number of light emitting elements LD arranged in the forward direction in the emission area EMA of the pixel PXL and the number of light emitting elements coupled or connected in the direction opposite thereto, for example, the number of reverse light emitting elements LDr, may be adjusted or the light emitting elements LD aligned in the forward direction may be intensively disposed at a specific or given position in the emission area EMA, for example, by controlling the direction and magnitude of the electric field formed between the two adjacent conductive lines by adjusting the alignment signal to be applied to the two adjacent conductive lines.

Referring to FIGS. 1A to 5, 7C, 8 to 10, and 16A to 16D, after the light emitting elements LD are aligned in the emission area EMA of the pixel PXL, the second insulating layer INS2 is formed on each of the light emitting elements LD. The second insulating layer INS2 may cover or overlap at least a portion of an upper surface of each of the light emitting elements LD such that the opposite ends EP1 and EP2 of each of the light emitting elements LD may be exposed to the outside.

The first insulating layer INS1 may be formed, through a process of forming the second insulating layer INS2 or an etching process to be performed before or after the process, by etching the insulating material layer INSM such that a portion of each of the first to sixth conductive lines CL1 to CL6 is exposed.

Referring to FIGS. 1A to 5, 7C, 8 to 10, 15E, and 16A to 16E, the first to ninth contact electrodes CNE1 to CNE9 are formed on the first to sixth conductive lines CL1 to CL6, and two first intermediate electrodes CTE1 and two second intermediate electrodes CTE2 which are connected to some or a number of the first to ninth contact electrodes CNE1 to CNE9 are formed.

The first contact electrode CNE1, the fourth contact electrode CNE4, and the seventh contact electrode CNE7 may be formed on the first conductive line CL1. The first, fourth, and seventh contact electrodes CNE1, CNE4, and CNE7 may be formed on or directly formed on the first conductive line CL1 and electrically and/or physically connected with the first conductive line CL1. The second contact electrode CNE2, the fifth contact electrode CNE5, and the eighth contact electrode CNE8 may be formed on the second conductive line CL2. The second, fifth, and eighth contact electrodes CNE2, CNE5, and CNE8 may be formed on or directly formed on the second conductive line CL2 and electrically and/or physically connected with the second conductive line CL2. The third contact electrode CNE3, the sixth contact electrode CNE6, and the ninth contact electrode CNE9 may be formed on the third conductive line CL3. The third, sixth, and ninth contact electrodes CNE3, CNE6, and CNE9 may be formed on or directly formed on the third conductive line CL3 and electrically and/or physically connected with the third conductive line CL3.

The first contact electrode CNE1, the fourth contact electrode CNE4, and the seventh contact electrode CNE7 may be formed on the fourth conductive line CL4. The first, fourth, and seventh contact electrodes CNE1, CNE4, and CNE7 may be formed directly on the fourth conductive line CL4 and electrically and/or physically connected with the fourth conductive line CL4. The second contact electrode CNE2, the fifth contact electrode CNE5, and the eighth contact electrode CNE8 may be formed on the fifth conductive line CL5. The second, fifth, and eighth contact electrodes CNE2, CNE5, and CNE8 may be formed directly on the fifth conductive line CL5 and electrically and/or physically connected with the fifth conductive line CL5. The third contact electrode CNE3, the sixth contact electrode CNE6, and the ninth contact electrode CNE9 may be formed on the sixth conductive line CL6. The third, sixth, and ninth contact electrodes CNE3, CNE6, and CNE9 may be formed directly on the sixth conductive line CL6 and electrically and/or physically connected with the sixth conductive line CL6.

One first intermediate electrode CTE1 of the two first intermediate electrodes CTE1 may include a 1-1-th intermediate electrode CTE1_1 to connect the second contact electrode CNE2 on the second conductive line CL2 with the fourth contact electrode CNE4 on the first conductive line CL1, and a 1-2-th intermediate electrode CTE1_2 to connect the second contact electrode CNE2 with the sixth contact electrode CNE6 on the third conductive line CL3.

A remaining first intermediate electrode CTE1 of the two first intermediate electrodes CTE1 may include a 1-1-th intermediate electrode CTE1_1 to connect the second contact electrode CNE2 on the fifth conductive line CL5 with the fourth contact electrode CNE4 on the fourth conductive line CL4, and a 1-2-th intermediate electrode CTE1_2 to connect the second contact electrode CNE2 with the sixth contact electrode CNE6 on the sixth conductive line CL6.

One second intermediate electrode CTE2 of the two second intermediate electrodes CTE2 may include a 2-1-th intermediate electrode CTE2_1 to connect the fifth contact electrode CNE5 on the second conductive line CL2 with the seventh contact electrode CNE7 on the first conductive line CL1, and a 2-2-th intermediate electrode CTE2_2 to connect the fifth contact electrode CNE5 with the ninth contact electrode CNE9 on the third conductive line CL3.

A remaining second intermediate electrode CTE2 of the two second intermediate electrodes CTE2 may include a 2-1-th intermediate electrode CTE2_1 to connect the fifth contact electrode CNE5 on the fifth conductive line CL5 with the seventh contact electrode CNE7 on the fourth conductive line CL4, and a 2-2-th intermediate electrode CTE2_2 to connect the fifth contact electrode CNE5 with the ninth contact electrode CNE9 on the sixth conductive line CL6.

Referring to FIGS. 1A to 5, 7C, 8 to 10, and 15F, to allow each pixel PXL to be driven independently (or individually) from pixels PXL adjacent thereto, a portion of the bridge pattern BRP between the pixel PXL and the adjacent pixels PXL is removed by an etching method or the like using a mask, whereby the first connection line CNL1 and the third connection line CNL3 are formed. In an embodiment, in case that the process of removing a portion of the bridge pattern BRP is performed, the second connection line CNL2 may provided in common to each pixel PXL and pixels PXL adjacent thereto rather than being separated between the pixel PXL and the adjacent pixels PXL, but the disclosure is not limited thereto. In an embodiment, a portion of the second connection line CNL2 may also be removed between each pixel PXL and pixels PXL adjacent thereto during the process of removing a portion of the bridge pattern BRP, so that the pixel PXL and the adjacent pixels PXL may be separated from each other.

The first connection line CNL1 and the third connection line CNL3 that are formed through the process of removing a portion of the bridge pattern BRP may be electrically and/or physically separated from each other. In other words, the first connection line CNL1 and the third connection line CNL3 may be separate conductive patterns (or conductive lines) separated from each other rather than being connected to each other. The first connection line CNL1 may be electrically and/or physically connected to the first and third conductive lines CL1 and CL3. The third connection line CNL3 may be electrically and/or physically connected to the fourth and sixth conductive lines CL4 and CL6.

Figure 21:
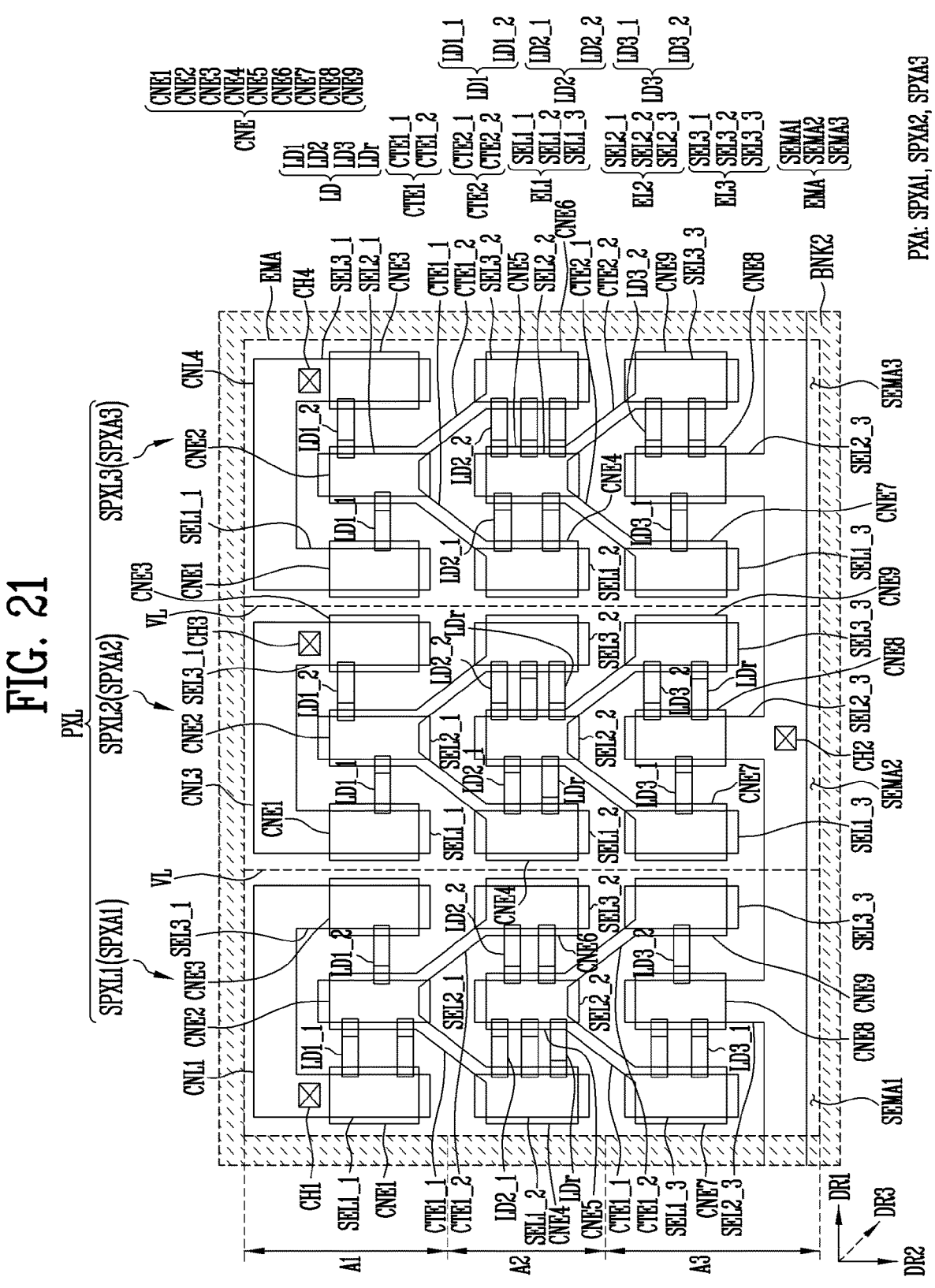

Each pixel PXL may be divided into a first sub-pixel SPXL1 including the first connection line CNL1, and a second sub-pixel SPXL2 including the third connection line CNL3. Hence, the pixel area PXA in which each pixel PXL is disposed may include a first sub-area SPXA1 in which the first sub-pixel SPXL1 is disposed, and a second sub-area SPXA2 in which the second sub-pixel SPXL2 is disposed. In an embodiment, the first sub-area SPXA1 may include a first sub-emission area SEMA1 which emits light. The second sub-area SPXA2 may include a second sub-emission area SEMA2 which emits light. The first to third conductive lines CL1, CL2, and CL3 may correspond to (or be provided in) the first sub-emission area SEMA1. The fourth to sixth conductive lines CL4, CL5, and CL6 may correspond to (or be provided in) the second sub-emission area SEMA2. It is to be understood that there may be included a third sub-area SPXA3 as in FIG. 21.

During the process of separating the first connection line CNL1 and the third connection line CNL3 from each other by removing a portion of the bridge pattern BRP, each of the first to sixth conductive lines CL1 to CL6 may be partially removed or disconnected and thus provided in the form of an electrode including three sub-electrodes spaced apart from each other in the second direction DR2.

The first conductive line CL1 of the first sub-emission area SEMA1 may be partially removed or disconnected during the process of separating the first and third connection lines CNL1 and CNL3 from each other, and thus form a first electrode EL1 including 1-1-th to 1-3-th sub-electrodes SEL1_1, SEL1_2, and SEL1_3 that are disposed in an identical column in the second direction DR2 and spaced apart from each other. The second conductive line CL2 of the first sub-emission area SEMA1 may be partially removed or disconnected during the process of separating the first and third connection lines CNL1 and CNL3 from each other, and thus form a second electrode EL2 including 2-1-th to 2-3-th sub-electrodes SEL2_1, SEL2_2, and SEL2_3 that are disposed in an identical column in the second direction DR2 and spaced apart from each other. The third conductive line CL3 of the first sub-emission area SEMA1 may be partially removed or disconnected during the process of separating the first and third connection lines CNL1 and CNL3 from each other, and thus form a third electrode EL3 including 3-1-th to 3-3-th sub-electrodes SEL3_1, SEL3_2, and SEL3_3 that are disposed in an identical column in the second direction DR2 and spaced apart from each other.

The fourth conductive line CL4 of the second sub-emission area SEMA2 may be partially removed or disconnected during the process of separating the first and third connection lines CNL1 and CNL3 from each other, and thus form a first electrode EL1 including 1-1-th to 1-3-th sub-electrodes SEL1_1, SEL1_2, and SEL1_3 that are disposed in an identical column in the second direction DR2 and spaced apart from each other. The fifth conductive line CL5 of the second sub-emission area SEMA2 may be partially removed or disconnected during the process of separating the first and third connection lines CNL1 and CNL3 from each other, and thus form a second electrode EL2 including 2-1-th to 2-3-th sub-electrodes SEL2_1, SEL2_2, and SEL2_3 that are disposed in an identical column in the second direction DR2 and spaced apart from each other. The sixth conductive line CL6 of the second sub-emission area SEMA2 may be partially removed or disconnected during the process of separating the first and third connection lines CNL1 and CNL3 from each other, and thus form a third electrode EL3 including 3-1-th to 3-3-th sub-electrodes SEL3_1, SEL3_2, and SEL3_3 that are disposed on in identical column in the second direction DR2 and spaced apart from each other.

Each of the first and second sub-emission areas SEMA1 and SEMA2 may be divided (or sectioned) into first to third areas A1, A2, and A3 depending on positions of the sub-electrodes. In the first area A1 of each of the first and second sub-emission areas SEMA1 and SEMA2, the 1-1-th, 2-1-th, and 3-1-th sub-electrodes SEL1_1, SEL2_1, and SEL3_1 may be disposed. In the second area A2 of each of the first and second sub-emission areas SEMA1 and SEMA2, the 1-2-th, 2-2-th, and 3-2-th sub-electrodes SEL1_2, SEL2_2, and SEL3_2 may be disposed. In the third area A3 of each of the first and second sub-emission areas SEMA1 and SEMA2, the 1-3-th, 2-3-th, and 3-3-th sub-electrodes SEL1_3, SEL2_3, and SEL3_3 may be disposed.

In a plan view, the light emitting elements LD may include first light emitting elements LD1 aligned (or arranged) in the first area A1 of each of the first and second sub-emission areas SEMA1 and SEMA2, second light emitting elements LD2 aligned (or arranged) in the second area A2 of each of the first and second sub-emission areas SEMA1 and SEMA2, and third light emitting elements LD3 aligned (or arranged) in the third area A3 of each of the first and second sub-emission areas SEMA1 and SEMA2.

The first light emitting elements LD1 may include at least one 1-1-th light emitting element LD1_1 aligned (or arranged) between the 1-1-th sub-electrode SEL1_1 and the 2-1-th sub-electrode SEL2_1 and at least one 1-2-th light emitting elements LD1_2 aligned (or arranged) between the 2-1-th sub-electrode SEL2_1 and the 3-1-th sub-electrode SEL3_1 in each of the first and second sub-emission areas SEMA1 and SEMA2. The first light emitting elements LD1, along with two adjacent sub-electrodes between which each of the first light emitting elements LD1 is interposed, may form a first serial set SET1 of the sub-emission unit of each of the first and second sub-emission areas SEMA1 and SEMA2. In other words, the first light emitting elements LD1 of the first sub-emission area SEMA1, along with two adjacent sub-electrodes between which each of the first light emitting elements LD1 is interposed, may form a first serial set SET1 of the first sub-emission unit EMU1. The first light emitting elements LD1 of the second sub-emission area SEMA2, along with two adjacent sub-electrodes between which each of the first light emitting elements LD1 is interposed, may form a first serial set SET1 of the second sub-emission unit EMU2.

One end EP1 of the opposite ends EP1 and EP2 of the 1-1-th light emitting elements LD1_1 may be more reliably connected with the 1-1-th sub-electrode SEL1_1 by the first contact electrode CNE1 on the 1-1-th sub-electrode SEL1_1, and the other end EP2 thereof may be more reliably connected with the 2-1-th sub-electrode SEL2_1 by the second contact electrode CNE2 on the 2-1-th sub-electrode SEL2_1.

One end EP1 of the opposite ends EP1 and EP2 of the 1-2-th light emitting elements LD1_2 may be more reliably connected with the 3-1-th sub-electrode SEL3_1 by the third contact electrode CNE3 on the 3-1-th sub-electrode SEL3_1, and the other end EP2 thereof may be more reliably connected with the 2-1-th sub-electrode SEL2_1 by the second contact electrode CNE2 on the 2-1-th sub-electrode SEL2_1.

The second light emitting elements LD2 may include at least one 2-1-th light emitting element LD2_1 aligned (or arranged) between the 1-2-th sub-electrode SEL1_2 and the 2-2-th sub-electrode SEL2_2 and at least one 2-2-th light emitting elements LD2_2 aligned (or arranged) between the 2-2-th sub-electrode SEL2_2 and the 3-2-th sub-electrode SEL3_2 in each of the first and second sub-emission areas SEMA1 and SEMA2. The second light emitting elements LD2, along with two adjacent sub-electrodes between which each of the second light emitting elements LD2 is interposed, may form a second serial set SET2 of the sub-emission unit of each of the first and second sub-emission areas SEMA1 and SEMA2. In other words, the second light emitting elements LD2 of the first sub-emission area SEMA1, along with two adjacent sub-electrodes between which each of the second light emitting elements LD2 is interposed, may form a second serial set SET2 of the first sub-emission unit EMU1. The second light emitting elements LD2 of the second sub-emission area SEMA2, along with two adjacent sub-electrodes between which each of the second light emitting elements LD2 is interposed, may form a second serial set SET2 of the second sub-emission unit EMU2.

One end EP1 of the opposite ends EP1 and EP2 of the 2-1-th light emitting elements LD2_1 may be more reliably connected with the 1-2-th sub-electrode SEL1_2 by the fourth contact electrode CNE4 on the 1-2-th sub-electrode SEL1_2, and the other end EP2 thereof may be more reliably connected with the 2-2-th sub-electrode SEL2_2 by the fifth contact electrode CNE5 on the 2-2-th sub-electrode SEL2_2.

One end EP1 of the opposite ends EP1 and EP2 of the 2-2-th light emitting elements LD2_2 may be more reliably connected with the 3-2-th sub-electrode SEL3_2 by the sixth contact electrode CNE6 on the 3-2-th sub-electrode SEL3_2, and the other end EP2 thereof may be more reliably connected with the 2-2-th sub-electrode SEL2_2 by the fifth contact electrode CNE5 on the 2-2-th sub-electrode SEL2_2.

In an embodiment, the second contact electrode CNE2 on the 2-1-th sub-electrode SEL2_1 of the first serial set SET1 of each of the first and second sub-emission areas SEMA1 and SEMA2 may be electrically and/or physically connected with the fourth contact electrode CNE4 on the 1-2-th sub-electrode SEL1_2 of the second serial set SET2 of the corresponding sub-emission area through the 1-1-th intermediate electrode CTE1_1. Furthermore, the second contact electrode CNE2 on the 2-1-th sub-electrode SEL2_1 of the first serial set SET1 of each of the first and second sub-emission areas SEMA1 and SEMA2 may be electrically and/or physically connected with the sixth contact electrode CNE6 on the 3-2-th sub-electrode SEL3_2 of the second serial set SET2 of the corresponding sub-emission area through the 1-2-th intermediate electrode CTE1_2.

The third light emitting elements LD3 may include at least one 3-1-th light emitting element LD3_1 aligned (or arranged) between the 1-3-th sub-electrode SEL1_3 and the 2-3-th sub-electrode SEL2_3 and at least one 3-2-th light emitting elements LD3_2 aligned (or arranged) between the 2-3-th sub-electrode SEL2_3 and the 3-3-th sub-electrode SEL3_3 in each of the first and second sub-emission areas SEMA1 and SEMA2. The third light emitting elements LD3, along with two adjacent sub-electrodes between which each of the third light emitting elements LD3 is interposed, may form a third serial set SET3 of the sub-emission unit of each of the first and second sub-emission areas SEMA1 and SEMA2. In other words, the third light emitting elements LD3 of the first sub-emission area SEMA1, along with two adjacent sub-electrodes between which each of the third light emitting elements LD3 is interposed, may form a third serial set SET3 of the first sub-emission unit EMU1. The third light emitting elements LD3 of the second sub-emission area SEMA2, along with two adjacent sub-electrodes between which each of the third light emitting elements LD3 is interposed, may form a third serial set SET3 of the second sub-emission unit EMU2.

One end EP1 of the opposite ends EP1 and EP2 of the 3-1-th light emitting elements LD3_1 may be more reliably connected with the 1-3-th sub-electrode SEL1_3 by the seventh contact electrode CNE7 on the 1-3-th sub-electrode SEL1_3, and the other end EP2 thereof may be more reliably connected with the 2-3-th sub-electrode SEL2_3 by the eighth contact electrode CNE8 on the 2-3-th sub-electrode SEL2_3.

One end EP1 of the opposite ends EP1 and EP2 of the 3-2-th light emitting elements LD3_2 may be more reliably connected with the 3-3-th sub-electrode SEL3_3 by the ninth contact electrode CNE9 on the 3-3-th sub-electrode SEL3_3, and the other end EP2 thereof may be more reliably connected with the 2-3-th sub-electrode SEL2_3 by the eighth contact electrode CNE8 on the 2-3-th sub-electrode SEL2_3.

In an embodiment, the fifth contact electrode CNE5 on the 2-2-th sub-electrode SEL2_2 of the second serial set SET2 of each of the first and second sub-emission areas SEMA1 and SEMA2 may be electrically and/or physically connected with the seventh contact electrode CNE7 on the 1-3-th sub-electrode SEL1_3 of the third serial set SET3 of the corresponding sub-emission area through the 2-1-th intermediate electrode CTE2_1. Furthermore, the fifth contact electrode CNE5 on the 2-2-th sub-electrode SEL2_2 of the second serial set SET2 of each of the first and second sub-emission areas SEMA1 and SEMA2 may be electrically and/or physically connected with the ninth contact electrode CNE9 on the 3-3-th sub-electrode SEL3_3 of the third serial set SET3 of the corresponding sub-emission area through the 2-2-th intermediate electrode CTE2_2.

In each of the first and second sub-pixels SPXL1 and SPXL2, the 1-1-th, 2-1-th, and 3-1-th sub-electrodes SEL1_1, SEL2_1, and SEL3_1 and the first light emitting elements LD1 connected in the forward direction therebetween may form the first serial set SET1. The 1-2-th, 2-2-th, and 3-2-th sub-electrodes SEL1_2, SEL2_2, and SEL3_2 and the second light emitting elements LD2 connected in the forward direction therebetween may form the second serial set SET2. The 1-3-th, 2-3-th, and 3-3-th sub-electrodes SEL1_3, SEL2_3, and SEL3_3 and the third light emitting elements LD3 connected in the forward direction therebetween may form the third serial set SET3.

The first serial set SET1 and the second serial set SET2 may be electrically connected to each other by the first intermediate electrode CTE1. The second serial set SET2 and the third serial set SET3 may be electrically connected to each other by the second intermediate electrode CTE2.

The first to third serial sets SET1 to SET3 of the first sub-pixel SPXL1 may form the first sub-emission unit EMU1 of the first sub-emission area SEMA1. The first to third serial sets SET1 to SET3 of the second sub-pixel SPXL2 may form the second sub-emission unit EMU2 of the second sub-emission area SEMA2. In an embodiment, the first sub-emission unit EMU1 and the second sub-emission unit EMU2 may be grouped to form the emission unit EMU of each pixel PXL.

Referring to FIGS. 1A to 5, 8 to 10, and 16A to 16F, after the first to third electrodes EL1, EL2, and EL3 are formed in each of the first and second sub-emission areas SEMA1 and SEMA2, the third insulating layer INS3 (ENC) is formed to cover or overlap the first to ninth contact electrodes CNE1 to CNE9 on the first to third electrodes EL1, EL2, and EL3.

Figure 17:
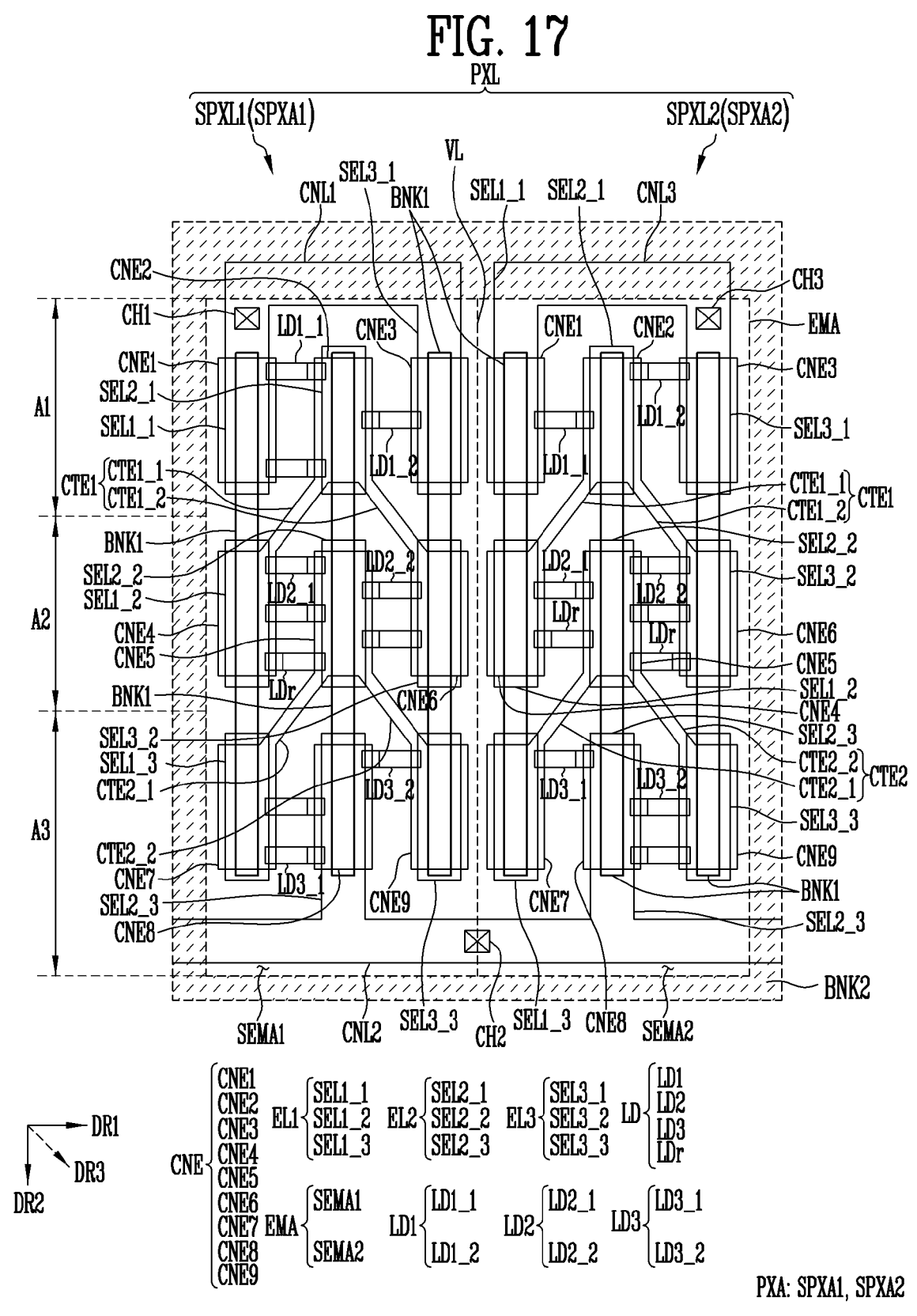

FIG. 17 is a schematic plan view illustrating an embodiment of the first to third connection lines illustrated in FIG. 8.

A pixel PXL illustrated in FIG. 17, other than the fact that a first connection line CNL1 of a first sub-pixel SPXL1 and a third connection line CNL3 of a second sub-pixel SPXL2 are disposed in a peripheral area of the pixel PXL, may have a configuration substantially equal or similar to that of the pixel PXL of FIG. 8.

In FIG. 17, detailed description of the configuration equal or similar to those of the embodiment of FIG. 8 described above will be omitted.

Referring to FIGS. 1A to 5, 7C and 17, the pixel PXL may include an emission area EMA which may emit light, and a peripheral area provided around the emission area EMA. The emission area EMA may include a first sub-emission area SEMA1 and a second sub-emission area SEMA2.

In the peripheral area of the pixel PXL, a second bank pattern BNK2 may be provided and/or formed to define (or divide) the respective emission areas EMA of the pixels PXL. Furthermore, a first connection line CNL1 connected to 1-1-th and 3-1-th sub-electrodes SEL1_1 and SEL3_1 of the first sub-emission area SEMA1, and a third connection line CNL3 connected to 1-1-th and 3-1-th sub-electrodes SEL1_1 and SEL3_1 of the second sub-emission area SEMA2 may be disposed in the peripheral area of the pixel PXL.

Figure 15A:
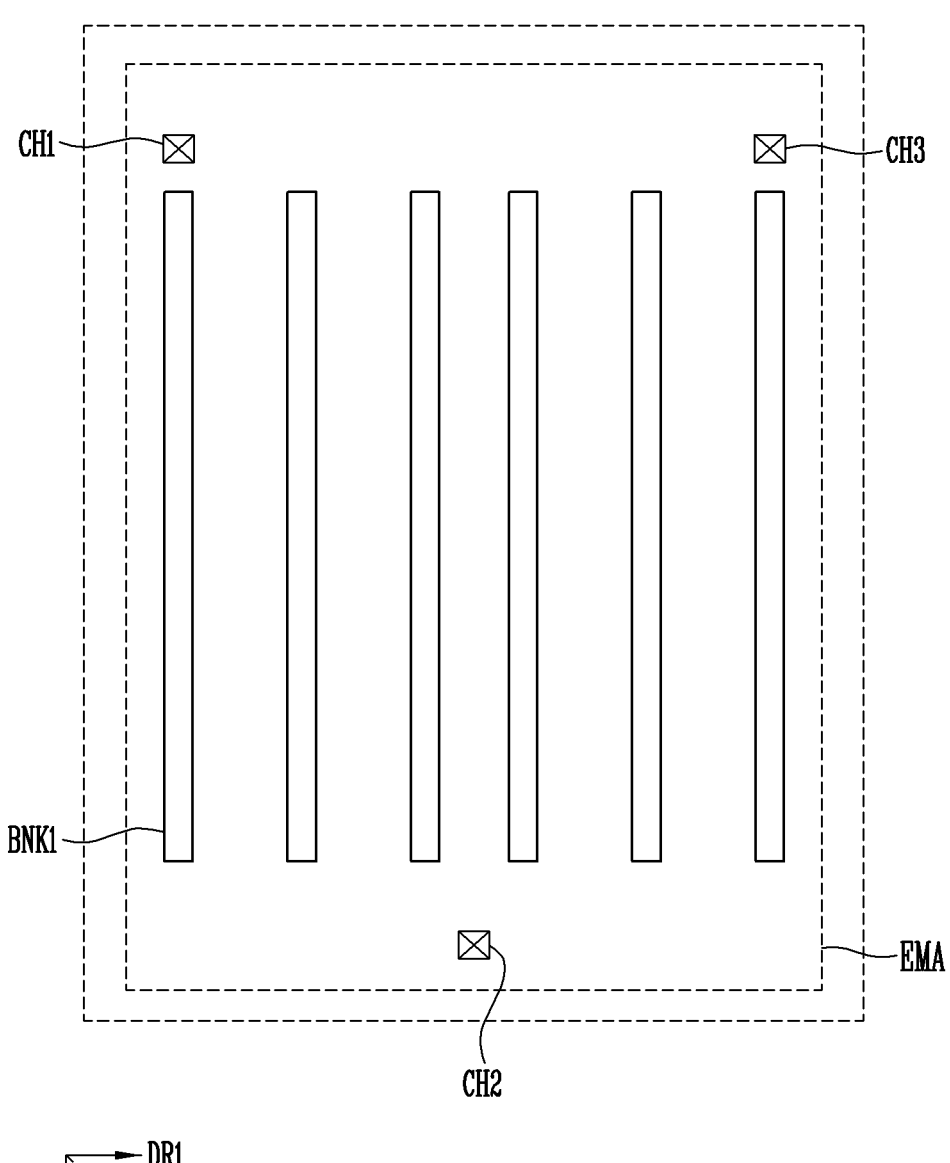
Figure 15B:
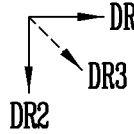
Figure 15C:
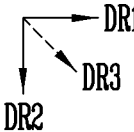
Figure 15E:
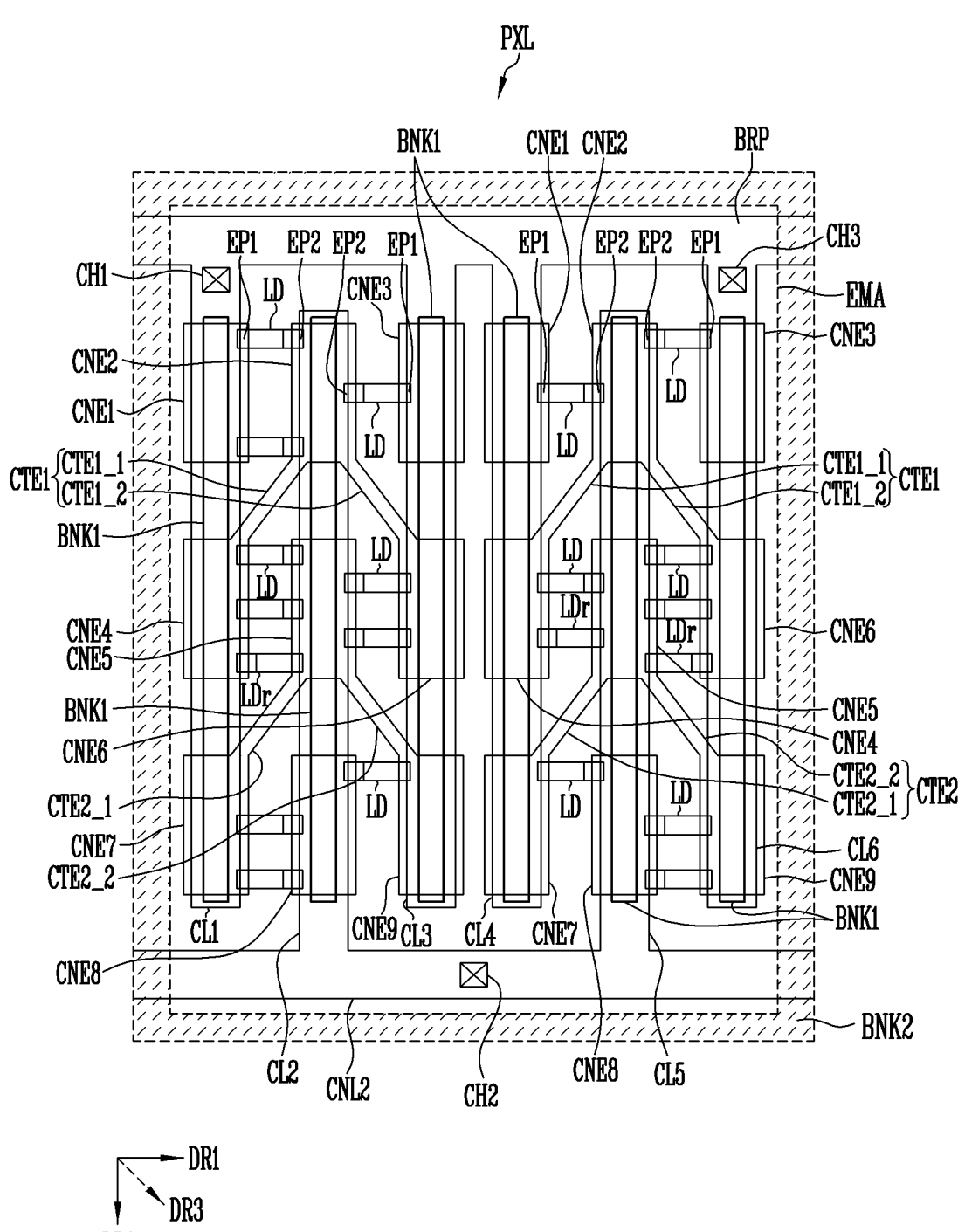
Figure 15F:
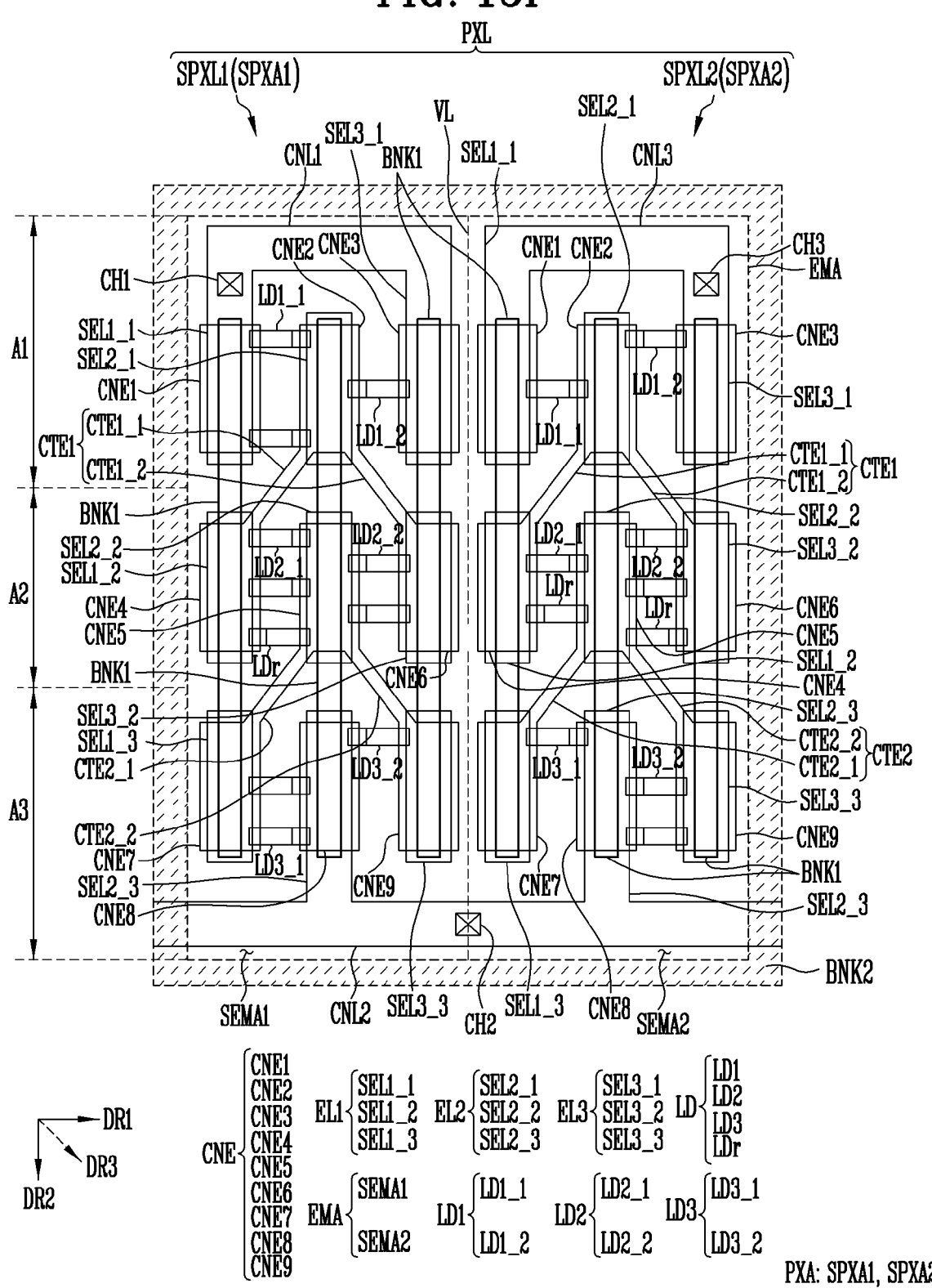
Figure 16A:
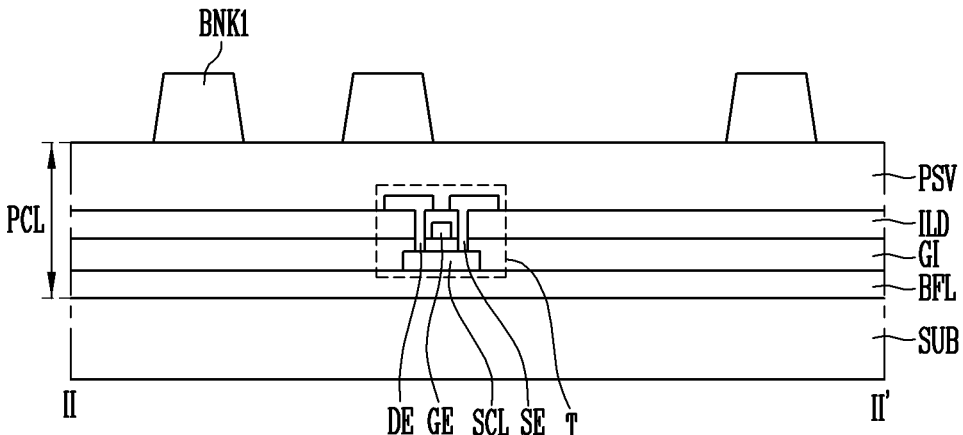
FIGS. 16A to 16F are schematic cross-sectional views sequentially illustrating a method of fabricating the pixel illustrated in FIG. 10.
Figure 16B:
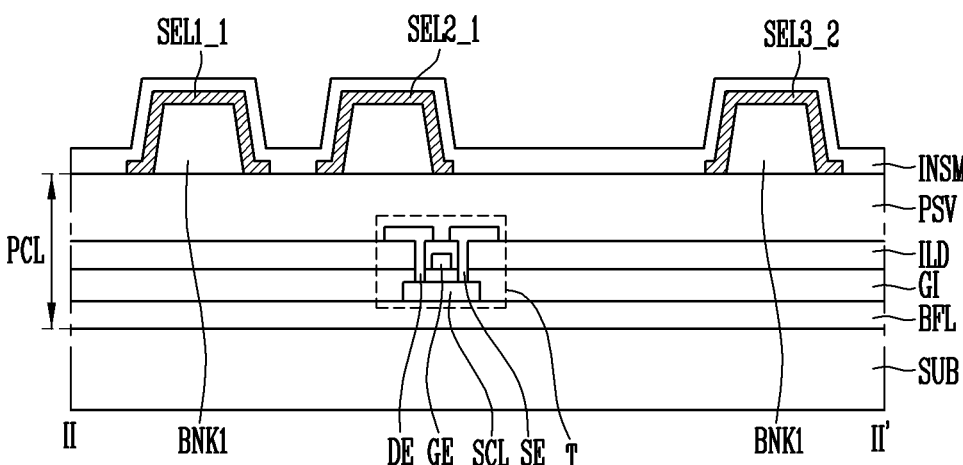
Figure 16C:
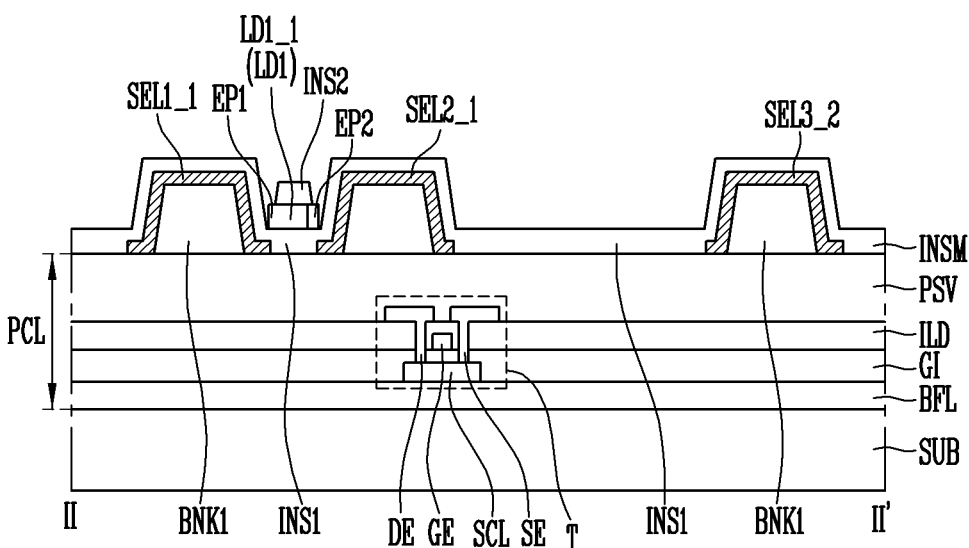
Figure 16D:
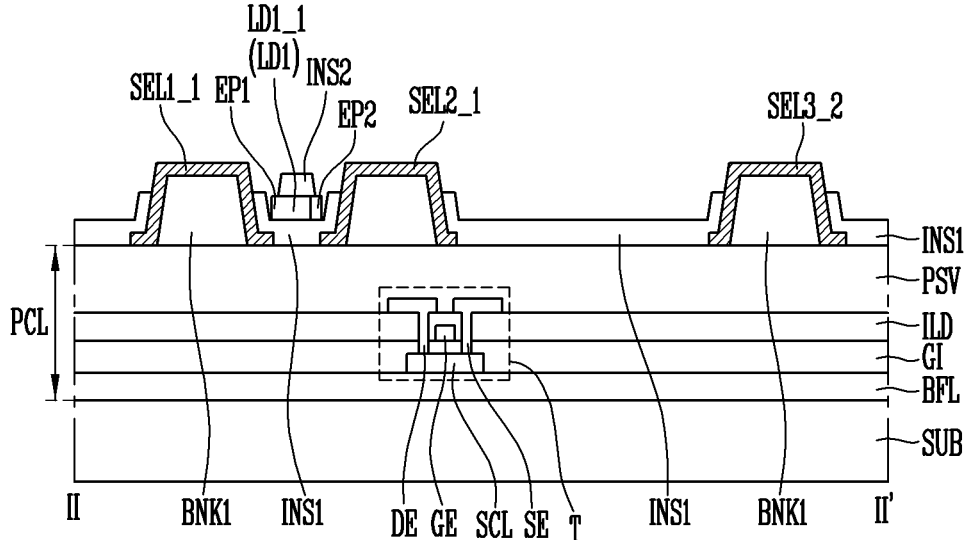
Figure 16E:
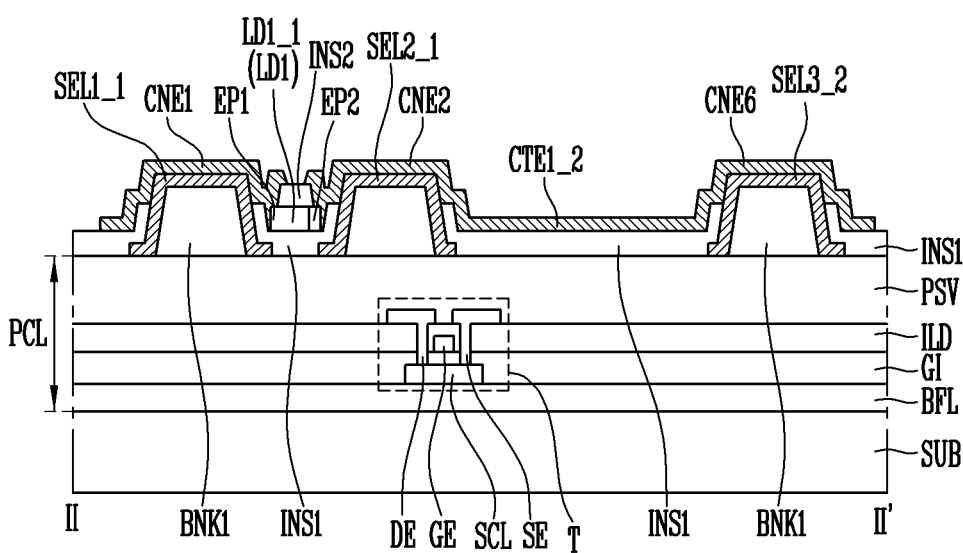
Figure 16F:
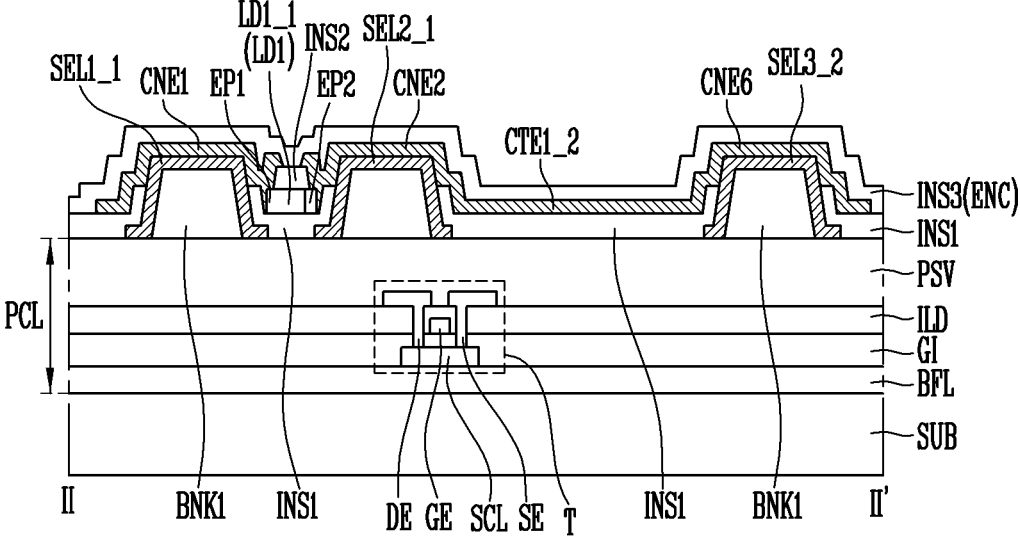
Figure 18:
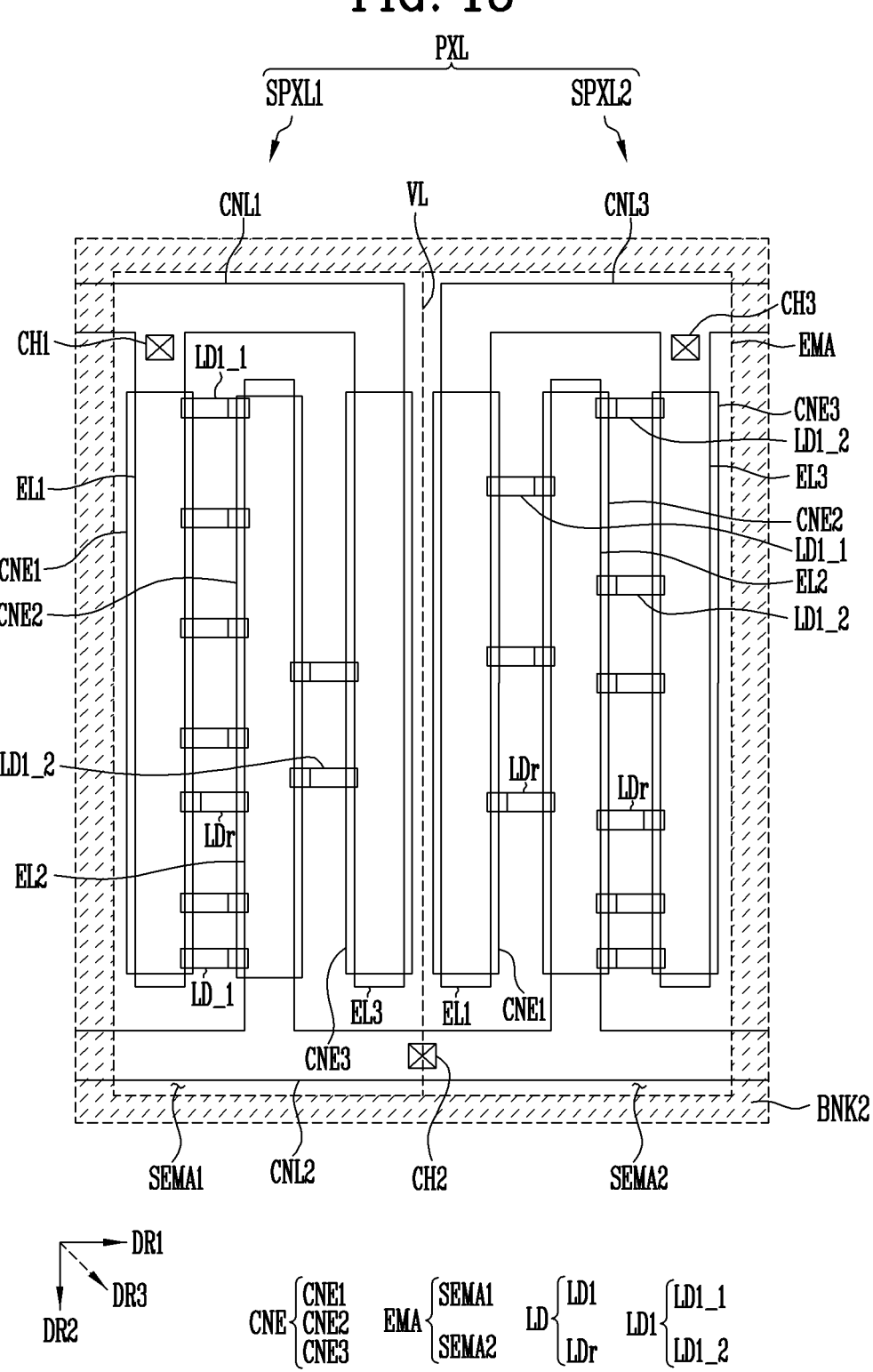
FIGS. 18 to 21 are schematic plan views illustrating another example of a pixel in accordance with an embodiment.
Figure 19:
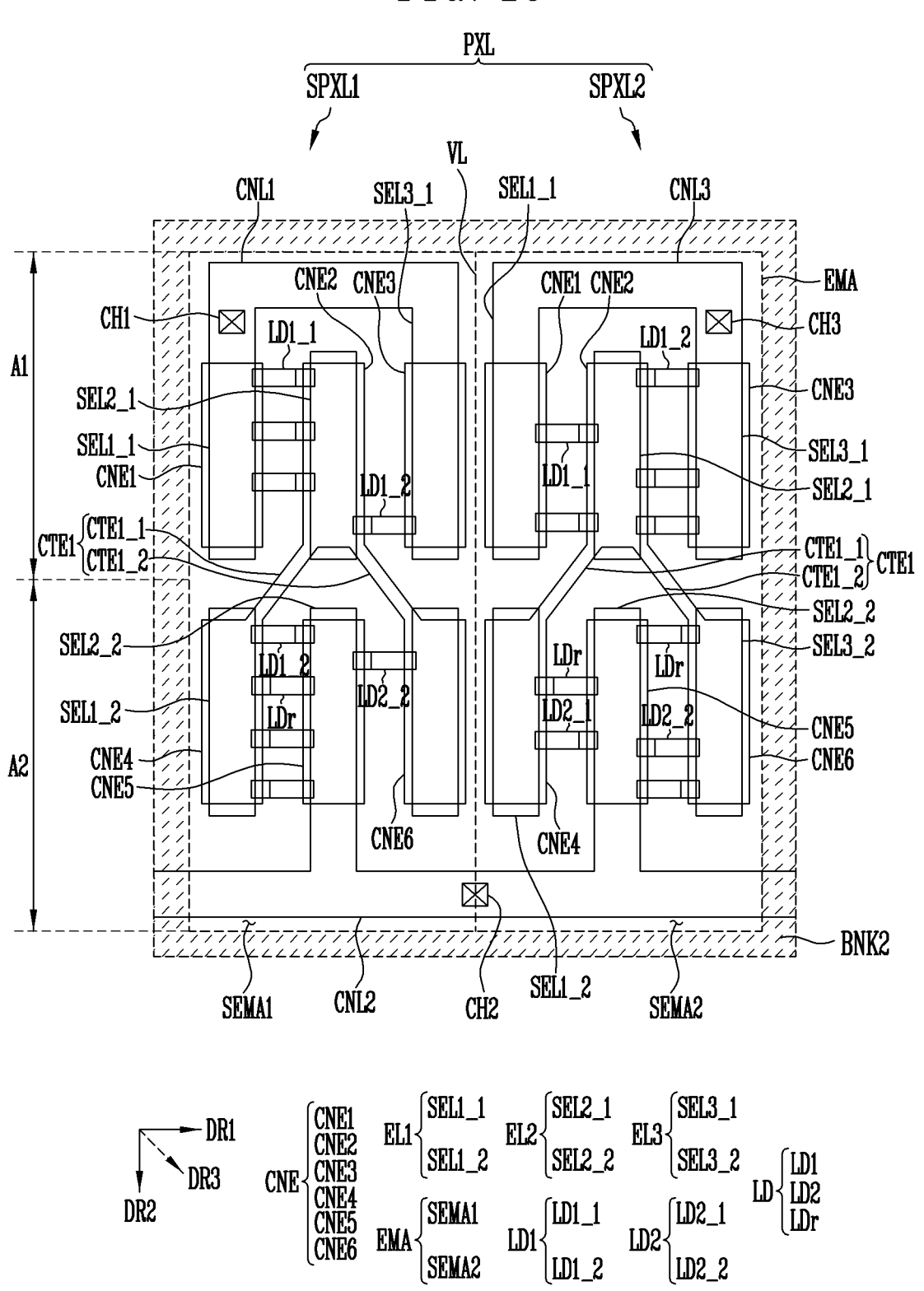
Figure 20:
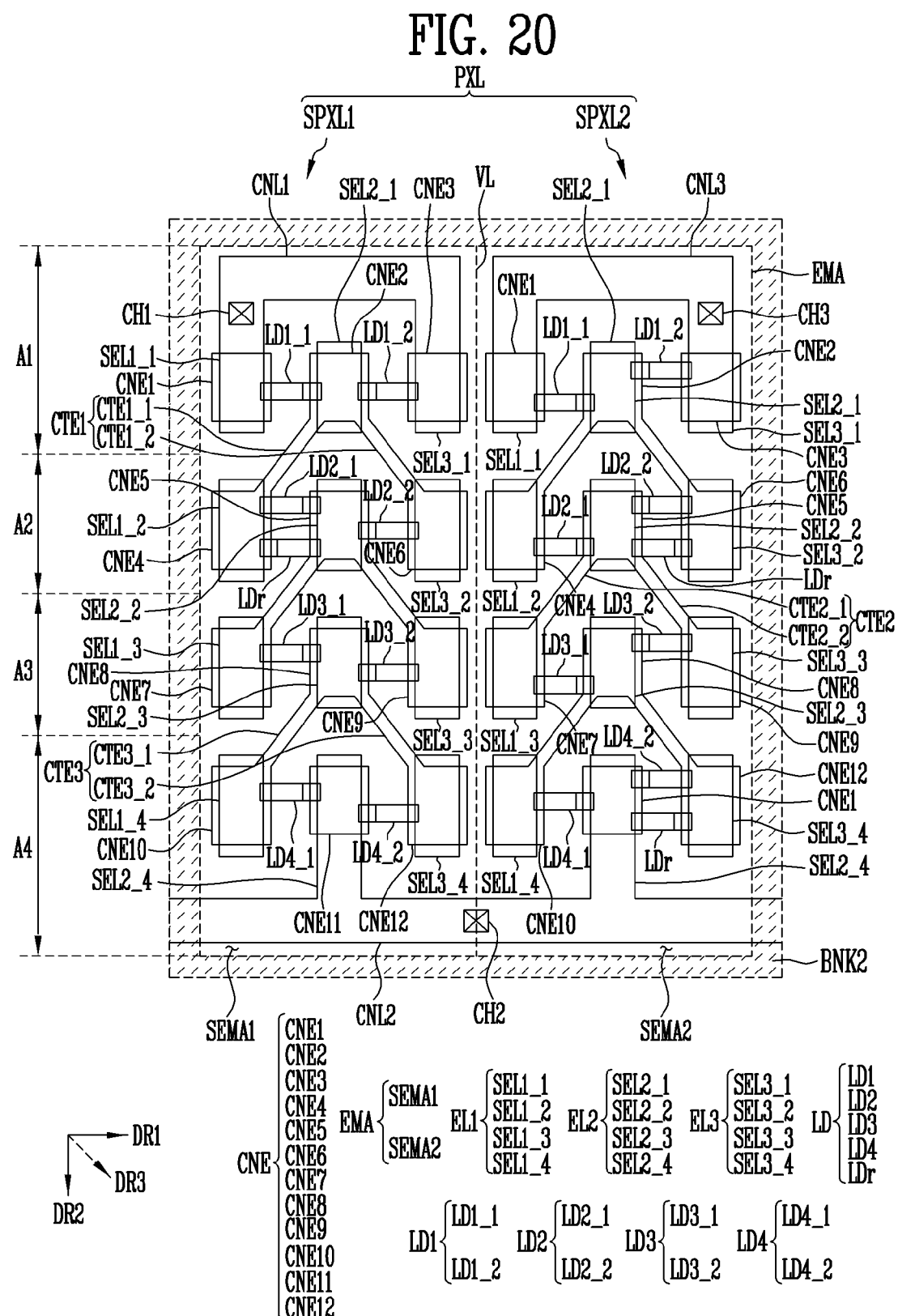

At the step of removing a portion of the bridge pattern BRP described with reference to FIG. 15F, the bridge pattern BRP may be divided into the first connection line CNL1 and the third connection line CNL3. Here, the bridge pattern BRP may be disposed in the peripheral area of the pixel PXL. The pixel PXL and pixels PXL adjacent thereto (for example, pixels disposed on a same row as that of the pixel PXL) may share the bridge pattern BRP. In other words, the bridge pattern BRP disposed in the peripheral area of the pixel PXL may be provided in common to not only the peripheral area of the pixel PXL but also the peripheral areas of the pixels PXL adjacent thereto.

If a portion of the bridge pattern BRP is removed from the peripheral areas of the pixel PXL and the pixels PXL adjacent thereto, the first connection line CNL1 and the third connection line CNL3 that are electrically and/or physically separated from each other may be formed in the peripheral area of the pixel PXL. Hence, each of the first and third connection lines CNL1 and CNL3 may be electrically and/or physically connected with the 1-1-th and 3-1-th sub-electrodes SEL1_1 and SEL3_1 of the corresponding sub-pixel in the peripheral area of the corresponding pixel PXL. For example, the first connection line CNL1 may be electrically and/or physically connected to the 1-1-th and 3-1-th sub-electrodes SEL1_1 and SEL3_1 included in the first sub-pixel SPXL1 of the pixel PXL. The third connection line CNL3 may be electrically and/or physically connected to the 1-1-th and 3-1-th sub-electrodes SEL1_1 and SEL3_1 included in the second sub-pixel SPXL2 of the pixel PXL.

FIGS. 18 to 21 are schematic plan views illustrating another example of a pixel in accordance with an embodiment.

In FIGS. 18 to 21, detailed description of configurations equal or similar to those of the embodiment of FIG. 8 will be omitted.

Referring to FIGS. 1A to 5, and 18, the pixel PXL may include a first sub-pixel SPXL1 and a second sub-pixel SPXL2. The first sub-pixel SPXL1 may include a first sub-emission area SEMA1. The second sub-pixel SPXL2 may include a second sub-emission area SEMA2. The first sub-emission area SEMA1 and the second sub-emission area SEMA2 may be grouped to form an emission area EMA of the pixel PXL.

First to third electrodes EL1, EL2, and EL3 may be disposed in each of the first and second sub-emission areas SEMA1 and SEMA2. A first contact electrode CNE1 may be disposed on the first electrode EL1. A second contact electrode CNE2 may be disposed on the second electrode EL2. A third contact electrode CNE3 may be disposed on the third electrode EL3. Furthermore, first light emitting elements LD1 disposed between two adjacent electrodes may be provided in each of the first and second sub-emission areas SEMA1 and SEMA2.

The first light emitting elements LD1 may include 1-1-th light emitting elements LD1_1 disposed between the first and second electrodes EL1 and EL2 and 1-2-th light emitting elements LD1_2 disposed between the second and third electrodes EL2 and EL3 in each of the first and second sub-emission areas SEMA1 and SEMA2. The first to third electrodes EL1, EL2, and EL3 and the first light emitting elements LD1 in the first sub-emission area SEMA1 may form a first sub-emission unit. The first to third electrodes EL1, EL2, and EL3 and the second light emitting elements LD2 in the second sub-emission area SEMA2 may form a second sub-emission unit.

The first electrode EL1 of the first sub-emission unit may be connected to a driving transistor (hereinafter, referred to as 'first driving transistor') of a pixel circuit included in the first sub-pixel SPXL1 through a first contact hole CH1. The third electrode EL3 of the second sub-emission unit may be connected to a driving transistor (hereinafter, referred to as 'second driving transistor') of a pixel circuit included in the second sub-pixel SPXL2 through a third contact hole CH3. Current that flows through each of the light emitting elements LD of the first sub-emission unit may be controlled by the first driving transistor. Current that flows through each of the light emitting elements LD of the second sub-emission unit may be controlled by the second driving transistor. Hence, uniform driving currents may be respectively provided to the light emitting elements LD of the first and second sub-emission units, so that the light emitting elements LD may generally uniformly emit light.

Referring to FIGS. 1A to 5, and 19, the pixel PXL may include a first sub-pixel SPXL1 and a second sub-pixel SPXL2. The first sub-pixel SPXL1 may include a first sub-emission area SEMA1. The second sub-pixel SPXL2 may include a second sub-emission area SEMA2. The first to third electrodes EL1, EL2, and EL3 may be disposed in each of the first and second sub-emission areas SEMA1 and SEMA2. Contact electrodes CNE may be respectively provided on the first to third electrodes EL1, EL2, and EL3.

Each of the first to third electrodes EL1, EL2, and EL3 may include two sub-electrodes disposed in an identical column in the second direction DR2 and spaced apart from each other. For example, the first electrode EL1 may include 1-1-th and 1-2-th sub-electrodes SEL1_1 and SEL1_2. The second electrode EL2 may include 2-1-th and 2-2-th sub-electrodes SEL2_1 and SEL2_2. The third electrode EL3 may include 3-1-th and 3-2-th sub-electrodes SEL3_1 and SEL3_2.

The contact electrodes CNE may include a first contact electrode CNE1 disposed on the 1-1-th sub-electrode SEL1_1, a second contact electrode CNE2 disposed on the 1-2-th sub-electrode SEL1_2, a third contact electrode CNE3 disposed on the 2-1-th sub-electrode SEL2_1, a fourth contact electrode CNE4 disposed on the 2-2-th sub-electrode SEL2_2, a fifth contact electrode CNE5 disposed on the 3-1-th sub-electrode SEL3_1, and a sixth contact electrode CNE6 disposed on the 3-2-th sub-electrode SEL3_2.

Each of the first and second sub-emission areas SEMA1 and SEMA2 may be divided into a first area A1 in which the 1-1-th, 2-1-th, and 3-1-th sub-electrodes SEL1_1, SEL2_1, and SEL3_1 disposed in an identical row are arranged, and a second area A2 in which the 1-2-th, 2-2-th, and 3-2-th sub-electrodes SEL1_2, SEL2_2, and SEL3_2 disposed in an identical row are arranged.

In the first area A1 of each of the first and second sub-emission areas SEMA1 and SEMA2, the 1-1-th, 2-1-th, and 3-1-th sub-electrodes SEL1_1, SEL2_1, and SEL3_1, along with first light emitting elements LD1 connected in parallel therebetween, may form a first serial set. Furthermore, in the second area A2 of each of the first and second sub-emission areas SEMA1 and SEMA2, the 1-2-th, 2-2-th, and 3-2-th sub-electrodes SEL1_2, SEL2_2, and SEL3_2, along with second light emitting elements LD2 connected in parallel therebetween, may form a second serial set. The first and second serial sets of the first sub-emission area SEMA1 may form a first sub-emission unit. The first and second serial sets of the second sub-emission area SEMA2 may form a second sub-emission unit.

In an embodiment, the first serial set and the second serial set of each of the first and second sub-emission units may be electrically connected to each other by a first intermediate electrode CTE1. The first intermediate electrode CTE1 may be disposed in a boundary between the first area A1 and the second area A2 of each of the first and second sub-emission areas SEMA1 and SEMA2, and include 1-1-th and 1-2-th intermediate electrodes CTE1_1 and CTE1_2. The 1-1-th intermediate electrode CTE1_1 may electrically connect the second contact electrode CNE2 on the 2-1-th sub-electrode SEL2_1 disposed in the first serial set with the fourth contact electrode CNE4 on the 1-2-th sub-electrode SEL1_2 disposed in the second serial set. The 1-1-th intermediate electrode CTE1_1, the second contact electrode CNE2, and the fourth contact electrode CNE4 may be integrally provided. The 1-2-th intermediate electrode CTE1_2 may electrically connect the second contact electrode CNE2 on the 2-1-th sub-electrode SEL2_1 disposed in the first serial set with the sixth contact electrode CNE6 on the 3-2-th sub-electrode SEL3_2 disposed in the second serial set. The 1-2-th intermediate electrode CTE1_2, the second contact electrode CNE2, and the sixth contact electrode CNE6 may be integrally provided.

In accordance with the foregoing embodiment, the first and second sub-emission units each having a serial/parallel combination structure may be provided, so that the pixel PXL including the first and second sub-pixels SPXL1 and SPXL2 may be reliably driven. Furthermore, identical or similar driving currents may be respectively provided to the light emitting elements LD included in each of the first and second sub-emission units, so that the light emitting elements LD may generally emit light having uniform intensity.

Referring to FIGS. 1A to 5, and 20, the pixel PXL may include a first sub-pixel SPXL1 and a second sub-pixel SPXL2. The first sub-pixel SPXL1 may include a first sub-emission area SEMA1. The second sub-pixel SPXL2 may include a second sub-emission area SEMA2. The first to third electrodes EL1, EL2, and EL3 may be disposed in each of the first and second sub-emission areas SEMA1 and SEMA2. Contact electrodes CNE may be respectively provided on the first to third electrodes EL1, EL2, and EL3.

Each of the first to third electrodes EL1, EL2, and EL3 may include four sub-electrodes disposed in an identical column in the second direction DR2 and spaced apart from each other. For example, the first electrode EL1 may include 1-1-th to 1-4-th sub-electrodes SEL1_1, SEL1_2, SEL1_3, and SEL1_4. The second electrode EL2 may include 2-1-th to 2-4-th sub-electrodes SEL2_1, SEL2_2, SEL2_3, and SEL2_4. The third electrode EL3 may include 3-1-th to 3-4-th sub-electrodes SEL3_1, SEL3_2, SEL3_3, and SEL3_4.

The contact electrodes CNE may include first to twelfth contact electrodes CNE1 to CNE12. The first contact electrode CNE1 may be disposed on the 1-1-th sub-electrode SEL1_1. The second contact electrode CNE2 may be disposed on the 2-1-th sub-electrode SEL2_1. The third contact electrode CNE3 may be disposed on the 3-1-th sub-electrode SEL3_1. The fourth contact electrode CNE4 may be disposed on the 1-2-th sub-electrode SEL1_2. The fifth contact electrode CNE5 may be disposed on the 2-2-th sub-electrode SEL2_2. The sixth contact electrode CNE6 may be disposed on the 3-2-th sub-electrode SEL3_2. The seventh contact electrode CNE7 may be disposed on the 1-3-th sub-electrode SEL1_3. The eighth contact electrode CNE8 may be disposed on the 2-3-th sub-electrode SEL2_3. The ninth contact electrode CNE9 may be disposed on the 3-3-th sub-electrode SEL3_3. The tenth contact electrode CNE10 may be disposed on the 1-4-th sub-electrode SEL1_4. The eleventh contact electrode CNE11 may be disposed on the 2-4-th sub-electrode SEL2_4. The twelfth contact electrode CNE12 may be disposed on the 3-4-th sub-electrode SEL3_4.

Each of the first and second sub-emission areas SEMA1 and SEMA2 may be divided into a first area A1 in which the 1-1-th, 2-1-th, and 3-1-th sub-electrodes SEL1_1, SEL2_1, and SEL3_1 disposed in an identical row are arranged, a second area A2 in which the 1-2-th, 2-2-th, and 3-2-th sub-electrodes SEL1_2, SEL2_2, and SEL3_2 disposed in an identical row are arranged, a third area A3 in which the 1-3-th, 2-3-th, and 3-3-th sub-electrodes SEL1_3, SEL2_3, and SEL3_3 disposed in an identical row are arranged, and a fourth area A4 in which the 1-4-th, 2-4-th, and 3-4-th sub-electrodes SEL1_4, SEL2_4, and SEL3_4 disposed in an identical row are arranged.

In the first area A1 of each of the first and second sub-emission areas SEMA1 and SEMA2, the 1-1-th, 2-1-th, and 3-1-th sub-electrodes SEL1_1, SEL2_1, and SEL3_1, along with first light emitting elements LD1 connected in parallel therebetween, may form a first serial set. The first light emitting elements LD1 may include 1-1-th and 1-2-th light emitting elements LD1_1 and LD1_2.

In the second area A2 of each of the first and second sub-emission areas SEMA1 and SEMA2, the 1-2-th, 2-2-th, and 3-2-th sub-electrodes SEL1_2, SEL2_2, and SEL3_2, along with second light emitting elements LD2 connected in parallel therebetween, may form a second serial set. The second light emitting elements LD2 may include 2-1-th and 2-2-th light emitting elements LD2_1 and LD2_2.

In the third area A3 of each of the first and second sub-emission areas SEMA1 and SEMA2, the 1-3-th, 2-3-th, and 3-3-th sub-electrodes SEL1_3, SEL2_3, and SEL3_3, along with third light emitting elements LD3 connected in parallel therebetween, may form a third serial set. The third light emitting elements LD3 may include 3-1-th and 3-2-th light emitting elements LD3_1 and LD3_2.

In the fourth area A4 of each of the first and second sub-emission areas SEMA1 and SEMA2, the 1-4-th, 2-4-th, and 3-4-th sub-electrodes SEL1_4, SEL2_4, and SEL3_4, along with fourth light emitting elements LD4 connected in parallel therebetween, may form a fourth serial set. The fourth light emitting elements LD4 may include at least one 4-1-th light emitting element LD4_1 connected in the forward direction between the 1-4-th sub-electrode SEL1_4 and the 2-4-th sub-electrode SEL2_4, and at least one 4-2-th light emitting element LD4_2 connected in the forward direction between the 3-4-th sub-electrode SEL3_4 and the 2-4-th sub-electrode SEL2_4.

The first to fourth serial sets of the first sub-emission area SEMA1 may form a first sub-emission unit. The first to fourth serial sets of the second sub-emission area SEMA2 may form a second sub-emission unit.

In an embodiment, the first serial set and the second serial set of each of the first and second sub-emission units may be electrically connected to each other by a first intermediate electrode CTE1. The second serial set and the third serial set of each of the first and second sub-emission units may be electrically connected to each other by a second intermediate electrode CTE2.

The third serial set and the fourth serial set of each of the first and second sub-emission units may be electrically connected to each other by a third intermediate electrode CTE3. The third intermediate electrode CTE3 may be disposed in a boundary between the third area A3 and the fourth area A4 of each of the first and second sub-emission areas SEMA1 and SEMA2, and include 3-1-th and 3-2-th intermediate electrodes CTE3_1 and CTE3_2 (not illustrated).

In an embodiment, the 3-1-th intermediate electrode CTE3_1 may electrically and/or physically connect the eighth contact electrode CNE8 on the 2-3-th sub-electrode SEL2_3 of each of the first and second sub-emission areas SEMA1 and SEMA2 with the tenth contact electrode CNE10 on the 1-4-th sub-electrode SEL1_4 of each of the first and second sub-emission areas SEMA1 and SEMA2. The 3-2-th intermediate electrode CTE3_2 may electrically and/or physically connect the eighth contact electrode CNE8 on the 2-3-th sub-electrode SEL2_3 of each of the first and second sub-emission areas SEMA1 and SEMA2 with the twelfth contact electrode CNE12 on the 3-4-th sub-electrode SEL3_4 of each of the first and second sub-emission areas SEMA1 and SEMA2.

In accordance with the foregoing embodiment, the first and second sub-emission units each having a serial/parallel combination structure may be provided, so that the pixel PXL including the first and second sub-pixels SPXL1 and SPXL2 may be reliably driven. Furthermore, identical or similar driving currents may be respectively provided to the light emitting elements LD included in each of the first and second sub-emission units, so that the light emitting elements LD may generally emit light having uniform intensity.

Referring to FIGS. 1A to 5, and 21, the pixel PXL may include a first sub-pixel SPXL1, a second sub-pixel SPXL2, and a third sub-pixel pixel SPXL3. The first sub-pixel SPXL1 may include a first sub-emission area SEMA1. The second sub-pixel SPXL2 may include a second sub-emission area SEMA2. The third sub-pixel SPXL3 may include a third sub-emission area SEMA3. The first to third sub-emission areas SEMA1, SEMA2, and SEMA3 may be grouped to form an emission area EMA of the pixel PXL.

The first to third electrodes EL1, EL2, and EL3 may be disposed in each of the first to third sub-emission areas SEMA1, SEMA2, and SEMA3. Contact electrodes CNE may be respectively provided on the first to third electrodes EL1, EL2, and EL3.

Each of the first to third electrodes EL1, EL2, and EL3 may include three sub-electrodes disposed in an identical column in the second direction DR2 and spaced apart from each other. For example, the first electrode EL1 may include 1-1-th, 1-2-th, and 1-3-th sub-electrodes SEL1_1, SEL1_2, and SEL1_3. The second electrode EL2 may include 2-1-th, 2-2-th, and 2-3-th sub-electrodes SEL2_1, SEL2_2, and SEL2_3. The third electrode EL3 may include 3-1-th, 3-2-th, and 3-3-th sub-electrodes SEL3_1, SEL3_2, and SEL3_3.

The contact electrodes CNE may include first to ninth contact electrodes CNE1 to CNE9. The first contact electrode CNE1 may be disposed on the 1-1-th sub-electrode SEL1_1. The second contact electrode CNE2 may be disposed on the 2-1-th sub-electrode SEL2_1. The third contact electrode CNE3 may be disposed on the 3-1-th sub-electrode SEL3_1. The fourth contact electrode CNE4 may be disposed on the 1-2-th sub-electrode SEL1_2. The fifth contact electrode CNE5 may be disposed on the 2-2-th sub-electrode SEL2_2. The sixth contact electrode CNE6 may be disposed on the 3-2-th sub-electrode SEL3_2. The seventh contact electrode CNE7 may be disposed on the 1-3-th sub-electrode SEL1_3. The eighth contact electrode CNE8 may be disposed on the 2-3-th sub-electrode SEL2_3. The ninth contact electrode CNE9 may be disposed on the 3-3-th sub-electrode SEL3_3.

Each of the first to third sub-emission areas SEMA1, SEMA2, and SEMA3 may be divided into a first area A1 in which the 1-1-th, 2-1-th, and 3-1-th sub-electrodes SEL1_1, SEL2_1, and SEL3_1 disposed in an identical row are arranged, a second area A2 in which the 1-2-th, 2-2-th, and 3-2-th sub-electrodes SEL1_2, SEL2_2, and SEL3_2 disposed in an identical row are arranged, and a third area A3 in which the 1-3-th, 2-3-th, and 3-3-th sub-electrodes SEL1_3, SEL2_3, and SEL3_3 disposed in an identical row are arranged.

In the first area A1 of each of the first to third sub-emission areas SEMA1, SEMA2, and SEMA3, the 1-1-th, 2-1-th, and 3-1-th sub-electrodes SEL1_1, SEL2_1, and SEL3_1, along with first light emitting elements LD1 connected in parallel therebetween, may form a first serial set. Furthermore, in the second area A2 of each of the first to third sub-emission areas SEMA1, SEMA2, and SEMA3, the 1-2-th, 2-2-th, and 3-2-th sub-electrodes SEL1_2, SEL2_2, and SEL3_2, along with second light emitting elements LD2 connected in parallel therebetween, may form a second serial set. Furthermore, in the third area A3 of each of the first to third sub-emission areas SEMA1, SEMA2, and SEMA3, the 1-3-th, 2-3-th, and 3-3-th sub-electrodes SEL1_3, SEL2_3, and SEL3_3, along with third light emitting elements LD3 connected in parallel therebetween, may form a third serial set. The first to third serial sets of the first sub-emission area SEMA1 may form a first sub-emission unit. The first to third serial sets of the second sub-emission area SEMA2 may form a second sub-emission unit. The first to third serial sets of the third sub-emission area SEMA3 may form a third sub-emission unit.

In an embodiment, the first serial set and the second serial set of each of the first to third sub-emission units may be electrically connected to each other by a first intermediate electrode CTE1. The second serial set and the third serial set of each of the first to third sub-emission units may be electrically connected to each other by a second intermediate electrode CTE2. The first intermediate electrode CTE1 may be disposed in a boundary between the first area A1 and the second area A2 of each of the first to third sub-emission areas SEMA1, SEMA2, and SEMA3. The second intermediate electrode CTE2 may be disposed in a boundary between the second area A2 and the third area A3 of each of the first to third sub-emission areas SEMA1, SEMA2, and SEMA3.

The 1-1-th and 3-1-th sub-electrodes SEL1_1 and SEL3_1 of the first sub-emission unit may be formed integrally with the first connection line CNL1, and connected to a driving transistor (hereinafter, referred to as 'first driving transistor') of a pixel circuit connected to the first sub-emission unit through a first contact hole CH1. The 1-1-th and 3-1-th sub-electrodes SEL1_1 and SEL3_1 of the second sub-emission unit may be formed integrally with the third connection line CNL3, and connected to a driving transistor (hereinafter, referred to as 'second driving transistor') of a pixel circuit connected to the second sub-emission unit through a third contact hole CH3. The 1-1-th and 3-1-th sub-electrodes SEL1_1 and SEL3_1 of the third sub-emission unit may be formed integrally with the fourth connection line CNL4, and connected to a driving transistor (hereinafter, referred to as 'third driving transistor') of a pixel circuit connected to the third sub-emission unit through a fourth contact hole CH4. Here, the pixel circuit connected to the first sub-emission unit, the pixel circuit connected to the second sub-emission unit, and the pixel circuit connected to the third sub-emission unit may be separate pixel circuits, and have a same circuit structure.

Current that flows through each of the light emitting elements LD of the first sub-emission unit may be controlled by the first driving transistor. Current that flows through each of the light emitting elements LD of the second sub-emission unit may be controlled by the second driving transistor. Current that flows through each of the light emitting elements LD of the third sub-emission unit may be controlled by the third driving transistor. Hence, uniform driving currents may be respectively provided to the light emitting elements LD of the first to third sub-emission units, so that the light emitting elements LD may generally uniformly emit light.

Furthermore, the first to third sub-emission units each having a serial/parallel combination structure may be provided, so that the pixel PXL including the first to third sub-pixels SPXL1, SPXL2, and SPXL3 may be reliably driven.

Although in the foregoing embodiments there has been described examples in which the pixel PXL may include two sub-pixels SPXL1 and SPXL2 or three sub-pixels SPXL1, SPXL2, and SPXL3, and each sub-pixel may include two serial sets, three serial sets, or four serial sets, the disclosure is not limited thereto. In an embodiment, the pixel PXL may include n sub-pixels (n is a natural number of 2 or more), and each sub-pixel may include at least two or more serial sets.

While various embodiments have been described above, those skilled in the art will appreciate that various modifications, additions and substitutions are possible, without departing from the scope of the disclosure.

Therefore, the embodiments disclosed in this specification are only for illustrative purposes rather than limiting the technical scope of the disclosure. The scope of the disclosure may be defined by the accompanying claims.

What is claimed is:

1. A pixel comprising:
a first sub-pixel area and a second sub-pixel area adjacent to each other in a first direction;
a first electrode and a second electrode disposed in each of the first sub-pixel area and the second sub-pixel area, and spaced apart from each other;
light emitting elements disposed between the first electrode and the second electrode in each of the first sub-pixel area and the second sub-pixel area;
a first driving transistor disposed in the first sub-pixel area, and electrically connected to the first electrode, the first driving transistor including a first gate electrode that controls a drive current through the first driving transistor; and
a second driving transistor disposed in the second sub-pixel area, and electrically connected to the first electrode, the second driving transistor including a second gate electrode that controls a drive current through the second driving transistor, wherein
the first gate electrode and the second gate electrode are connected to a common node such that a gate voltage at the common node simultaneously controls the drive current for both the first driving transistor and the second driving transistor, and
the first electrode of the first sub-pixel area and the first electrode of the second sub-pixel area are electrically disconnected from each other, and the second electrode of the first sub-pixel area and the second electrode of the second sub-pixel area are electrically connected to each other, and
the light emitting elements are disposed in parallel between the first electrode and a sub-electrode electrically different from the first electrode in each of the first sub-pixel area and the second sub-pixel area, wherein
the light emitting elements of each of the first sub-pixel area and the second sub-pixel area comprise:
a plurality of first light emitting elements electrically connected in parallel to each other and a plurality of second light emitting elements electrically connected in parallel to each other, wherein the first light emitting elements and the second light emitting elements are electrically connected in series.

2. The pixel according to claim 1, wherein
each of the first sub-pixel area and the second sub-pixel areas include a first sub-area and a second sub-area spaced apart from each other in a second direction intersecting the first direction, the first electrode disposed in each of the first sub-pixel area and the second sub-pixel area comprises a 1-1-th sub-electrode disposed in the first sub-area, and a 1-2-th sub-electrode disposed in the second sub-area, and the second electrode disposed in each of the first sub-pixel area and the second sub-pixel area comprises a 2-1-th sub-electrode disposed in the first sub-area, and a 2-2-th sub-electrode disposed in the second sub-area.

3. The pixel according to claim 2, wherein the light emitting elements of each of the first sub-pixel area and the second sub-pixel area comprise:

the first light emitting elements disposed between the 1-1-th sub-electrode and the 2-1-th sub-electrode; and the second light emitting elements disposed between the 1-2-th sub-electrode and the 2-2-th sub-electrode, wherein the 1-1-th sub-electrode and the 1-2-th sub-electrode are physically spaced apart from each other in the second direction in each of the first sub-pixel area and the second sub-pixel area.

4. The pixel according to claim 3, wherein the 1-1-th sub-electrode and the 2-1-th sub-electrode along with the first light emitting elements electrically connected in parallel therebetween of each of the first sub-pixel area and the second sub-pixel area form a first set, and the 1-2-th sub-electrode and the 2-2-th sub-electrode along with the second light emitting elements electrically connected in parallel therebetween of each of the first sub-pixel area and the second sub-pixel area form a second set.

5. The pixel according to claim 4, further comprising a first contact electrode disposed in each of the first sub-pixel area and the second sub-pixel area and disposed on each of the 1-1-th sub-electrode and the 1-2-th sub-electrode and the 2-1-th sub-electrode and the 2-2-th sub-electrode.

6. The pixel according to claim 5, further comprising:

a first intermediate electrode disposed in an area between the first sub-area and the second sub-area in each of the first sub-pixel area and the second sub-pixel area.

7. The pixel according to claim 6, wherein the first intermediate electrode and the first contact electrode are integral with each other on the 2-1-th sub-electrode disposed in the first sub-area of each of the first sub-pixel areas and the second sub-pixel area.

8. The pixel according to claim 7, wherein the first set and the second set of each of the first sub-pixel area and the second sub-pixel area are electrically connected to each other by the first intermediate electrode.

9. The pixel according to claim 8, wherein, the first intermediate electrode electrically connects the first contact electrode on the 2-1-th sub-electrode of the first set to the first contact electrode on the 1-2-th sub-electrode of the second set in each of the first sub-pixel area and the second sub-pixel area.

10. The pixel according to claim 9, further comprising:

a third electrode disposed in each of the first sub-pixel area and the second sub-pixel area, and spaced apart from the first electrode and the second electrode, the third electrode comprises a 3-1-th sub-electrode disposed in the first sub-area, and a 3-2-th sub-electrode disposed in the second sub-area, and the 1-1-th sub-electrode and the 3-1-th sub-electrode are electrically connected to each other by a connection line in each of the first sub-pixel area and the second sub-pixel area.

11. The pixel according to claim 10, wherein each of the first sub-pixel area and the second sub-pixel area comprises a third sub-area disposed below the second sub-area in the second direction, the first electrode of each of the first sub-pixel area and the second sub-pixel area further comprises a 1-3-th sub-electrode disposed in the third sub-area, the second electrode of each of the first sub-pixel area and the second sub-pixel area further comprises a 2-3-th sub-electrode disposed in the third sub-area, and the light emitting elements of each of the first sub-pixel area and the second sub-pixel area further comprises third light emitting elements disposed between the 1-3-th sub-electrode and the 2-3-th sub-electrode.

12. The pixel according to claim 11, wherein, the 1-3-th sub-electrode and the 2-3-th sub-electrode along with the third light emitting elements electrically connected in parallel therebetween form a third set in each of the first sub-pixel area and the second sub-pixel area.

13. The pixel according to claim 12, further comprising:

a second contact electrode disposed on each of the 1-3-th sub-electrode and the 2-3-th sub-electrode in each of the first sub-pixel area and the second sub-pixel area, and the second contact electrode and the first contact electrode being disposed on a same layer; and a second intermediate electrode disposed in an area between the second sub-area and the third sub-area in each of the first sub-pixel area and the second sub-pixel area, and with the second intermediate electrode and the first contact electrode are integral with each other on the 2-2-th sub-electrode, wherein, the second intermediate electrode electrically connects the first contact electrode on the 2-2-th sub-electrode of the second set with the second contact electrode on the 1-3-th sub-electrode of the third set in each of the first sub-pixel area and the second sub-pixel area.

14. The pixel according to claim 13, wherein each of the first sub-pixel area and the second sub-pixel area further comprises a fourth sub-area disposed below the third sub-area in the second direction, the first electrode of each of the first sub-pixel area and the second sub-pixel area further comprises a 1-4-th sub-electrode disposed in the fourth sub-area, the second electrode of each of the first sub-pixel area and the second sub-pixel area further comprises a 2-4-th sub-electrode disposed in the fourth sub-area, and the light emitting elements of each of the first sub-pixel area and the second sub-pixel area further comprises fourth light emitting elements disposed between the 1-4-th sub-electrode and the 2-4-th sub-electrode.

15. The pixel according to claim 14, wherein, the 1-4-th sub-electrode and the 2-4-th sub-electrode along with the fourth light emitting elements electrically connected in parallel therebetween form a fourth set in each of the first sub-pixel area and the second sub-pixel area.

16. The pixel according to claim 15, further comprising:

a third contact electrode disposed on each of the 1-4-th sub-electrode and the 2-4-th sub-electrode in each of the first sub-pixel area and the second sub-pixel area, and the third contact electrode and the second contact electrode being disposed on a same layer; and a third intermediate electrode disposed in an area between the third sub-area and the fourth sub-area in each of the first sub-pixel area and the second sub-pixel area, and the third intermediate electrode and the second contact electrode are integral with each other on the 2-3-th sub-electrode, wherein, the third intermediate electrode electrically connects the second contact electrode on the 2-3-th sub-electrode of the third set to the third contact electrode on the 1-4-th sub-electrode of the fourth set in each of the first sub-pixel area and the second sub-pixel area.

17. The pixel according to claim 11, further comprising:
a third sub-pixel area adjacent to the second sub-pixel area in the first direction, and including a first sub-area, a second sub-area, and a third sub-area spaced apart from each other in the second direction,
wherein the third sub-pixel area comprises:
a first electrode including a 1-1-th sub-electrode disposed in the first sub-area, a 1-2-th sub-electrode disposed in the second sub-area and spaced apart from the 1-1-th sub-electrode, and a 1-3-th sub-electrode disposed in the third sub-area and spaced apart from the 1-2-th sub-electrode;
a second electrode including a 2-1-th sub-electrode disposed in the first sub-area, a 2-2-th sub-electrode disposed in the second sub-area and spaced apart from the 2-1-th sub-electrode, and a 2-3-th sub-electrode disposed in the third sub-area and spaced apart from the 2-2-th sub-electrode;
light emitting elements disposed between the first electrode and the second electrode;
a third driving transistor electrically connected to the 1-1-th sub-electrode;
a contact electrode disposed on each of the 1-1-th and 1-2-th sub-electrodes and the 2-1-th and 2-2-th sub-electrodes, and the contact electrode and the first contact electrode being disposed on a same layer; and
an intermediate electrode disposed in each of an area between the first sub-area and the second sub-area and an area disposed between the second sub-area and the third sub-area.

18. The pixel according to claim 17, wherein
the intermediate electrode comprises a first sub-intermediate electrode integral with the contact electrode in the third sub-pixel area on the 2-1-th sub-electrode, and a second sub-intermediate electrode integral with the contact electrode on the 2-2-th sub-electrode,
the first sub-intermediate electrode electrically connects the 2-1-th sub-electrode to the 1-2-th sub-electrode, and
the second sub-intermediate electrode electrically connects the 2-2-th sub-electrode to the 1-3-th sub-electrode.

19. A display device comprising:
a display area including pixel areas, and a non-display area; and
a pixel disposed in each of the pixel areas, wherein the pixel comprises:
a first sub-pixel area and a second sub-pixel area adjacent to each other in a first direction, and each of the first sib-pixel area and the second sub-pixel area including a first sub-area, a second sub-area, and a third sub-area spaced apart from each other in a second direction intersecting the first direction;
a first electrode disposed in each of the first sub-pixel area and the second sub-pixel area, and including a 1-1-th sub-electrode disposed in the first sub-area, a 1-2-th sub-electrode disposed in the second sub-area, and a 1-3-th sub-electrode disposed in the third sub-area;
a second electrode disposed in each of the first sub-pixel area and the second sub-pixel area, and including a 2-1-th sub-electrode disposed in the first sub-area and spaced apart from the 1-1-th sub-electrode, a 2-2-th sub-electrode disposed in the second sub-area and spaced apart from the 1-2-th sub-electrode, and a 2-3-th sub-electrode disposed in the third sub-area and spaced apart from the 1-3-th sub-electrode;
light emitting elements disposed between the first electrode and the second electrode in each of the first sub-pixel area and the second sub-pixel area;
a first driving transistor electrically connected to the 1-1-th sub-electrode of the first sub-pixel area, the first driving transistor including a first gate electrode that controls a drive current through the first driving transistor;
a second driving transistor electrically connected to the 1-1-th sub-electrode of the second sub-pixel area, the second driving transistor including a second gate electrode that controls a drive current through the second driving transistor, wherein the first gate electrode and the second gate electrode are connected to a common node such that a gate voltage at the common node simultaneously controls the drive current for both the first driving transistor and the second driving transistor;
a contact electrode disposed on each of the 1-1-th to 1-3-th sub-electrodes and the 2-1-th to 2-3-th sub-electrodes; and
a first intermediate electrode and a second intermediate electrode disposed in each of the first sub-pixel area and the second sub-pixel area, the first intermediate electrode being disposed in an area between the first sub-area and the second sub-area, and the second intermediate electrode being disposed in an area between the second sub-area and the third sub-area,
the first intermediate electrode and the contact electrode are integral with each other on the 2-1-th sub-electrode, and electrically connects the 2-1-th sub-electrode to the 1-2-th sub-electrode, and
the second intermediate electrode and the contact electrode are integral with each other on the 2-2-th sub-electrode, and electrically connects the 2-2-th sub-electrode with the 1-3-th sub-electrode, and
the light emitting elements are disposed in parallel between the first electrode and a sub-electrode electrically different from the first electrode in each of the first sub-pixel area and the second sub-pixel area, wherein
the light emitting elements of each of the first sub-pixel area and the second sub-pixel area comprise:
a plurality of first light emitting elements electrically connected in parallel to each other and a plurality of second light emitting elements electrically connected in parallel to each other, wherein the first light emitting elements and the second light emitting elements are electrically connected in series.

* * * * *